United States Patent
Shimizu et al.

(10) Patent No.: US 9,029,070 B2
(45) Date of Patent: *May 12, 2015

(54) RESIST COMPOSITION AND METHOD OF FORMING RESIST PATTERN

(71) Applicant: Tokyo Ohka Kogyo Co., Ltd., Kawasaki-shi (JP)

(72) Inventors: Hiroaki Shimizu, Kawasaki (JP); Tsuyoshi Nakamura, Kawasaki (JP); Jiro Yokoya, Kawasaki (JP); Hideto Nito, Kawasaki (JP)

(73) Assignee: Tokyo Ohka Kogyo Co., Ltd, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/667,237

(22) Filed: Nov. 2, 2012

(65) Prior Publication Data

US 2013/0115555 A1 May 9, 2013

(30) Foreign Application Priority Data

Nov. 9, 2011 (JP) ................. 2011-245873
Jun. 21, 2012 (JP) ................. 2012-140216

(51) Int. Cl.
*G03F 7/039* (2006.01)
*G03F 7/20* (2006.01)
(Continued)

(52) U.S. Cl.
CPC ............ *G03F 7/0046* (2013.01); *C08F 220/18* (2013.01); *C08F 220/28* (2013.01); *C08F 220/36* (2013.01); *G03F 7/0045* (2013.01); *G03F 7/095* (2013.01); *G03F 7/2041* (2013.01); *G03F 7/38* (2013.01); *Y10S 430/106* (2013.01); *Y10S 430/12* (2013.01); *Y10S 430/121* (2013.01); *Y10S 430/122* (2013.01); *Y10S 430/123* (2013.01); *Y10S 430/126* (2013.01)

(58) Field of Classification Search
None
See application file for complete search history.

(56) References Cited

U.S. PATENT DOCUMENTS 5,595,856 A 1/1997 Mochizuki et al.
5,627,010 A 5/1997 Pai et al.
(Continued)

FOREIGN PATENT DOCUMENTS

JP A-06-194847 7/1994
JP A-09-208554 8/1997
(Continued)

OTHER PUBLICATIONS

Ebihara, et al., Proceedings of SPIE (U.S.), vol. 5256, pp. 985-994 (2003).
(Continued)

*Primary Examiner* — Sin J. Lee
(74) *Attorney, Agent, or Firm* — Knobbe Martens Olson & Bear LLP

(57) ABSTRACT

There are provided a method of forming a resist pattern includes: a step (1) in which a resist composition containing a base component (A) that generates base upon exposure and exhibits increased solubility in an alkali developing solution by the action of acid is applied to a substrate to form a resist film; a step (2) in which the resist film 2 is subjected to exposure; a step (3) in which baking is conducted after the step (2); and a step (4) in which the resist film 2 is subjected to an alkali development, thereby forming a negative-tone resist pattern in which the unexposed portion 2b of the resist film 2 has been dissolved and removed, and the resist composition used in the step (1).

4 Claims, 2 Drawing Sheets

(51) Int. Cl.

| | | |
|---|---|---|
| *G03F 7/30* | (2006.01) | |
| *G03F 7/38* | (2006.01) | |
| *C08F 220/18* | (2006.01) | |
| *C08F 220/28* | (2006.01) | |
| *C08F 220/36* | (2006.01) | |
| *G03F 7/004* | (2006.01) | |
| *G03F 7/095* | (2006.01) | |

(56) References Cited

U.S. PATENT DOCUMENTS

| | | | |
|---|---|---|---|
| 5,650,261 | A | 7/1997 | Winkle |
| 5,945,517 | A | 8/1999 | Nitta et al. |
| 6,153,733 | A | 11/2000 | Yukawa et al. |
| 6,420,503 | B1 | 7/2002 | Jayaraman et al. |
| 6,653,043 | B1 | 11/2003 | Hanabata |
| 6,815,142 | B1 | 11/2004 | Kimura et al. |
| 7,625,690 | B2 | 12/2009 | Mizutani et al. |
| 7,968,276 | B2 | 6/2011 | Takeshita |
| 8,268,529 | B2 | 9/2012 | Dazai et al. |
| 8,486,605 | B2 | 7/2013 | Takeshita et al. |
| 2002/0160316 | A1 | 10/2002 | Richter et al. |
| 2002/0187436 | A1* | 12/2002 | Richter et al. ........ 430/322 |
| 2003/0211417 | A1 | 11/2003 | Fryd et al. |
| 2004/0110085 | A1 | 6/2004 | Iwai et al. |
| 2006/0234164 | A1 | 10/2006 | Rhodes et al. |
| 2007/0105040 | A1 | 5/2007 | Toukhy et al. |
| 2008/0153030 | A1 | 6/2008 | Kobayashi et al. |
| 2009/0197204 | A1 | 8/2009 | Shiono et al. |
| 2009/0317743 | A1 | 12/2009 | Shiono et al. |
| 2010/0035192 | A1 | 2/2010 | Ando et al. |
| 2010/0047724 | A1 | 2/2010 | Takeshita et al. |
| 2010/0178618 | A1 | 7/2010 | Hatakeyama et al. |
| 2010/0304297 | A1 | 12/2010 | Hatakeyama et al. |
| 2010/0310985 | A1 | 12/2010 | Mori et al. |
| 2011/0014570 | A1 | 1/2011 | Mizutani et al. |
| 2011/0091812 | A1 | 4/2011 | Hatakeyama et al. |
| 2011/0117499 | A1 | 5/2011 | Matsumiya et al. |
| 2011/0233048 | A1 | 9/2011 | Kuramoto et al. |
| 2012/0177891 | A1 | 7/2012 | Millward et al. |
| 2012/0202158 | A1* | 8/2012 | Hatakeyama et al. ........ 430/325 |
| 2013/0017500 | A1 | 1/2013 | Yokoya et al. |
| 2013/0078572 | A1 | 3/2013 | Shimizu et al. |
| 2013/0164693 | A1 | 6/2013 | Takeshita |

FOREIGN PATENT DOCUMENTS

| | | |
|---|---|---|
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-235263 | 8/2000 |
| JP | A-2000-330270 | 11/2000 |
| JP | A-2003-241385 | 8/2003 |
| JP | A-2006-291177 | 10/2006 |
| JP | A-2007-279493 | 10/2007 |
| JP | A-2008-174515 | 7/2008 |
| JP | A-2009-025723 | 2/2009 |
| JP | A-2010-002870 | 1/2010 |
| JP | A-2010-032994 | 2/2010 |
| JP | A-2010-040849 | 2/2010 |
| JP | A-2010-152299 | 7/2010 |
| JP | A-2010-217855 | 9/2010 |
| JP | A-2010-277043 | 12/2010 |
| JP | A-2011-008001 | 1/2011 |
| JP | A-2011-013569 | 1/2011 |
| JP | A-2011-102974 | 5/2011 |
| JP | A-2011-128226 | 6/2011 |
| JP | A-2011-225645 | 11/2011 |
| WO | WO 2004/074242 A2 | 9/2004 |

OTHER PUBLICATIONS

Gil, et al., Proceedings of SPIE (U.S.), vol. 5754, pp. 119-128 (2005).
Borodovsky, Proceedings of SPIE (U.S.), vol. 6153, pp. 615301-1 to 615301-19 (2006).
Landie et al., "Fundamental Investigation of Negative Tone Development (NTD) for the 22nm node (and beyond)" Proceedings of SPIE, vol. 7972, pp. 797206-1-797206-12, 2011.
Office Action issued on Sep. 13, 2013 for U.S. Appl. No. 13/624,639.
Office Action issued on Oct. 24, 2013 for U.S. Appl. No. 13/624,638.
Office Action issued on Dec. 18, 2013 in U.S. Appl. No. 13/467,549.
Office Action issued in U.S. Appl. No. 13/732,632 on Jun. 5, 2014.
Office Action issued in U.S. Appl. No. 13/614,017 on Jun. 18, 2014.
Office Action issued in U.S. Appl. No. 13/718,269 on Jun. 18, 2014.
Office Action mailed Apr. 2, 2014 in U.S. Appl. No. 13/626,549.
Notice of Allowance in U.S. Appl. No. 13/732,632, mailed Oct. 7, 2014.
Office Action in U.S. Appl. No. 13/850,685, mailed Oct. 20, 2014.
Office Action in U.S. Appl. No. 13/624,639, mailed Oct. 30, 2014.
Cho et al. Polymer Bound Photobase Generators and Photoacid Generators for Pitch Division Lithography. Apr. 16, 2011. Proc. of SPIE vol. 7972 p. 797221-1 to 797221-8.

* cited by examiner

RESIST COMPOSITION AND METHOD OF FORMING RESIST PATTERN

TECHNICAL FIELD

The present invention relates to a method of forming a resist pattern in which a negative resist pattern is formed by developing with an alkali developing solution, and a resist composition used for the aforementioned method.

Priority is claimed on Japanese Patent Application No. 2011-245873, filed Nov. 9, 2011, and Japanese Patent Application No. 2012-140216, filed Jun. 21, 2012, the contents of which are incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Documents 1 and 2).

In recent years, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing patterns of minute dimensions. As resist materials which satisfy such requirements, chemically amplified resists are known.

As a chemically amplified composition, a composition including a base material component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth) acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of acid generated from an acid generator to form an alkali soluble group (for example, see Patent Document 3). When the base resin is an acrylic resin, as the acid decomposable group, in general, resins in which the carboxy group of (meth)acrylic acid or the like is protected with an acid dissociable group such as a tertiary alkyl group or an acetal group are used.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning method is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is subjected to exposure twice or more, followed by development to form a resist pattern (for example, see Patent Document 4). Like the double patterning process described above, this type of double exposure process is also capable of forming a resist pattern with a high level of resolution, and also has an advantage in that fewer number of steps is required than the above-mentioned double patterning process.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive tone process using a combination of a positive chemically amplified resist composition and an alkali developing solution is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive-tone development process using a combination of a positive chemically amplified resist composition and an alkali developing solution is mainly employed in the formation of an extremely fine resist pattern.

DOCUMENTS OF RELATED ART

Patent Document

[Patent Document 1] Japanese Unexamined Patent Application, First Publication No. Hei 6-194847
[Patent Document 2] Japanese Unexamined Patent Application, First Publication No. 2009-025723
[Patent Document 3] Japanese Unexamined Patent Application, First Publication No. 2003-241385
[Patent Document 4] Japanese Unexamined Patent Application, First Publication No. 2010-040849

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 6153, vol. 615301-1-19 (2006)

SUMMARY OF THE INVENTION

However, as further progress is made in lithography techniques and the application field for lithography techniques expands, further improvement in various lithography properties is demanded in a positive-tone developing process using a combination of a positive chemically amplified resist composition and an alkali developing solution.

For example, in the formation of an extremely small pattern (such as an isolated trench pattern, an extremely small, dense contact hole pattern, or the like), a region where the optical strength becomes weak is likely to be generated especially in the film thickness direction, thereby deteriorating the resolution of the resist pattern, and various defects in the shape of the resist pattern are likely to occur.

In the formation of the aforementioned extremely fine pattern, a method of forming a resist pattern (negative pattern) in which regions where the optical strength becomes weak are selectively dissolved and removed is useful. As a method of forming a negative pattern using a chemically amplified resist composition used in a positive-tone developing process which is the mainstream, a negative-tone developing process using a combination of a developing solution containing an organic solvent (organic developing solution) and a chemically amplified resist composition is known. However, the negative-tone developing process is inferior to a positive-tone developing process using a combination of an alkali developing solution and a chemically amplified resist composition in terms of environment, apparatus and cost. In order to solve these problems, a new method of forming a resist pattern having high resolution and excellent shape, and a resist composition suitable for the method are demanded.

The present invention takes the above circumstances into consideration, with an object of providing a method of forming a resist pattern by which a negative resist pattern having a high resolution and an excellent shape can be formed, and a resist composition suitable for the aforementioned method.

As a result of intensive studies, the present inventors have found a method capable of forming a negative pattern in which a resist film formed using a resist composition containing a base component that exhibits increased solubility in an alkali developing solution by the action of acid and containing a photo-base generator component that generates a base upon exposure has the exposed portions remaining and the unexposed portions dissolved and removed by an "alkali developing solution" (see Japanese Patent Application No. 2011-106577). As a result of further studies of the present inventors, it has been found that a negative resist pattern having an excellent shape with fine dimensions can be formed by enabling a short diffusion length of base generated at exposed portions of the resist film. The present invention has been completed based on this finding.

That is, a first aspect of the present invention is a resist composition which is used in a method of forming a resist pattern includes: a step (1) in a resist composition containing a base component (A) that generates base upon exposure and exhibits increased solubility in an alkali developing solution by the action of acid is applied to a substrate to form a resist film; a step (2) in which the resist film is subjected to exposure; a step (3) in which baking is conducted after the step (2), such that, at an exposed portion of the resist film, the base generated from the base component (A) upon the exposure and an acid provided to the resist film in advance are neutralized, and at an unexposed portion of the resist film, the solubility of the base component (A) in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed, wherein the resist composition is used in the step (1).

A second aspect of the present invention is a method of forming a resist pattern includes: a step (1) in which a resist composition containing a base component (A) that generates base upon exposure and exhibits increased solubility in an alkali developing solution by the action of acid is applied to a substrate to form a resist film; a step (2) in which the resist film is subjected to exposure; a step (3) in which baking is conducted after the step (2), such that, at an exposed portion of the resist film, the base generated from the base component (A) upon the exposure and an acid provided to the resist film in advance are neutralized, and at an unexposed portion of the resist film, the solubility of the base component (A) in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic divalent saturated hydrocarbon, unless otherwise specified.

A "halogenated alkyl group" is a group in which part or all of the hydrogen atoms of an alkyl group are substituted with a halogen atom, and a "halogenated alkylene group" is a group in which part or all of the hydrogen atoms of an alkylene group are substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxy group.

The term "structural unit" refers to a monomer unit that contributes to the formation of a polymeric compound (resin, polymer, and copolymer).

The term "exposure" is used as a general concept that includes irradiation with any form of radiation.

The term "boiling point" refers to a boiling point under a pressure of 1 atom, unless otherwise specified.

According to the present invention, there are provided a method of forming a resist pattern by which a negative resist pattern with high resolution and having an excellent shape can be formed, and a resist composition suitable for the aforementioned method.

DETAILED DESCRIPTION OF THE INVENTION

<<Resist Composition>>

Figure 1:
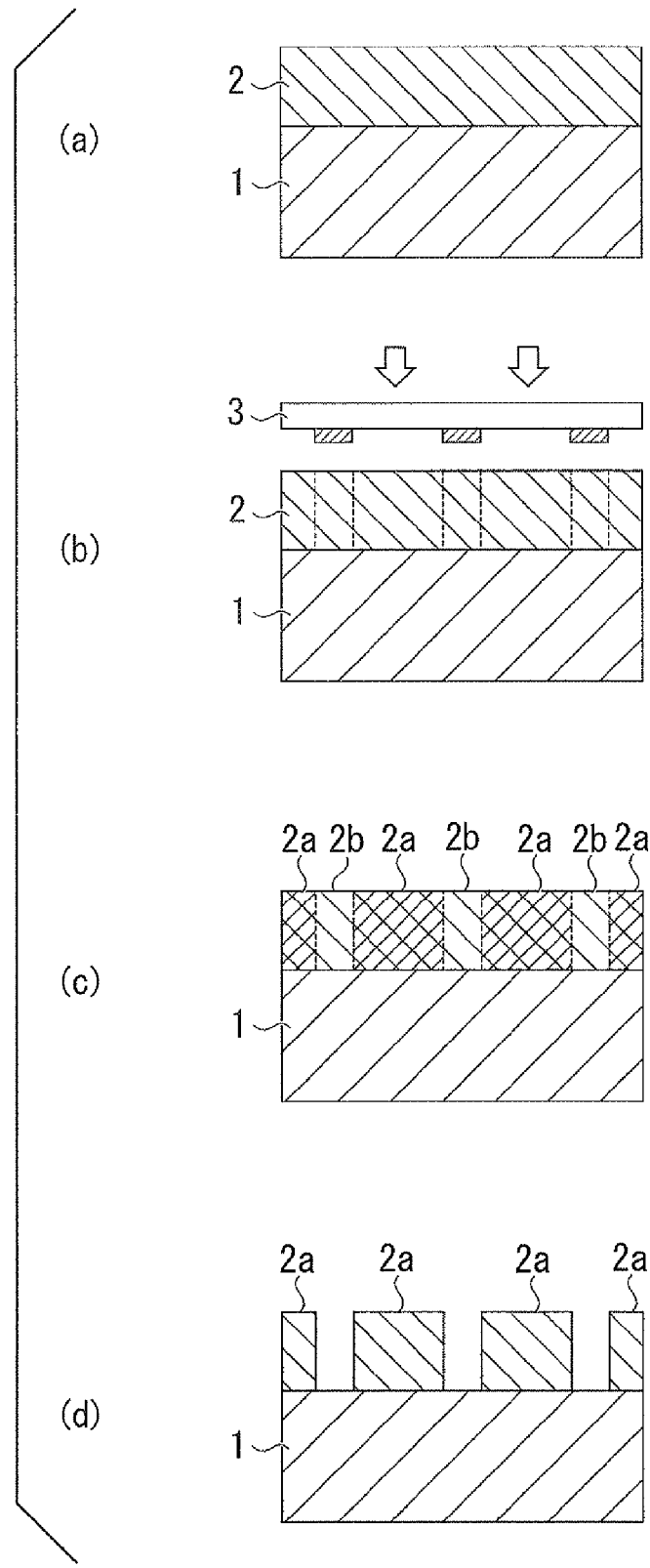
FIG. 1 is a schematic diagram showing an example of one embodiment of the method of forming a resist pattern according to the present invention.

A resist composition according to the present invention is a resist composition which is used in a method of forming a resist pattern includes: a step (1) in which a resist composition containing a base component (A) that generates base upon exposure and exhibits increased solubility in an alkali developing solution by the action of acid (hereafter, frequently referred to as "component (A)") is applied to a substrate to form a resist film; a step (2) in which the resist film is subjected to exposure; a step (3) in which baking is conducted after the step (2), such that, at an exposed portion of the resist film, the base generated from the base component (A) upon the exposure and an acid provided to the resist film in advance are neutralized, and at an unexposed portion of the resist film, the solubility of the base component (A) in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed, wherein the resist composition is used in the step (1).

The method of forming a resist pattern including the aforementioned steps (1) to (4) will be described later.

In the present invention, a "negative-tone resist pattern" refers to a resist pattern in which an unexposed portion of the resist film is dissolved and removed by an alkali developing solution, and an exposed portion remains as a pattern. The resist composition capable of forming the negative-tone resist pattern is frequently referred to as "negative resist composition". That is, the resist composition of the present invention is a negative resist composition.

An "acid provided to the resist film in advance" includes an acid added to the resist composition for forming the resist film in advance, or an acid derived from an acid supply component allowed to come into contact with the resist film prior to baking in step (3).

As the acid supply component (hereafter, frequently referred to as "component (Z)"), an acidic compound component (hereafter, frequently referred to as "component (G)") and an acid generator component (hereafter, frequently referred to as "component (B)") can be mentioned.

The acidic compound is a compound which exhibits acidity by itself, that is, a compound which has a function as a proton donor.

As the acid generator component, a thermal acid generator component which generates acid by heating, and a photo acid generator component which generates acid upon exposure can be mentioned.

<Base Component; Component (A)>

The component (A) is a base component that generates base upon exposure and exhibits increased solubility in an alkali developing solution under action of acid.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound which can be used as a base component is broadly classified into non-polymers and polymers.

In general, as a non-polymer, any of those which have a molecular weight in the range of no less than 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "resin" refers to a polymer having a molecular weight of 1,000 or more.

The molecular weight of the polymeric compound is the weight average molecular weight in terms of the polystyrene equivalent value determined by gel permeation chromatography (GPC).

The component (A) is a base component which has a part generating base upon exposure and which exhibits increased solubility in an alkali developing solution under action of acid, and may be a resin component, a low molecular compound, or a mixture thereof.

The component (A) is preferably a resin component, and as the resin component, one type of polymeric compound may be used, or two or more types of polymeric compounds may be used in combination.

Among these, the component (A) preferably contains a polymeric compound (hereafter, referred to as "polymeric compound (A1)" or "component (A1)") having a structural unit which generates base upon exposure (hereafter, referred to as "structural unit (a5)").

The component (A1) is preferably a polymeric compound which has a structural unit (a5) and which exhibits increased polarity by the action of acid. When the component (A1) is used, base is generated from the structural unit (a5) upon exposure in the step (2), and then by bake treatment in the step (3), the base reacts with acid provided to the resist film in advance, so that at exposed portions of the resist film, the solubility of the component (A1) in an alkali developing solution is either unchanged or only slightly changed. On the other hand, at unexposed portions of the resist film, the polarity of the component (A1) is changed thereby increasing the solubility of the component (A1) in an alkali developing solution. Therefore, an excellent development contrast can be obtained by an alkali development.

It is preferable that the component (A1) further includes a structural unit (a1) having an acid decomposable group which exhibits increased polarity by the action of acid, as well as the structural unit (a5).

Further, in addition to the structural unit (a5) and the structural unit (a1), it is preferable that the component (A1) further includes a structural unit (a2) derived from an acrylate ester which may have the hydrogen atom bonded to the carbon atom on the α-position substituted with a substituent and which contains a lactone-containing cyclic group.

In addition to the structural unit (a5) and the structural unit (a1) or in addition to the structural unit (a5), the structural unit (a1) and the structural unit (a2), it is preferable that the component (A1) further include a structural unit (a3) derived from an acrylate ester which may have the hydrogen atom bonded to the carbon atom on the α-position substituted with a substituent and contains a polar group-containing aliphatic hydrocarbon group.

[Structural Unit (a5)]

The structural unit (a5) is a structural unit which generates base upon exposure.

The structural unit (a5) may be any structural units having a part which generates base, and examples thereof include a structural unit containing a carbamate group (a urethane bond), a structural unit containing an acyloxyimino group, an ionic-structural unit (an anion-cation complex), and a structural unit containing a carbamoyloxyimino group.

In addition, the structural unit (a5) preferably has a ring structure in the molecule thereof. Examples of the ring structure include benzene, naphthalene, anthracene, xanthone, thioxanthone, anthraquinone, fluorene, and the like.

The structural unit (a5) is preferably a structural unit derived from a compound containing an ethylenic double bond.

Here, the "structural unit derived from a compound containing an ethylenic double bond" refers to a structural unit in which the ethylenic double bond of the compound containing an ethylenic double bond is cleaved to form a single bond.

Examples of the compound containing an ethylenic double bond include an acrylic acid or ester thereof which may have the hydrogen atom bonded to the carbon atom on the α-position substituted with a substituent, an acrylamide or derivative thereof which may have the hydrogen atom bonded to the carbon atom on the α-position substituted with a substituent, a vinyl aromatic compound which may have the hydrogen atom bonded to the carbon atom on the α-position substituted with a substituent, a cycloolefine or derivative thereof, and a vinyl sulfonate ester and the like. Further, a compound in which a hydrogen atom in —$NH_2$ within carbamic acid or ester thereof has been substituted with a vinyl group, can be mentioned.

Among these, an acrylic acid or ester thereof which may have the hydrogen atom bonded to the carbon atom on the α-position substituted with a substituent, an acrylamide or derivative thereof which may have the hydrogen atom bonded to the carbon atom on the α-position substituted with a substituent, and a vinyl aromatic compound or derivative thereof which may have the hydrogen atom bonded to the carbon atom on the α-position substituted with a substituent are preferable.

An "acrylate ester" refers to a compound in which the terminal hydrogen atom of the carboxy group of acrylic acid ($CH_2$=CH—COOH) has been substituted with an organic group.

In the present specification, an acrylic acid and acrylate ester in which the hydrogen atom bonded to the carbon atom on the α-position has been substituted with a substituent are referred to as an "α-substituted acrylic acid" and an "α-substituted acrylate ester", respectively. Further, acrylic acid and α-substituted acrylic acid are collectively referred to as "(α-substituted) acrylic acid", and acrylate esters and α-substituted acrylate esters are collectively referred to as "(α-substituted) acrylate ester".

Examples of the substituent bonded to the carbon atom on the α-position of the α-substituted acrylate or ester thereof include an alkyl group of 1 to 5 carbon atoms, a halogenated alkyl group of 1 to 5 carbon atoms and a hydroxyalkyl group. With respect to the structural unit derived from an acrylate ester, the α-position (the carbon atom on the α-position) refers to the carbon atom having the carbonyl group bonded thereto, unless specified otherwise.

Examples of the halogen atom as the substituent at the α-position include a fluorine atom, a chlorine atom, a bromine atom and an iodine atom.

Specific examples of the alkyl group of 1 to 5 carbon atoms for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms as a substituent on the α-position include groups in which part or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly preferred.

As the hydroxyalkyl group as a substituent on the α-position, a hydroxyalkyl group of 1 to 5 carbon atoms is preferred. Specific examples include a group in which part or all of the hydrogen atoms of the aforementioned alkyl group of 1 to 5 carbon atoms are substituted with a hydroxy group.

In the present invention, it is preferable that a hydrogen atom, an alkyl group of 1 to 5 carbon atoms or a halogenated alkyl group of 1 to 5 carbon atoms is bonded to the α-position of the (α-substituted) acrylic acid of ester thereof, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most preferred.

The "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

Examples of the "acrylamide and derivative thereof" include an acryl amide which may have the hydrogen atom bonded to the carbon atom on the α-position substituted with a substituent (hereafter, referred to as (α-substituted) acrylamide) and a compound in which one or both of hydrogen atoms on the terminal of the amino group within the α-substituted) acrylamide have been substituted with a substituent.

As the substituent which may be bonded to the carbon atom on the α-position of an acrylamide, or derivatives thereof, the same substituents as those described above for the substituent to be bonded to the carbon atom on the α-position of an α-substituted acrylate ester can be mentioned.

As the substituent with which one or both of hydrogen atoms on the terminal of the amino group within (α-substituted) acrylamide is substituted, an organic group is preferable.

Examples of the compound in which one or both of hydrogen atom on the terminal of amine group within the (α-substituted) acrylamide have been substituted with a substituent include a compound in which a group —C(=O)—O— bonded to carbon atom on the α-position of the (α-substituted) acrylate ester is replaced by a group —C(=O)—N(R$^b$)— [in the formula, R$^b$ represents a hydrogen atom or an alkyl group of 1 to 5 carbon atoms].

In the formula, the alkyl group for R$^b$ is preferably a linear or branched alkyl group.

The "vinyl aromatic compound" is a compound having an aromatic ring and one vinyl group bonded to the aromatic ring, and as the examples thereof, a styrene or derivative thereof and a vinyl naphthalene and derivative thereof can be mentioned.

As the substituent which may be bonded to the carbon atom on the α-position of a vinyl aromatic compound (that is, the carbon atom of the vinyl group, which is bonded to the aromatic ring), the same substituents as those described above for the substituent to be bonded to the carbon atom on the α-position of an α-substituted acrylate ester can be mentioned.

Hereafter, a vinyl aromatic compound in which the hydrogen atom bonded to the carbon atom on the α-position has been substituted with a substituent is referred to as an (α-substituted) vinyl aromatic compound.

Examples of the "styrene and derivative thereof" include a styrene which may have the hydrogen atom bonded to the carbon atom on the α-position substituted with a substituent and which may have the hydrogen atom bonded to the benzene ring substituted with a substituent other than the hydroxy group (hereafter, referred to as "α-substituted)styrene)", a hydroxystyrene which may have the hydrogen atom bonded to the carbon atom on the α-position substituted with a substituent and may have a hydrogen atom bonded to the benzene ring substituted with a substituent other than a hydroxy group (hereafter, referred to as "(α-substituted)hydroxystyrene)", a compound in which a hydrogen atom of hydroxy group of (α-substituted)hydroxystyrene has been substituted with an organic group, a vinylbenzoic acid which may have the hydrogen atom bonded to the carbon atom on the α-position substituted with a substituent and may have a hydrogen atom bonded to the benzene ring substituted with a substituent other than a hydroxy group and a carboxy group (hereafter, referred to as (α-substituted)vinylbenzoic acid), and a compound in which a hydrogen atom of carboxy group of (α-substituted)vinylbenzoic acid has been substituted with an organic group.

A hydroxystyrene is a compound which has one vinyl group and at least one hydroxy group bonded to a benzene ring. The number of hydroxy groups bonded to the benzene ring is preferably 1 to 3, and most preferably 1. The bonding position of the hydroxy group on the benzene ring is not particularly limited. When the number of the hydroxy group is 1, para (4th) position against the bonding position of the vinyl group is preferable. When the number of the hydroxy groups is an integer of 2 or more, an arbitrary combination of the bonding positions can be adopted.

The vinylbenzoic acid is a compound in which one vinyl group is bonded to the benzene ring within the benzoic acid. The bonding position of the vinyl group on the benzene ring is not particularly limited.

The substituent other than a hydroxy group or a carboxy group which may be bonded to the benzene ring of an styrene or derivative thereof is not particularly limited, and examples thereof include a halogen atom, an alkyl group of 1 to 5 carbon atoms and a halogenated alkyl group of 1 to 5 carbon atoms. Examples of the halogen atom include a fluorine atom, a chlorine atom, a bromine atom and an iodine atom, and a fluorine atom is particularly preferred.

Examples of the "vinyl naphthalene and derivative thereof" include a vinyl naphthalene may have the hydrogen atom bonded to the carbon atom on the α-position substituted with a substituent and may have the hydrogen atom bonded to the naphthalene ring substituted with a substituent other than the hydroxy group (hereafter, referred to as "(α-substituted) vinyl naphthalene)", a vinyl (hydroxynaphthalene) which may have the hydrogen atom bonded to the carbon atom on the α-position substituted with a substituent and may have a hydrogen atom bonded to the naphthalene ring substituted with a substituent other than a hydroxy group (hereafter, referred to as "(α-substituted) vinyl(hydroxynaphthalene)" and a compound in which a hydrogen atom of hydroxy group within (α-substituted) vinyl(hydroxynaphthalene) has been substituted with a substituent.

A vinyl(hydroxynaphthalene) is a compound which has one vinyl group and at least one hydroxy group bonded to a naphthalene ring. The vinyl group may be bonded to the 1st or 2nd position of the naphthalene ring. The number of hydroxy groups bonded to the naphthalene ring is preferably 1 to 3, and particularly preferably 1. The bonding position of the hydroxy group on the naphthalene ring is not particularly limited. When the vinyl group is bonded to the 1st or 2nd position of the naphthalene ring, the hydroxy group is preferably bonded to either one of the 5th to 8th position of the naphthalene ring. In particular, when the number of hydroxy group is 1, the hydroxy group is preferably bonded to either one of the 5th to 7th position of the naphthalene ring, and more preferably the 5th or 6th position. When the number of the hydroxy groups is an integer of 2 or more, an arbitrary combination of the bonding positions can be adopted.

As the substituent which may be bonded to the naphthalene ring of the vinyl naphthalene or derivative thereof, the same substituents as those described above for the substituent which may be bonded to the benzene ring of the (α-substituted) styrene can be mentioned.

The "carbamate ester" is a compound in which hydrogen atom of a hydroxy group within a carbamic acid (HO—C(=O)—NH$_2$ has been substituted with an organic group.

As the "a compound in which hydrogen atom of —NH$_2$ within a carbamic acid or ester thereof has been substituted with a vinyl group and the like", compounds such as N-vinylcarbamic acid or ester thereof, or N-allylcarbamic acid or ester thereof can be mentioned. In the group CH$_2$=CH— within these compounds, a hydrogen atom bonded to a carbon atom having a substrate bonded thereto (that is, the carbon atom having —NH— of —CH$_2$—NH— bonded thereto) may be substituted with a substituent, as in the other compound containing an ethylenic double bond. Hereafter, vinylcarbamic acid which include the aforementioned compounds in which a hydrogen atom bonded to a carbon atom having a substituent bonded thereto has been substituted with a substituent or vinylcarbamic acid derivatives which include the aforementioned compounds in which a hydrogen atom bonded to a carbon atom having a substituent bonded thereto has been substituted with a substituent are referred to "(substituted) vinylcarbamic acid" or "(substituted) vinylcarbamic acid derivatives", respectively.

Specific examples of the structural unit derived from the (α-substituted) acrylic acid or ester thereof include a structural unit represented by general formula (U-1) shown below.

Specific examples of the structural unit derived from the (α-substituted) acrylamide or derivative thereof include a structural unit represented by general formula (U-2) shown below.

With respect to the (α-substituted) vinyl aromatic compound, specific examples of the structural unit derived from the (α-substituted) styrene or derivative thereof include a structural unit represented by general formula (U-3) shown below. Specific examples of the structural unit derived from the (α-substituted) vinyl naphthalene or derivative thereof include a structural unit represented by general formula (U-4) shown below.

Specific examples of the structural unit derived from the (substituted) vinylcarbamic acid derivatives include a structural unit represented by general formula (U-5) shown below.

Examples of the structural unit (a5) include structural units represented by general formulas (U-1) to (U-4) shown below, which have a part capable of generating base upon exposure, or a structural unit represented by general formula (U-5).

[Chemical Formula 1]

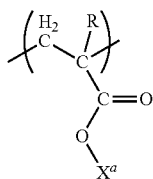
(U-1)

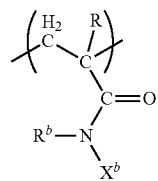
(U-2)

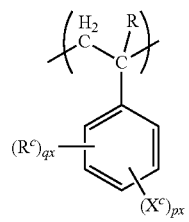
(U-3)

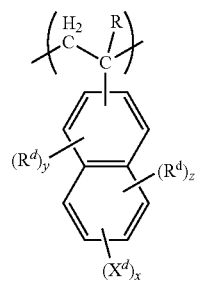
(U-4)

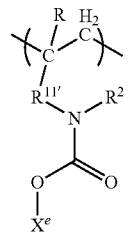
(U-5)

In the formulas, R represents a hydrogen atom, an alkyl group of 1 to 5 carbon atoms or a halogenated alkyl group of 1 to 5 carbon atoms; $X^a$, $X^b$ and $X^e$ each independently represents a hydrogen atom or an organic group; $X^c$ and $X^d$ each independently represents a hydrogen atom, a hydroxy group or an organic group; $R^b$ represents a hydrogen atom or an alkyl group of 1 to 5 carbon atoms; $R^c$ and $R^d$ each independently represents a halogen atom, —COOX$^e$ (wherein, $X^e$ represents a hydrogen atom or an organic group), an alkyl group of 1 to 5 carbon atoms or a halogenated alkyl group of 1 to 5 carbon atoms; px represents an integer of 0 to 3, and qx represents an integer of 0 to 5, provided that px+qx=0 to 5; qx is an integer of 2 or more, the plurality of $R^c$ may be the same or different from each other; x represents an integer of 0 to 3; y represents an integer of 0 to 3; and z represents an integer of 0 to 4, provide that x+y+z=0 to 7; y+z is an integer of 2 or more, the plurality of $R^d$ may be the same or different from each other; $R^{11}$, represents a single bond or a divalent aliphatic hydrocarbon group; $R^2$ represents a hydrogen atom, a linear, branched or cyclic alkyl group of 1 to 10 carbon atoms or an aryl group of 6 to 10 carbon atoms, and $R^{11}$, and $R^2$ may be bonded to form a ring with the nitrogen atom having $R^{11}$, and $R^2$ bonded thereto, wherein an alkyl group or an aryl group for $R^2$ may have a substituent.

As a preferable example of the structural unit (a5), a structural unit (a51) represented by general formula (a5-1) shown below can be given.

[Chemical Formula 2]

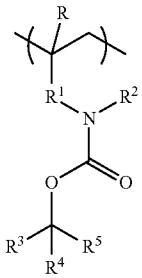

(a5-1)

In the formula, R represents a hydrogen atom, an alkyl group of 1 to 5 carbon atoms or a halogenated alkyl group of 1 to 5 carbon atoms; $R^1$ represents a single bond or a divalent linking group; $R^2$ represents a hydrogen atom, a linear, branched or cyclic alkyl group of 1 to 10 carbon atoms or an aryl group of 6 to 10 carbon atoms, and $R^1$ and $R^2$ may be bonded to form a ring with the nitrogen atom having $R^1$ and $R^2$ bonded thereto, wherein an alkyl group or an aryl group for $R^2$ may have a substituent; $R^3$, $R^4$ and $R^5$ each independently represents a hydrogen atom, a linear, branched or cyclic alkyl group of 1 to 10 carbon atoms or an aryl group of 6 to 14 carbon atoms, $R^3$ and $R^4$, $R^4$ and $R^5$ or $R^3$ and $R^5$ may be bonded to form a ring with a carbon atom having these groups bonded thereto, wherein an alkyl group or an aryl group for $R^3$, $R^4$ and $R^5$ may have a substituent, provided that $R^3$, $R^4$ and $R^5$ do not all represent a hydrogen atom or an alkyl group at the same time.

In general formula (a5-1), R represents a hydrogen atom, an alkyl group of 1 to 5 carbon atoms or a halogenated alkyl group of 1 to 5 carbon atoms.

Examples of the alkyl group of 1 to 5 carbon atoms for R include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which part or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly preferred.

R is preferably a hydrogen atom, an alkyl group of 1 to 5 carbon atoms or a fluorinated alkyl group of 1 to 5 carbon atoms, and most preferably a hydrogen atom or a methyl group.

In formula (a5-1), $R^1$ represents a single bond or a divalent linking group.

The divalent linking group for $R^1$ is not particularly limited, and preferable examples thereof include a divalent hydrocarbon group which may have a substituent and a divalent linking group containing a hetero atom.

(Divalent Hydrocarbon Group which May have a Substituent)

A hydrocarbon "has a substituent" means that part or all of the hydrogen atoms within the hydrocarbon group has been substituted with a substituent (a group or an atom other than hydrogen).

The hydrocarbon group may be either an aliphatic hydrocarbon group or an aromatic hydrocarbon group. An "aliphatic hydrocarbon group" refers to a hydrocarbon group that has no aromaticity.

The divalent aliphatic hydrocarbon group as the divalent hydrocarbon group for $R^1$ may be either saturated or unsaturated. In general, the divalent aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched, saturated hydrocarbon group may be a saturated hydrocarbon group or an unsaturated hydrocarbon group.

In the case of the saturated hydrocarbon group, the linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$-], an ethylene group [—$(CH_2)_2$-], a trimethylene group [—$(CH_2)_3$-], a tetramethylene group [—$(CH_2)_4$-] and a pentamethylene group [—$(CH_2)_5$-].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

In the case of the unsaturated hydrocarbon group, the linear or branched aliphatic hydrocarbon group preferably has 2 to 12 carbon atoms. Examples of linear aliphatic unsaturated hydrocarbon groups include a vinyl group, a propenyl group (an allyl group) and a butynyl group. Examples of branched aliphatic unsaturated hydrocarbon groups include a 1-methylpropenyl group and a 2-methylpropenyl group.

The linear or branched aliphatic hydrocarbon group may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, an alicyclic hydrocarbon group (a group in which two hydrogen atoms have been removed from an aliphatic hydrocarbon ring), and a group in which the alicyclic hydrocarbon group is bonded to the terminal of the linear or branched aliphatic hydrocarbon group or interposed within the aforementioned linear or branched aliphatic hydrocarbon group, can be given. Examples of the linear or branched aliphatic hydrocarbon group include the same groups as described above.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group for $R^1$ as a divalent hydrocarbon group is a hydrocarbon group having an aromatic ring.

The aromatic hydrocarbon group preferably has 5 to 30 carbon atoms, more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring in the aromatic hydrocarbon group include aromatic hydrocarbon rings such as benzene, biphenyl, fluorene, naphthalene, anthracene and phenanthrene and aromatic heterocycles in which part of the carbon atoms of the aromatic hydrocarbon ring have been substituted with a hetero atom.

Examples of hetero atoms within the aromatic heterocycle include an oxygen atom, a nitrogen atom, and a sulfur atom.

Specific examples of the aromatic hydrocarbon group include a group in which two hydrogen atoms have been removed from the aromatic hydrocarbon ring (arylene group); a group in which one hydrogen atom has been removed from the aromatic hydrocarbon ring (aryl group) and another one of hydrogen atoms in the aromatic hydrocarbon ring has been substituted with an alkylene group (for example, a group in which one hydrogen atom has been removed from an aryl group within an arylalkyl group such as a benzyl group (phenylmethylene group), a phenethyl group (phenylethylene group), a phenylpropylene group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and particularly preferably 1.

The aromatic hydrocarbon group may or may not have a substituent. For example, one or more of the hydrogen atoms bonded to the aromatic hydrocarbon ring in the aromatic hydrocarbon group may be substituted with a substituent. Examples of substituents include an alkyl group, an alkoxy group, a halogen atom, a halogenated alkyl group, a hydroxy group and an oxygen atom (=O).

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.
(Divalent Linking Group Containing a Hetero Atom)

With respect to a "divalent linking group containing a hetero atom" for $R^1$, a hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, —NH—C(=O)—, =N— and a group represented by general formulas —$Y^{21}$—$Y^{22}$—, —[$Y^{21}$—C(=O)—O]$_{m'}$—$Y^{22}$—, —C(=O)—O—$Y^{22}$— and —$Y^{21}$—O—C(=O)—$Y^{22}$—[in the formulas, each of $Y^{21}$ and $Y^{22}$ independently represents a divalent hydrocarbon group which may have a substituent, O represents an oxygen atom, and m' represents an integer of 0 to 3].

When $R^1$ represents —NH—, H may be replaced with a substituent such as an alkyl group, an acyl group or the like. The substituent (an alkyl group, an acyl group or the like) preferably has 1 to 10 carbon atoms, more preferably 1 to 8, and most preferably 1 to 5.

$Y^{21}$ and $Y^{22}$ each independently represents a divalent hydrocarbon group which may have a substituent. As the divalent hydrocarbon group, the same groups as those described above for the "divalent hydrocarbon group which may have a substituent" for $R^1$ can be mentioned.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear aliphatic hydrocarbon group and an arylene group is preferable; a linear, branched or cyclic alkylene group of 1 to 10 carbon atoms, an arylene group of 6 to 10 carbon atoms or an alkenylene group of 2 to 12 carbon atoms is more preferable; and a methylene group, an ethylene group or an alkylmethylene group is still more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula —$Y^{21}$—O—$Y^{22}$—, —[$Y^{21}$—C(=O)—O]$_{m'}$—$Y^{22}$—, —C(=O)—O—$Y^{22}$—, or —$Y^{21}$—O—C(=O)—$Y^{22}$— is more preferable.

Among these, as the $R^1$, a single bond, a methylene group, an ethylene group, a phenylene group, a phenylmethylene group, a phenylpropylene group or a group represented by the formula —C(=O)—O—$Y^{22}$— is preferable, and a single bond or a group represented by the formula —C(=O)—O—$Y^{22}$— is more preferable.

In the formula (a5-1), $R^2$ represents a hydrogen atom, a linear, branched or cyclic alkyl group of 1 to 10 carbon atoms or an aryl group of 6 to 10 carbon atoms.

Examples of the alkyl group or aryl group for $R^2$, the same alkyl groups or aryl groups as those described above for "linear, branched or cyclic alkyl group of 1 to 10 carbon atoms" and "aryl group of 6 to 14 carbon atoms" exemplified in relation to the aforementioned divalent hydrocarbon group for $R^1$.

The alkyl group or the aryl group for $R^2$ may have a substituent. As the substituent for $R^1$, the same substituents as those described above as substituents which the aforementioned divalent hydrocarbon group for $R^1$ (linear or branched aliphatic hydrocarbon group, alicyclic hydrocarbon group or aromatic hydrocarbon group) may have, can be mentioned.

In the formula (a5-1), $R^1$ and $R^2$ may be mutually bonded to form a ring with the nitrogen atom having $R^1$ and $R^2$ bonded thereto. The ring preferably has 3 to 8 carbon atoms, and particularly preferably has 4 to 6 carbon atoms.

Specific examples of the ring include a ring in which $R^1$ is a group represented by the formula —C(=O)—O—$Y^{22}$—, wherein $Y^{22}$ and $R^2$ are bonded with the nitrogen atom having these groups bonded thereto; and a ring in which $R^1$ is a group represented by the formula —C(=O)—O—$Y^{23}$—O—C(=O)—$Y^{22}$—, wherein $Y^{22}$ and $R^2$ are bonded with the nitrogen atom having these groups bonded thereto.

$Y^{23}$ is a hydrocarbon group of 1 to 30 carbon atoms which may have a substituent. Here, the number of carbon atoms within a substituent(s) is not included in the number of carbon atoms of the aromatic hydrocarbon group.

The hydrocarbon group for $Y^{23}$ may be either an aliphatic hydrocarbon group, or an aromatic hydrocarbon group.

The aliphatic hydrocarbon group for $Y^{23}$ refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 12 carbon atoms, more preferably 1 to 10, still more preferably 1 to 8, and particularly preferably 1 to 5.

As the linear aliphatic hydrocarbon group, a linear alkylene group is preferable, and specific examples include a methylene group [—CH$_2$—], an ethylene group [—(CH$_2$)$_2$-], a trimethylene group [—(CH$_2$)$_3$-], a tetramethylene group [—(CH$_2$)$_4$-] and a pentamethylene group [—(CH$_2$)$_5$-].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, —C(CH$_2$CH$_3$)$_2$—CH$_2$—, —C(CH$_3$)C(CH$_3$)$_2$—, —CH$_2$—CH(C$_2$H$_5$)—, CH$_2$—CH(C$_3$H$_7$)—, and CH$_2$—CH(C$_4$H$_9$)—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched, aliphatic hydrocarbon group may have a substituent (that is, a group or an atom other than hydrogen atom).

When the hydrogen atom (—H) in the aliphatic hydrocarbon group is substituted with a monovalent group, as the monovalent group, an alkoxy group of 1 to 5 carbon atoms, a hydroxy group (—OH), an aromatic ring, a mercapto group (—SH), an amino group (—NH$_2$), a heterocycle, a fluorine atom, and a fluorinated alkyl group of 1 to 5 carbon atoms can be mentioned. Examples of the aromatic ring include groups in which one hydrogen atom has been removed from benzene, naphthalene, anthracene, phenanthrene or the like. As examples of the heterocycles, an aliphatic heterocycles in which part of the carbon atoms constituting a monovalent cyclic aliphatic hydrocarbon group has been replaced by a hetero atom (for example, a 5-membered ring containing a nitrogen atom, a 6-membered ring containing a nitrogen atom and the like), an aromatic heterocycles in which part of the carbon atoms constituting the aromatic hydrocarbon ring has been replaced by a hetero atom (for example, a pyridine ring, a thiophene ring and the like).

When a methylene group (—CH$_2$—) is replaced by a divalent group, as the divalent group, an oxygen atom (—O—), a carbonyl group (—C(=O)—) and —NH— can be mentioned.

As examples of the aliphatic hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring) and a group in which the cyclic aliphatic hydrocarbon group has been bonded to the terminal of the linear or branched aliphatic hydrocarbon group or interposed within the aforementioned linear aliphatic hydrocarbon group, can be given. Examples of the linear or branched aliphatic hydrocarbon group include the same groups as described above.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As the polycyclic aliphatic hydrocarbon group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent (that is, a group or an atom other than hydrogen atom) which substitutes a hydrogen atom in the cyclic aliphatic hydrocarbon group. Examples of substituents include an alkyl group, an alkoxy group, a halogen atom, a halogenated alkyl group, a hydroxyl group and an oxo group (=O).

The alkyl group, with which hydrogen atoms of the cyclic aliphatic hydrocarbon group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the cyclic aliphatic hydrocarbon group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom with which hydrogen atom of the cyclic aliphatic hydrocarbon group may be substituted include a fluorine atom, a chlorine atom, a bromine atom and an iodine atom, and a fluorine atom is particularly desirable.

Example of the halogenated alkyl group with which hydrogen atom of the cyclic aliphatic hydrocarbon group may be substituted includes a group in which part or all of the hydrogen atoms within the aforementioned alkyl group have been substituted with the aforementioned halogen atoms.

Further, part of the carbon atoms constituting the cyclic structure of the cyclic aliphatic hydrocarbon group may be substituted with a hetero atom-containing substituent group. The hetero atom-containing substituent group is preferably —O—, —C(=O)—O—, —S—, —S(=O)$_2$— or —S(=O)$_2$—O—.

The aromatic hydrocarbon group for $Y^{23}$ is a divalent hydrocarbon group having at least one aromatic ring, which may have a substituent. The aromatic ring is not particularly limited as long as it is a cyclic conjugation ring having 4n+2 of π electrons, and may be a monocyclic or a polycyclic. The aromatic ring preferably has 5 to 30 carbon atoms, more preferably 5 to 20, still more preferably 6 to 15, and particularly preferably 6 to 12. Here, the number of carbon atoms within a substituent(s) is not included in the number of carbon atoms of the aromatic hydrocarbon group.

Examples of the aromatic ring include aromatic hydrocarbon rings such as benzene, biphenyl, fluorene, naphthalene, anthracene and phenanthrene and aromatic heterocycles in which part of the carbon atoms of the aromatic hydrocarbon ring have been substituted with a hetero atom. Examples of hetero atoms within the aromatic heterocycle include an oxygen atom, a nitrogen atom, and a sulfur atom. Specific examples of aromatic heterocycles include a pyridine ring and a thiophene ring.

Specific examples of the aromatic hydrocarbon group for $Y^{23}$ include a group in which two hydrogen atoms have been removed from the aromatic hydrocarbon ring or aromatic heterocycle (arylene group or heteroarylene group); a group in which two hydrogen atoms have been removed from an aromatic compound having two or more aromatic rings (for example, biphenyl or fluorene); a group in which one hydrogen atom has been removed from the aromatic hydrocarbon group or aromatic heterocycle (aryl group or heteroaryl group) and another one hydrogen atom has been substituted with an alkylene group (for example, a group in which one hydrogen atom has been removed from an aryl group of an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aryl group or heteroaryl group preferably has 1 to 4 carbon atom, more preferably 1 or 2, and most preferably 1.

The aromatic hydrocarbon group for $Y^{23}$ may or may not have a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, a hydroxyl group and an oxo group (=O). Examples of the alkyl group, alkoxy group, halogen atom and halogenated alkyl group with which hydrogen atom bonded to an aromatic ring may be substituted include the same alkyl group, alkoxy group, halogen atom and halogenated alkyl group as those described above as substituents with which hydrogen atom bonded to a cyclic aliphatic hydrocarbon group may be substituted.

In the formula (a5-1), $R^3$, $R^4$ and $R^5$ each independently represents a hydrogen atom, a linear, branched or cyclic alkyl group of 1 to 10 carbon atoms or an aryl group of 6 to 10 carbon atoms. Provided that $R^3$, $R^4$ and $R^5$ do not all represent a hydrogen atom or an alkyl group at the same time.

Examples of the alkyl group or aryl group for $R^3$, $R^4$ and $R^5$, the same alkyl groups or aryl groups as those described above for "linear, branched or cyclic alkyl group of 1 to 10 carbon atoms" and "aryl group of 6 to 14 carbon atoms" exemplified in relation to the aforementioned divalent hydrocarbon group for $R^1$.

The alkyl group or the aryl group for $R^3$, $R^4$ and $R^5$ may have a substituent. As the substituent for $R^3$, $R^4$ and $R^5$, the same substituents as those described above as substituents which the aforementioned divalent hydrocarbon group for $R^1$ (linear or branched aliphatic hydrocarbon group or alicyclic hydrocarbon group) may have, can be mentioned.

The aryl group or the aryl group for $R^3$, $R^4$ and $R^5$ may have a substituent. As the substituent for $R^3$, $R^4$ and $R^5$, a linear, branched or cyclic alkyl group of 1 to 6 carbon atoms, an alkoxy group of 1 to 6 carbon atoms, a nitro group, a halogen atom, a cyano group or a trifluoromethyl group can be mentioned.

Among these, as $R^3$, $R^4$ and $R^5$, it is preferable that at least one of these represents an aryl group of 6 to 14 which may have a substituent.

In the formula (a5-1), $R^3$ and $R^4$, $R^4$ and $R^5$ or $R^3$ and $R^5$ may be mutually bonded to form a ring with the nitrogen atom having these groups bonded thereto. As the ring, a non-aromatic ring of 3 to 10 carbon atoms is preferable, and a non-aromatic ring of 4 to 6 carbon atoms is particularly preferable.

The structural unit (a51) represented by the general formula (a5-1) is decomposed in accordance with a reaction formula shown below thereby generating an amine compound (base), a carbon dioxide and an other compound.

[Chemical Formula 3]

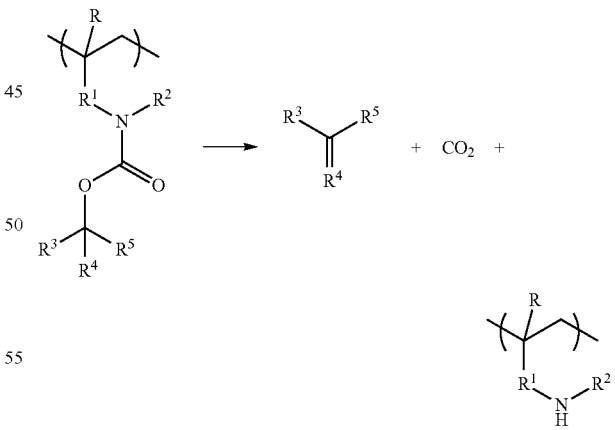

In the formula, R, $R^1$, $R^2$, $R^3$, $R^4$ and $R^5$ are the same as defined above.

Specific examples of the structural unit (a51) are shown below.

In the formulas shown below, $R^α$ represents a hydrogen atom, a methyl group or a trifluoromethyl group. In the formula, R, $R^1$, $R^2$, $R^3$, $R^4$ and $R^5$ are the same as defined above.

[Chemical Formula 4]
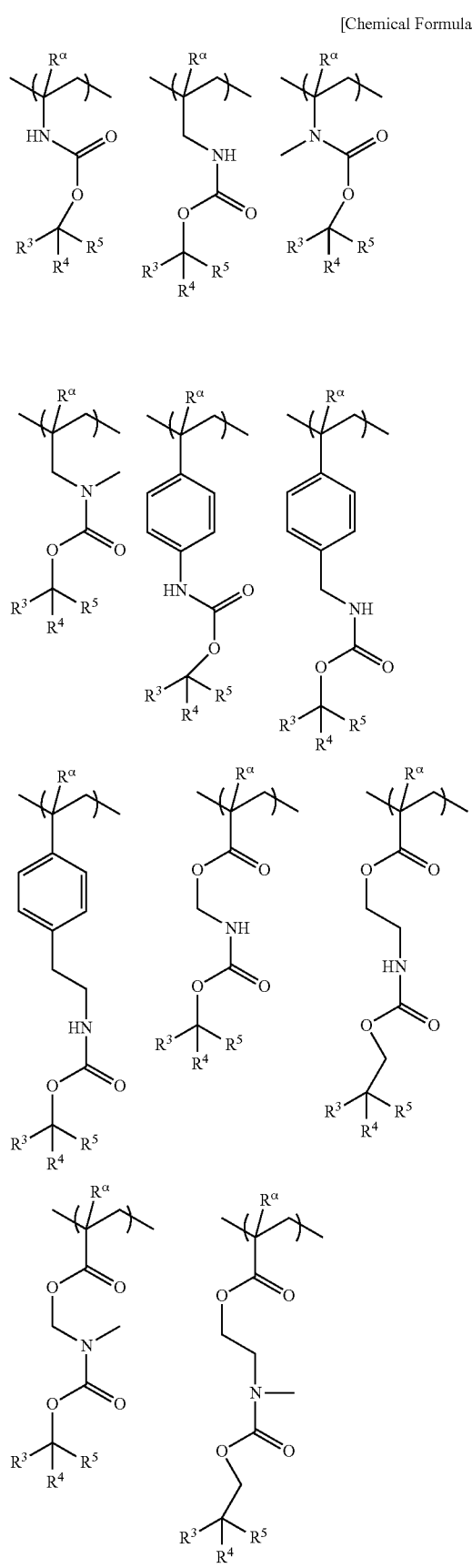
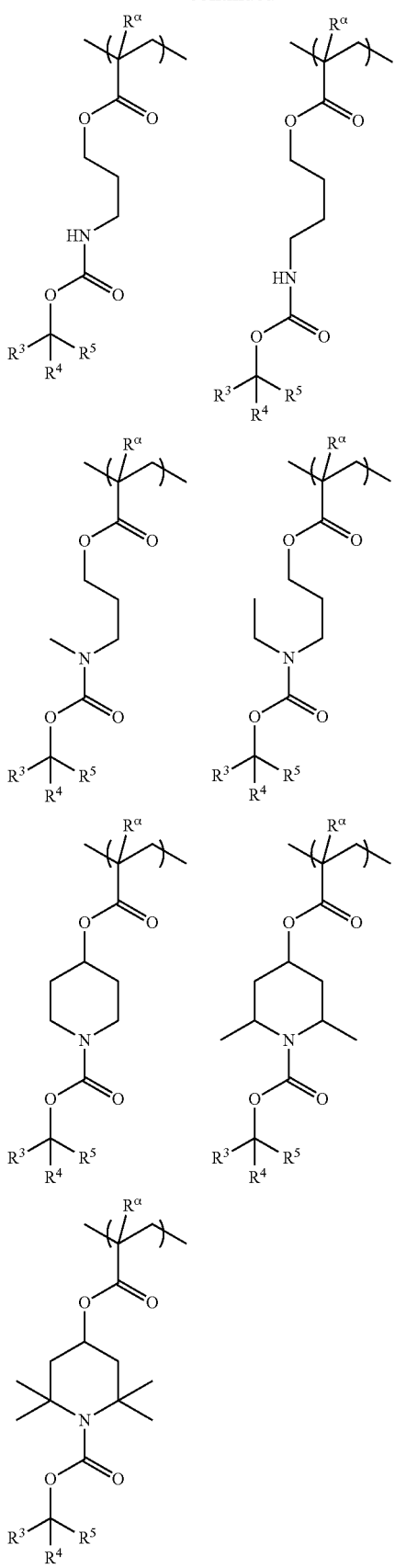

-continued
[Chemical Formula 5]
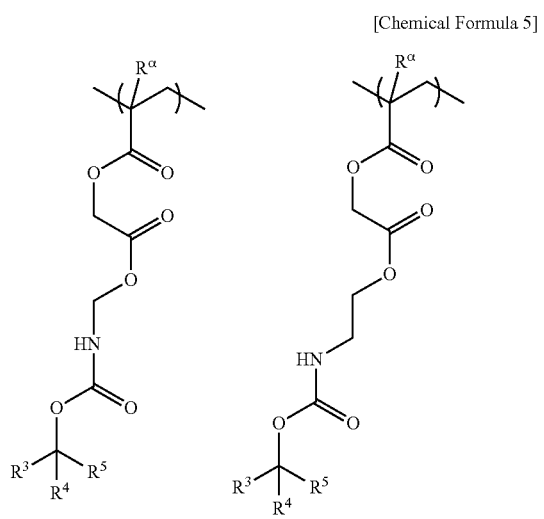
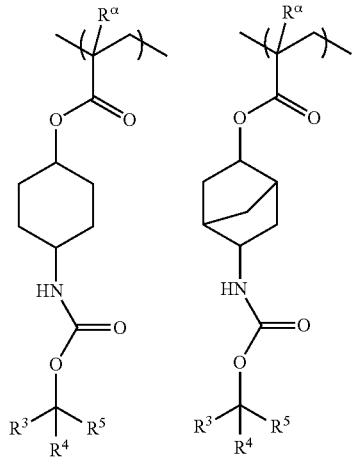
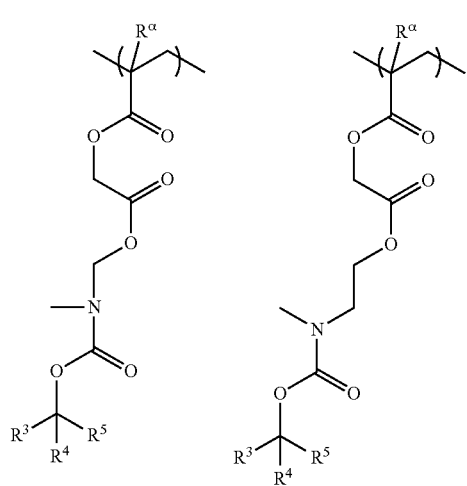
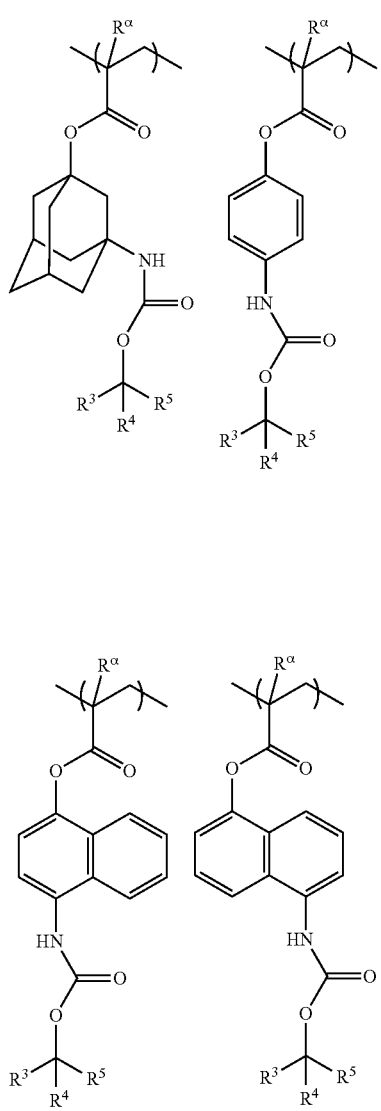

[Chemical Formula 6]
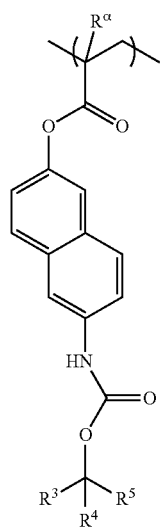
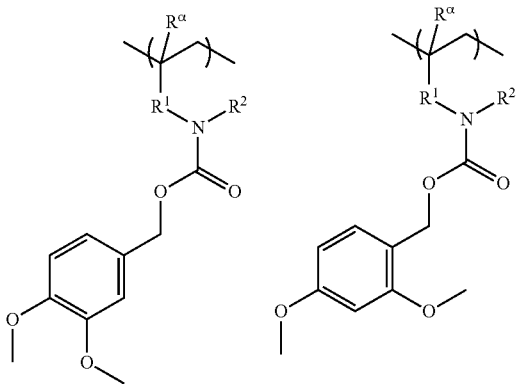
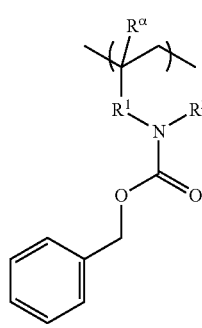
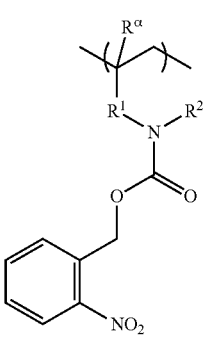
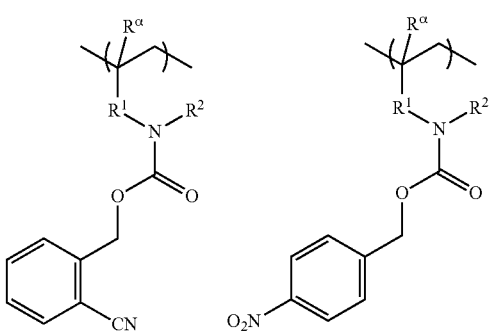
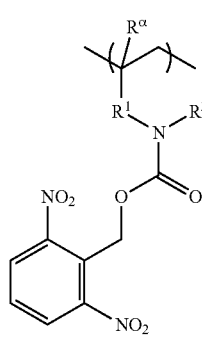
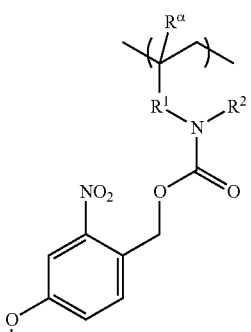
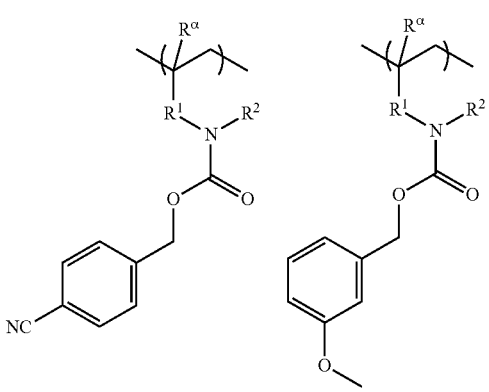
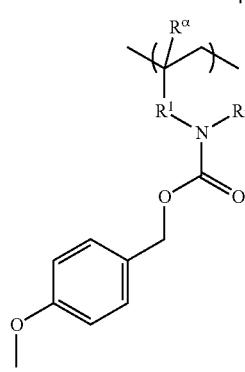
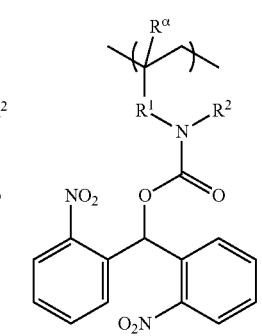
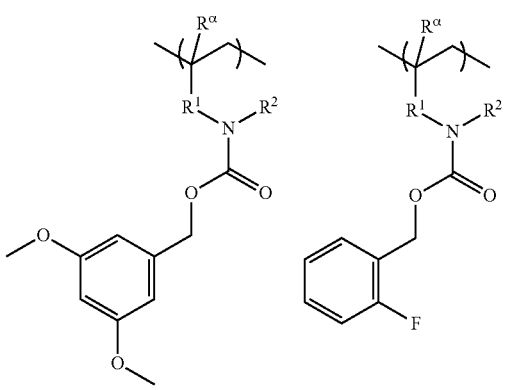

-continued
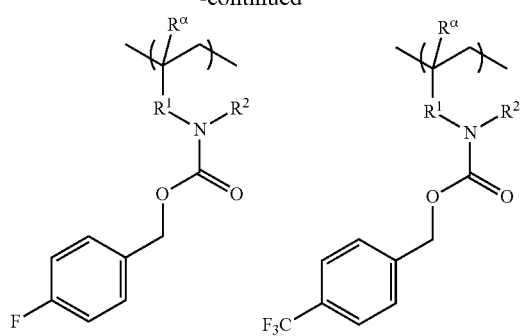
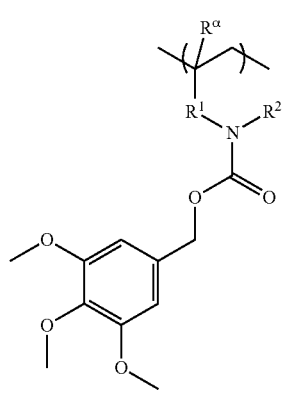
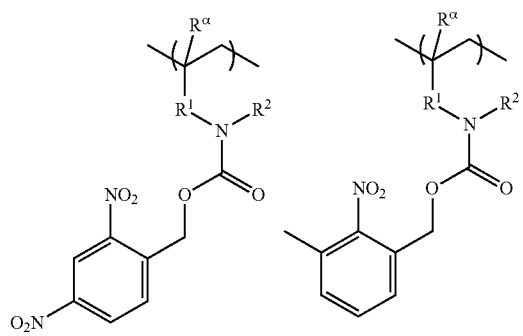
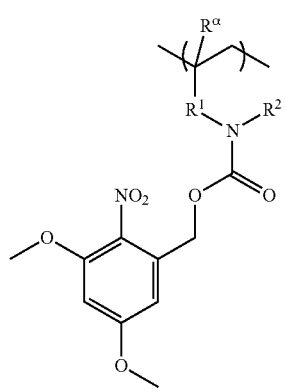
-continued
[Chemical Formula 7]
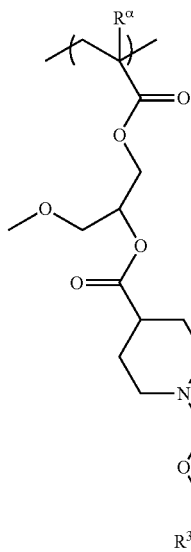
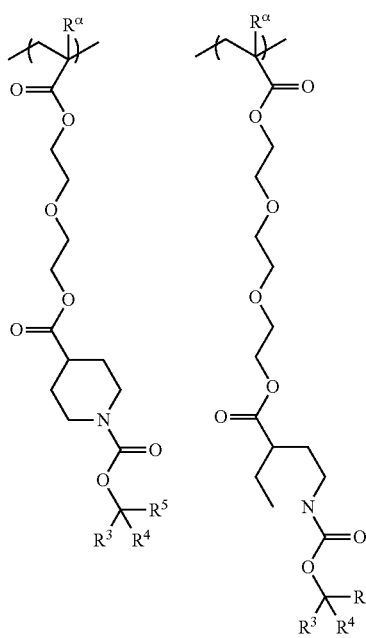

-continued
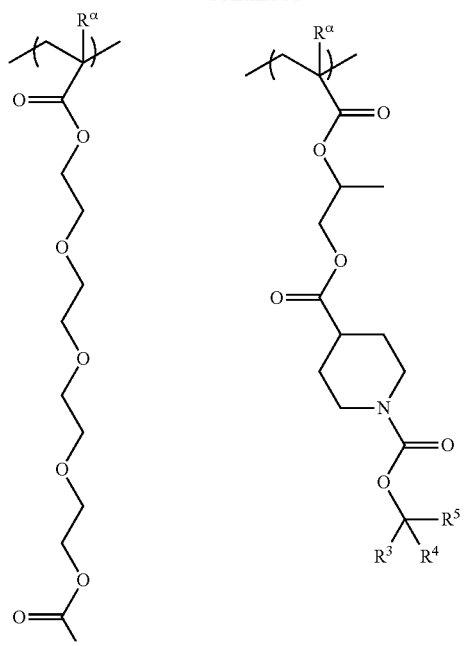
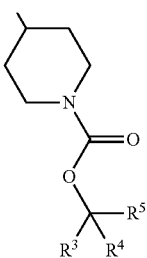
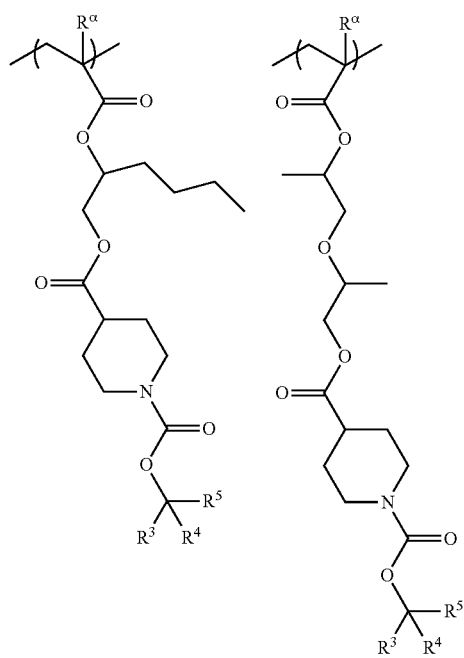
-continued
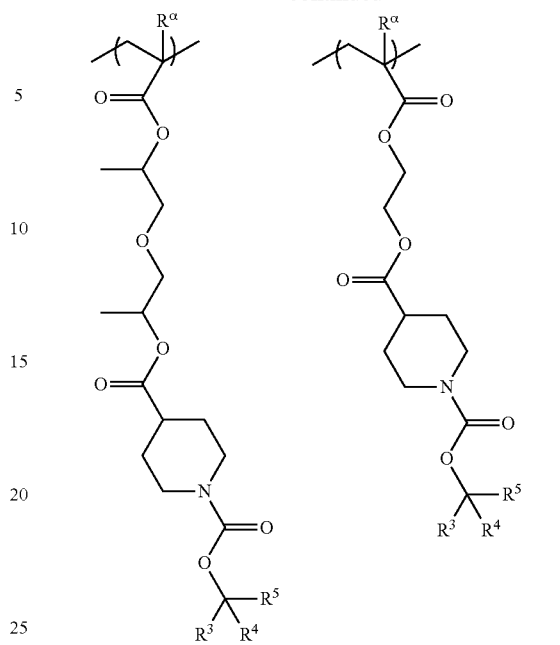
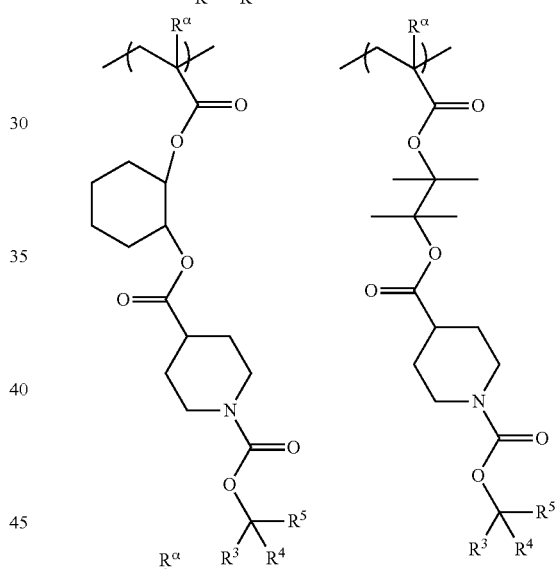
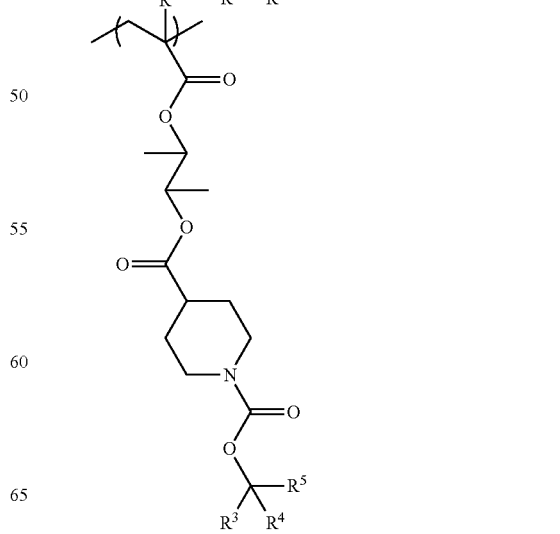

-continued
[Chemical Formula 8]
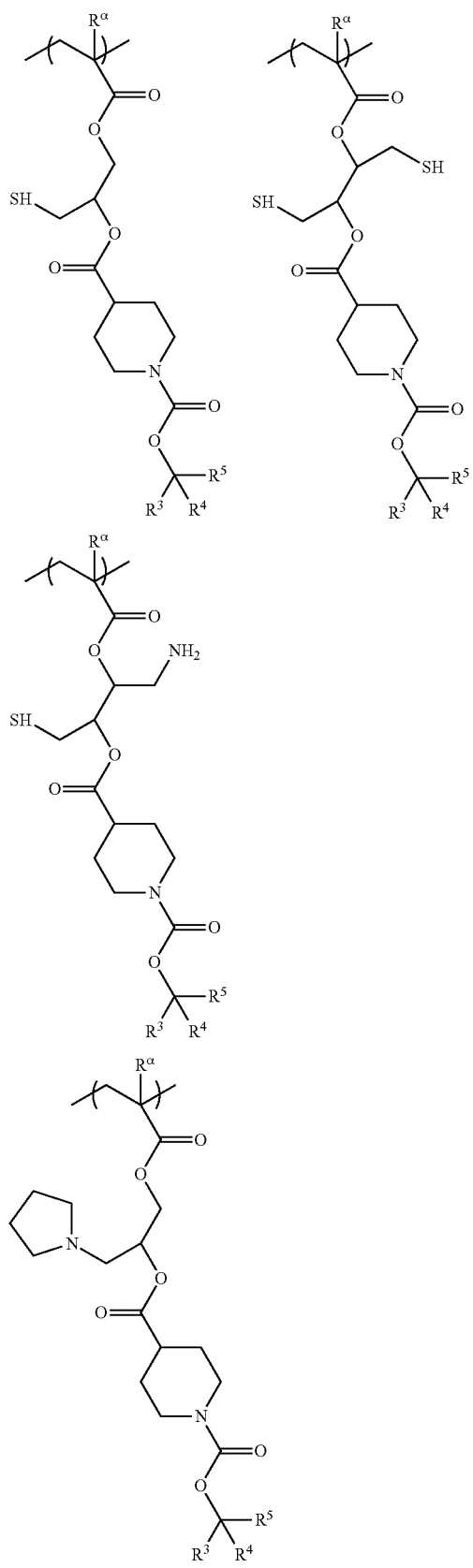
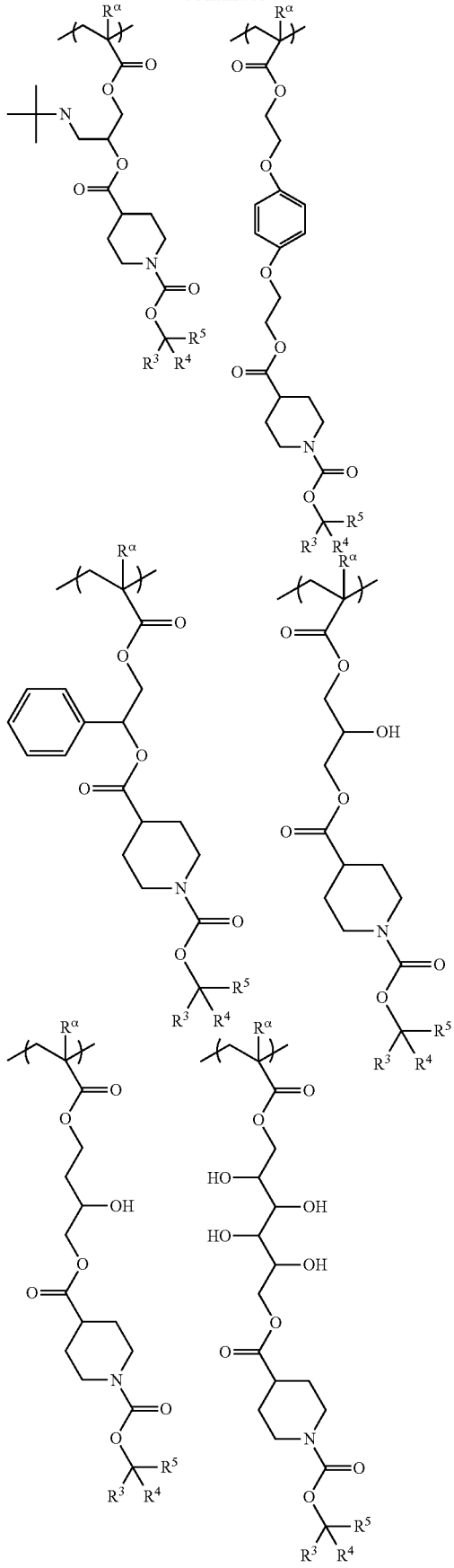

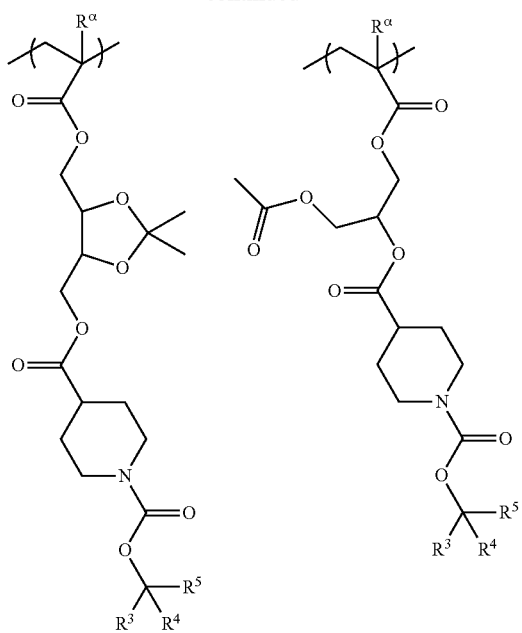
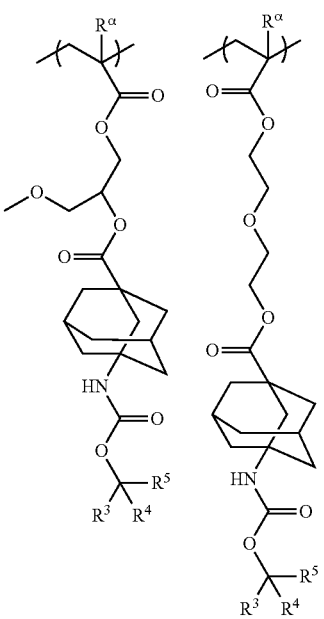
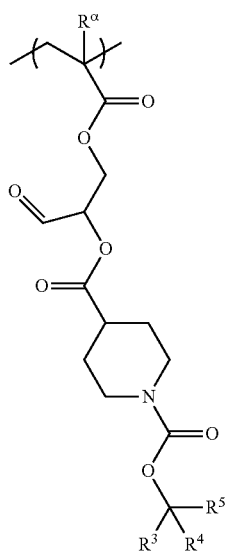
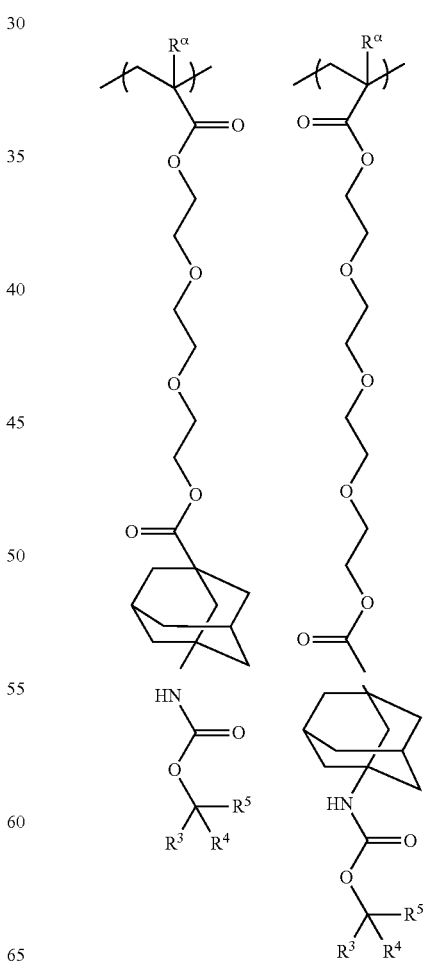

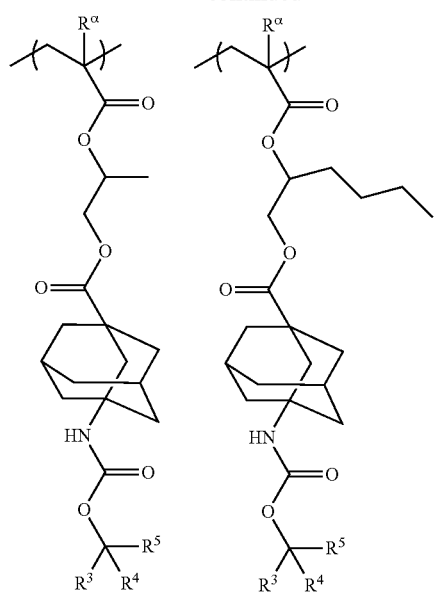
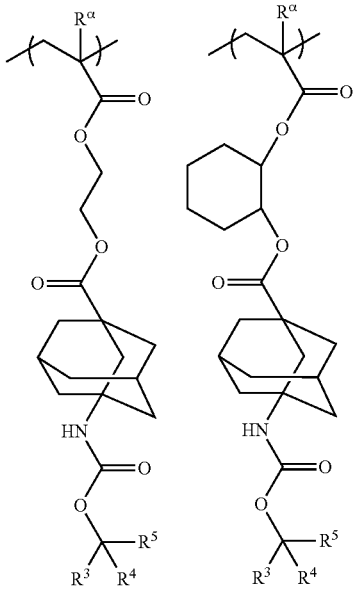
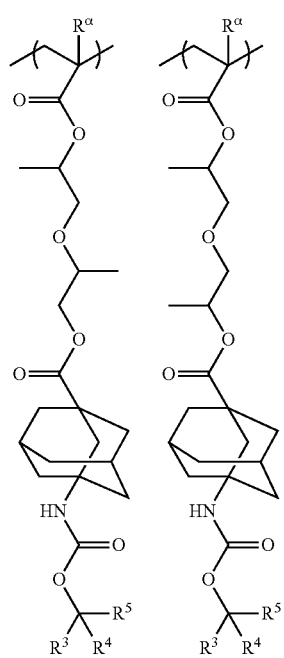

[Chemical Formula 10]
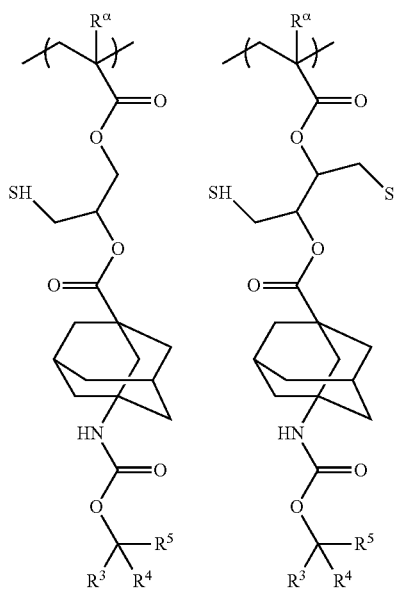
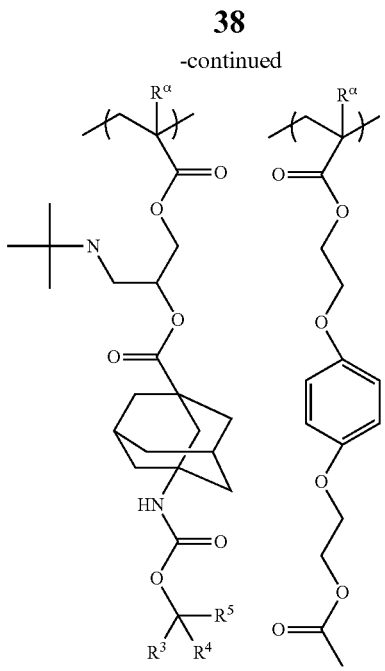
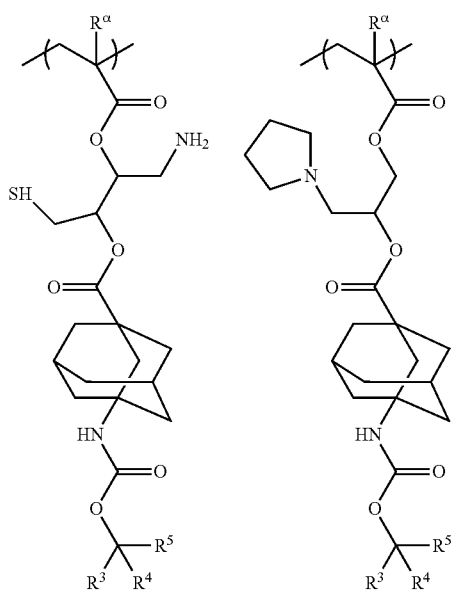
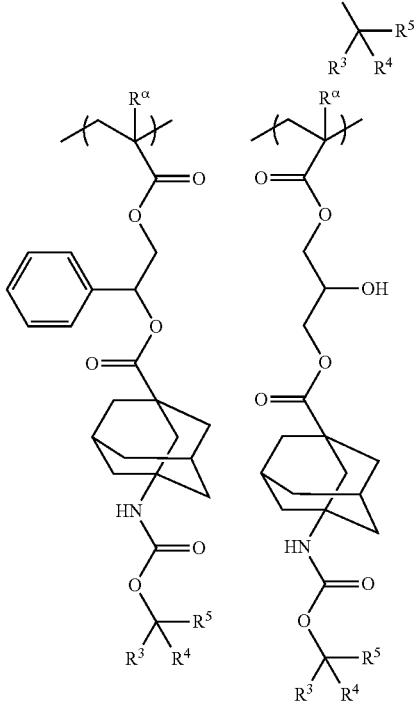

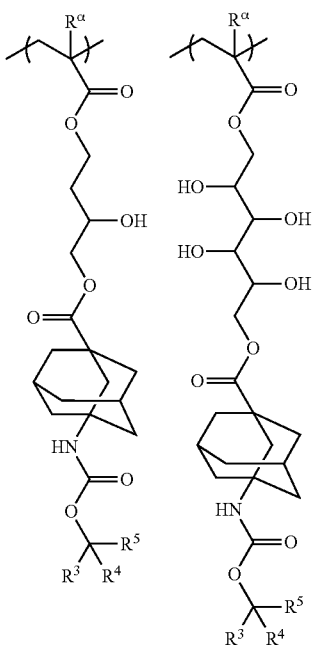
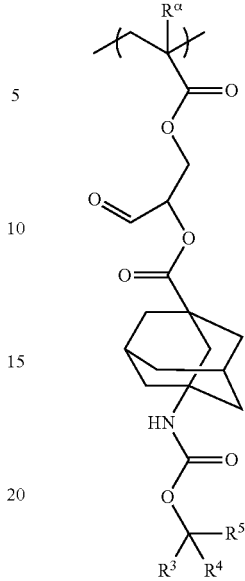
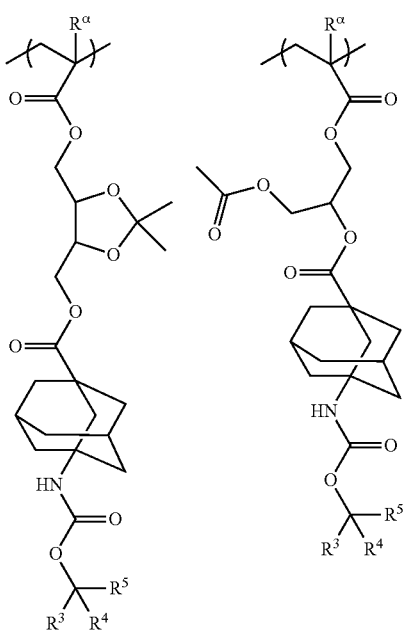

As the structural unit (a5) contained in the component (A1), one type of structural unit may be used, or two or more types may be used.

In the component (A1), the amount of the structural unit (a5) based on the combined total of all structural units constituting the component (A1) is preferably 1 to 50 mol %, more preferably 1 to 30 mol %, and still more preferably 1 to 20 mol %.

When the amount of the structural unit (a5) is at least as large as the lower limit of the above-mentioned range, the film retention properties at exposed portions of the resist film become excellent, and the resolution and the shape of resist pattern to be formed become excellent. On the other hand, when the amount of the structural unit (a5) is no more than the upper limit of the above-mentioned range, a good balance can be achieved with the other structural units. Also, the transparency of the resist film after exposure is enhanced.

When the component (A) is composed of a resin component, the amount of the structural unit (a5) based on the combined total of all structural units constituting the component (A) is preferably 0.5 to 50 mol %, more preferably 0.5 to 30 mol %, and still more preferably 0.5 to 20 mol %. When the amount of the structural unit (a5) is within the above-mentioned range, the film retention properties at exposed portions of the resist film become excellent, and the resolution and the shape of resist pattern to be formed become excellent.

When the component (A) is composed of a resin component and a component other than the resin component (such as low molecular compound), the amount of the structural unit (a5) based on the combined total of all structural units constituting the component (A) is preferably 0.5 to 50 mol %, more preferably 0.5 to 40 mol %, and still more preferably 0.5 to 30 mol %.

[Structural Unit (a1)]

The structural unit (a1) is a structural unit containing an acid decomposable group which exhibits increased polarity by the action of acid.

The term "acid decomposable group" refers to a group in which at least a part of the bond within the structure thereof is cleaved by the action of acid.

Examples of acid decomposable groups which exhibit increased polarity by the action of acid include groups which are decomposed by the action of acid to form a polar group.

Examples of the polar group include a carboxy group, a hydroxy group, an amino group and a sulfo group (—SO$_3$H). Among these, a polar group containing —OH in the structure thereof (hereafter, referred to as "OH-containing polar group") is preferable, a carboxy group or a hydroxy group is more preferable, and a carboxy group is particularly desirable.

Specific examples of an acid decomposable group include a group in which the aforementioned polar group has been protected with an acid dissociable group (such as a group in which the hydrogen atom of the OH-containing polar group has been protected with an acid dissociable group) can be given.

An "acid dissociable group" is a group in which exhibits acid dissociable properties that at least a bond between an acid dissociable group and an atom adjacent to the acid dissociable group is cleaved by the action of acid. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. When the polarity of the component (A1) is increased, the solubility of the component (A1) in a developing solution is relatively changed. When an alkali developing solution is used, the solubility of the component (A1) in the alkali developing solution is increased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula —C(R$^{71}$)(R$^{72}$)(R$^{73}$) can be given. In the formula, each of R$^{71}$ to R$^{73}$ independently represents a linear alkyl group of 1 to 5 carbon atoms. The group represented by the formula —C(R$^{71}$)(R$^{72}$)(R$^{73}$) preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon atom and hydrogen atom (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group is bonded, an alkyl group can be mentioned. Examples of the alkyl group include the same groups as those represented by R$^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 11]

(1-1) 

(1-2) 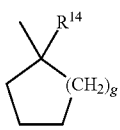

(1-3) 

(1-4) 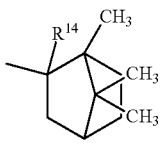

(1-5) 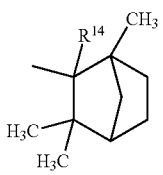

(1-6) 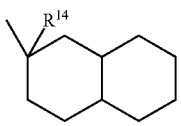

(1-7) 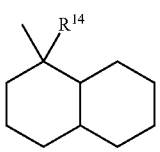

(1-8) 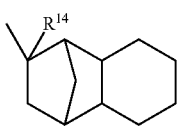

(1-9) 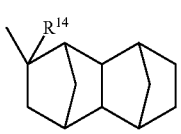

In the formulas above, $R^{14}$ represents an alkyl group; and g represents an integer of 0 to 8.

[Chemical Formula 12]

(2-1) 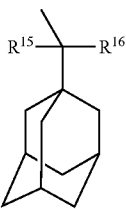

(2-2) 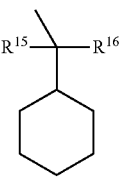

(2-3) 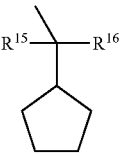

(2-4) 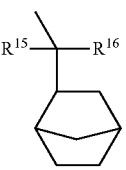

(2-5) 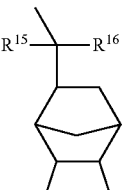

(2-6) 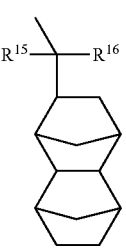

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is most desirable.

g is preferably an integer of 0 to 3, more preferably 1 to 3, and still more preferably 1 or 2.

In formulas (2-1) to (2-6), as the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxy group, so as to be bonded with an oxygen atom. The acid acts to break the bond between the acetal-type acid dissociable group and the oxygen atom to which the acetal-type, acid dissociable group is bonded, thereby forming an OH-containing polar group such as a carboxy group or a hydroxy group.

Examples of acetal-type acid dissociable groups include groups represented by general formula (p1) shown below.

[Chemical Formula 13]

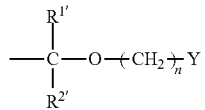

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

Examples of the alkyl group for $R^{1'}$ and $R^{2'}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is most preferable.

In the present invention, it is preferable that at least one of $R^{1'}$ and $R^{2'}$ be a hydrogen atom. That is, it is preferable that the acid dissociable group (p1) is a group represented by general formula (p1-1) shown below.

[Chemical Formula 14]

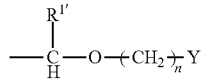

(p1-1)

In the formula, $R^{1'}$, n and Y are the same as defined above.

Examples of the alkyl group of 1 to 5 carbon atoms for Y include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 15]

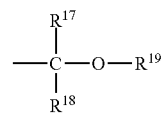

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the $R^{17}$ group is bonded to the $R^{19}$ group to form a ring.

The alkyl group for $R^{17}$ and $R^{18}$ preferably has 1 to 15 carbon atoms, and may be either linear or branched. As the alkyl group, a methyl group or an ethyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably a methyl group or an ethyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the $R^{19}$ group may be bonded to the $R^{17}$ group.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

Examples of the structural unit (a1) include a structural unit which derived from an acrylate ester which may have the hydrogen atom bonded to the carbon atom on the α-position substituted with a substituent and contains an acid decomposable group which exhibits increased polarity by the action of acid; a structural unit in which at least a part of the hydrogen atoms of the phenolic hydroxy group in a structural unit derived from a hydroxystyrene or hydroxystyrene derivatives has been protected with a substituent containing an acid decomposable group; and a structural unit in which at least a part of the hydrogen atom of —C(=O)—OH in a structural unit derived from a vinylbenzoic acid or vinylbenzoic acid derivatives has been protected with a substituent containing an acid decomposable group. Preferable examples of the acid decomposable group include the aforementioned tertiary alkyl ester-type acid dissociable groups and acetal-type acid dissociable groups.

In the present descriptions and the claims, the expression "structural unit derived from hydroxystyrene or hydroxystyrene derivatives" refers to a structural unit that is formed by the cleavage of the ethylenic double bond of hydroxystyrene and hydroxystyrene derivatives.

The term "hydroxystyrene derivatives" includes compounds in which the hydrogen atom at the α-position of a hydroxystyrene has been substituted with another substituent such as an alkyl group and a halogenated alkyl group, and derivatives thereof. A carbon atom on the α-position refers to the carbon atom bonded to the benzene ring, unless specified otherwise.

A "structural unit derived from a vinylbenzoic acid or vinylbenzoic acid derivatives" refers to a structural unit that is formed by the cleavage of the ethylenic double bond of a vinylbenzoic acid or derivative thereof.

The term "vinylbenzoic acid derivatives" includes compounds in which the hydrogen atom at the α-position of a vinylbenzoic acid has been substituted with another substituent such as an alkyl group and a halogenated alkyl group, and derivatives thereof. A carbon atom on the α-position refers to the carbon atom bonded to the benzene ring, unless specified otherwise.

In particular, as the structural unit (a1), a structural unit derived from an acrylate ester which may have the hydrogen atom bonded to the carbon atom on the α-position substituted with a substituent is preferred.

Specific examples of the structural unit (a1) include a structural unit represented by general formula (a1-0-1) shown below and a structural unit represented by general formula (a1-0-2) shown below.

[Chemical Formula 16]

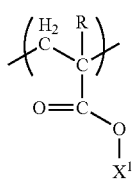

(a1-0-1)

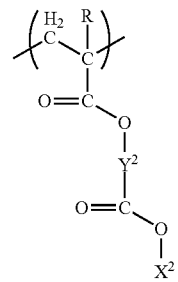

(a1-0-2)

In the formulas, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In the general formula (a1-0-1), examples of the alkyl group of 1 to 5 carbon atoms for R include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which part or all of the hydrogen atoms of the aforementioned alkyl group of 1 to 5 carbon atoms are substituted with halogen atoms. Examples of the halogen atom include a fluorine atom, a chlorine atom, a bromine atom and an iodine atom, and a fluorine atom is particularly preferred.

R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.

$X^2$ is the same as defined above for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

Examples of the divalent linking group for $Y^2$ include the same divalent linking groups as those described above for $R^1$ in the formula (a5-1).

As the divalent linking group for $Y^2$, a linear or branched alkylene group, a divalent alicyclic hydrocarbon group or a divalent linking group containing a hetero atom is preferable. Among these, a linear or branched alkylene group or a divalent linking group containing a hetero atom is more preferable.

Specific examples of the structural unit (a1) include structural units represented by general formulas (a1-1) to (a1-4) shown below.

[Chemical Formula 17]

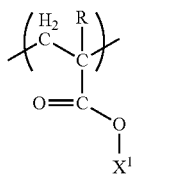
(a1-1)

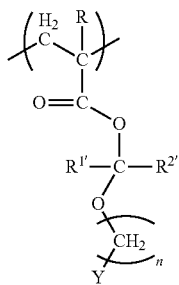
(a1-2)

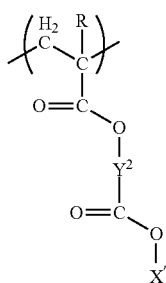
(a1-3)

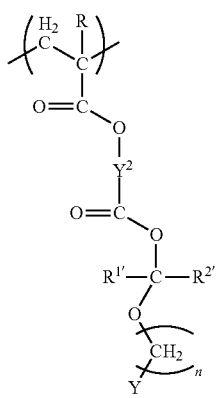
(a1-4)

In the formulas, R, $R^{1'}$, $R^{2'}$, n, Y and $Y^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1'}$, $R^{2'}$, n and Y are respectively the same as defined for $R^{1'}$, $R^{2'}$, n and Y in the general formula (p1) described above in connection with the "acetal-type acid dissociable group".

$Y^2$ is the same as defined for $Y^2$ in general formula (a1-0-2).

Specific examples of structural units represented by general formulas (a1-1) to (a1-4) are shown below.

In the formulas shown below, $R^\alpha$ represents a hydrogen atom, a methyl group or a trifluoromethyl group.

[Chemical Formula 18]

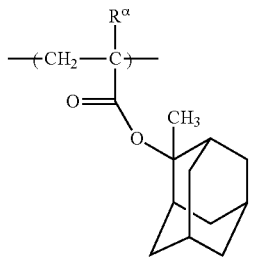
(a1-1-1)

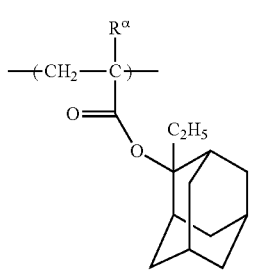
(a1-1-2)

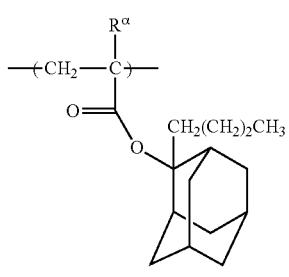
(a1-1-3)

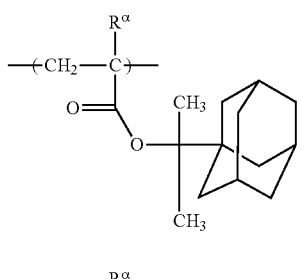
(a1-1-4)

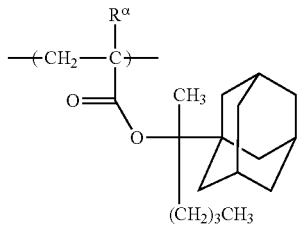
(a1-1-5)

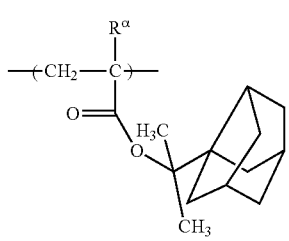
(a1-1-6)

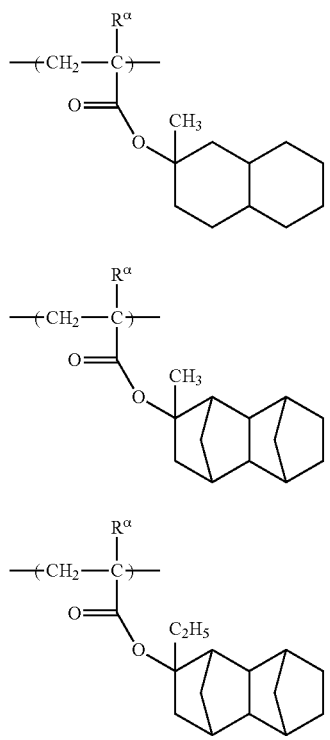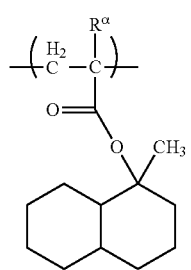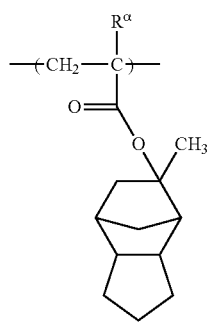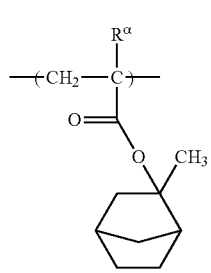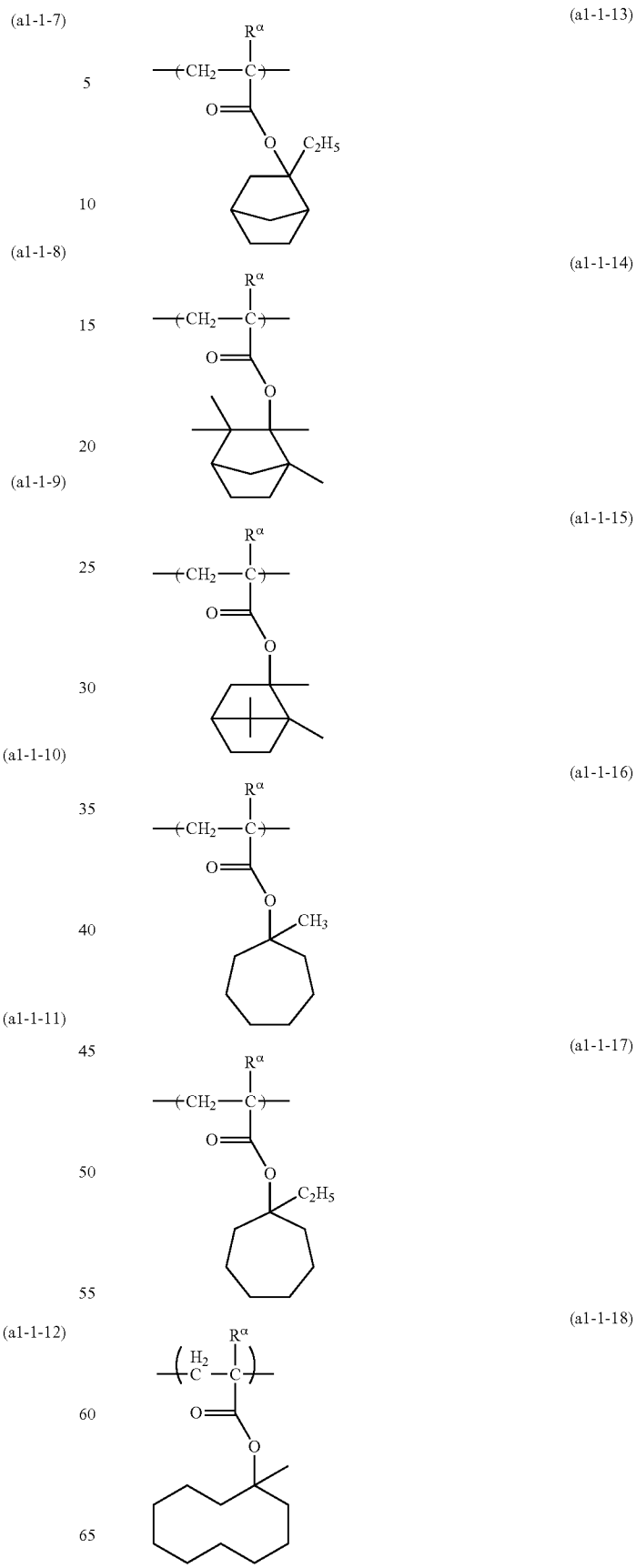

(a1-1-19) 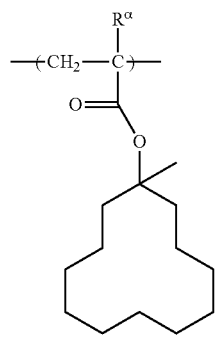
(a1-1-20) 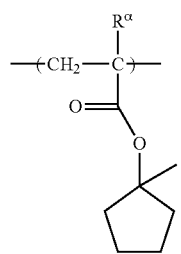
(a1-1-21) 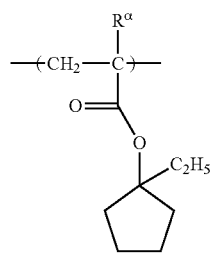
[Chemical Formula 20]
(a1-1-22) 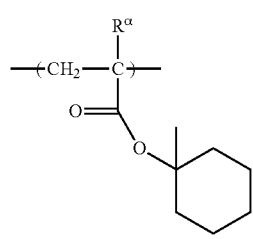
(a1-1-23) 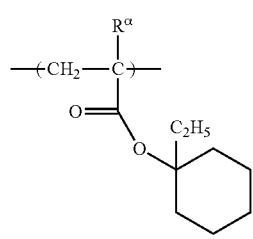
(a1-1-24) 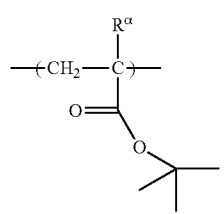
(a1-1-25) 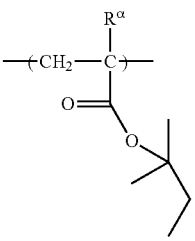
(a1-1-26) 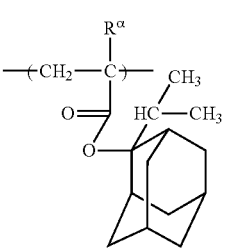
(a1-1-27) 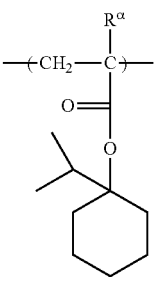
(a1-1-28) 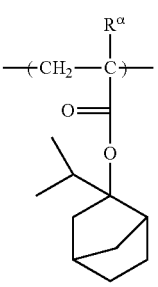
(a1-1-29) 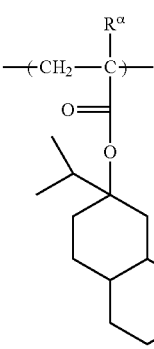

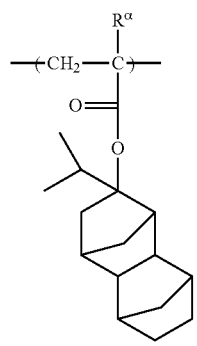 (a1-1-30)
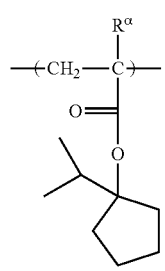 (a1-1-31)
(a1-1-32)
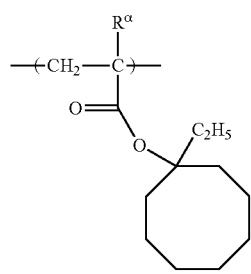 (a1-1-33)
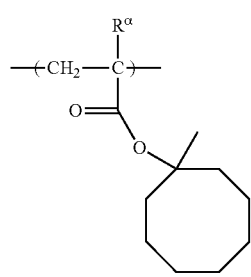 (a1-1-34)
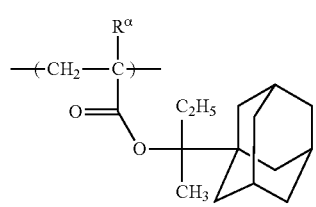 (a1-1-35)
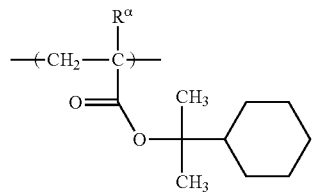 (a1-1-36)
[Chemical Formula 21]
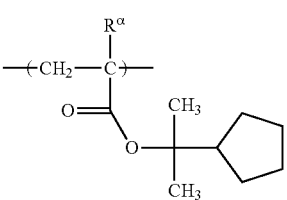 (a1-2-1)
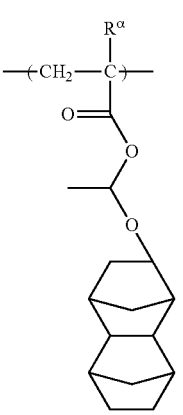 (a1-2-2)
(a1-2-3)

(a1-2-4)
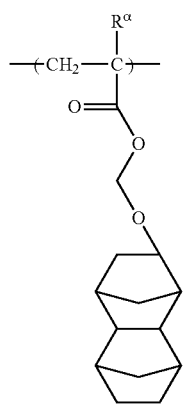
(a1-2-5)
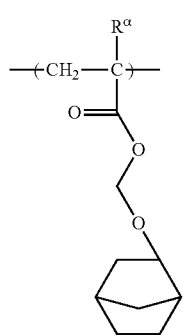
(a1-2-6)
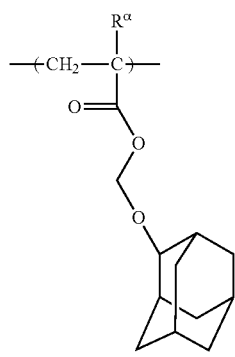
(a1-2-7)
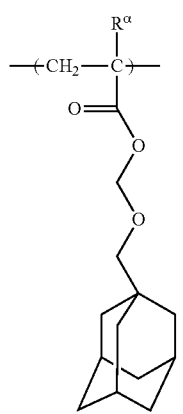
(a1-2-8)
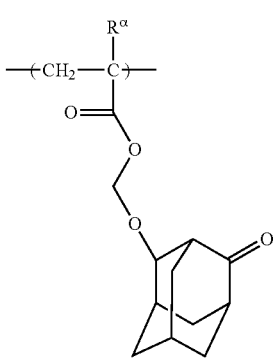
(a1-2-9)
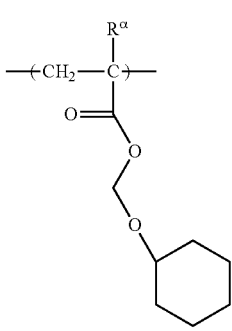
(a1-2-10)
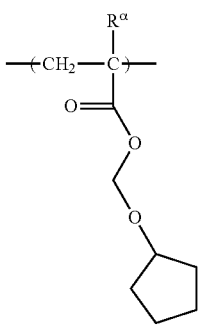
(a1-2-11)
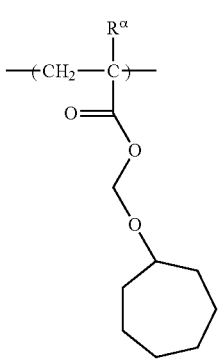

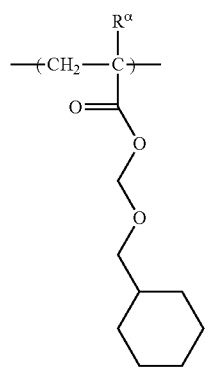 (a1-2-12)
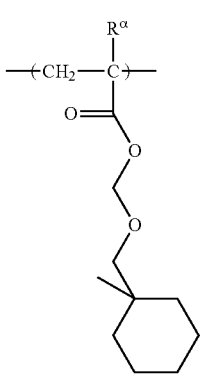 (a1-2-16)
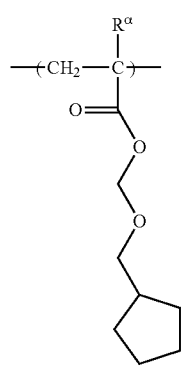 (a1-2-13)
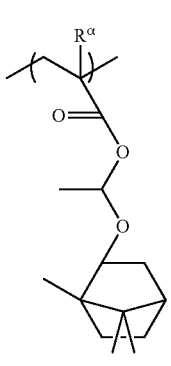 (a1-2-17)
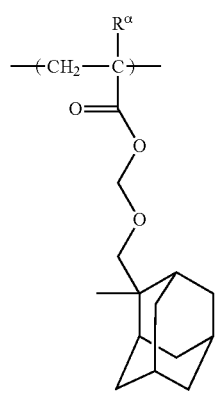 (a1-2-14)
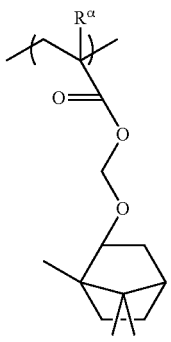 (a1-2-18)
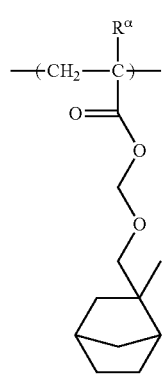 (a1-2-15)
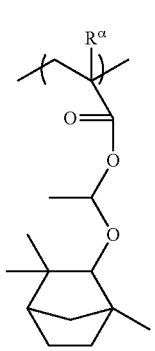 (a1-2-19)

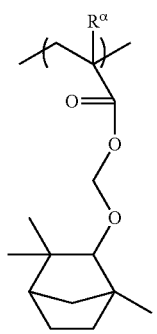 (a1-2-20)
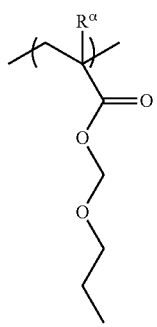 (a1-2-24)
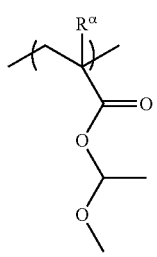 (a1-2-21)
[Chemical Formula 22]
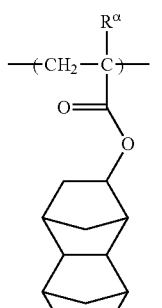 (a1-3-1)
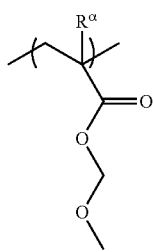 (a1-2-22)
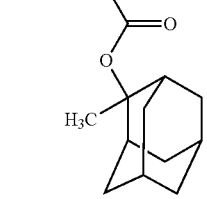
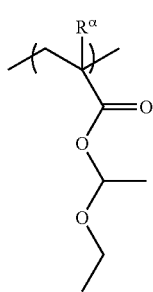 (a1-2-23)
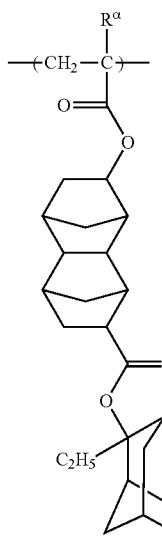 (a1-3-2)

(a1-3-3)
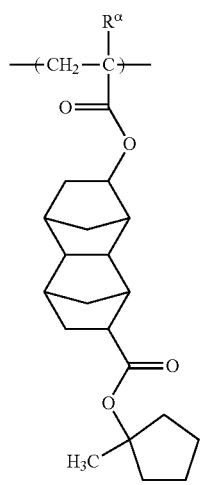
(a1-3-4)
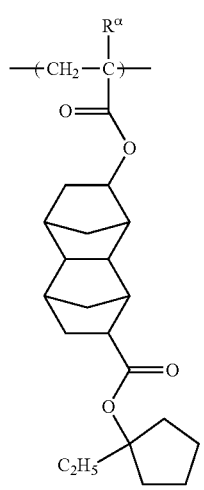
(a1-3-5)
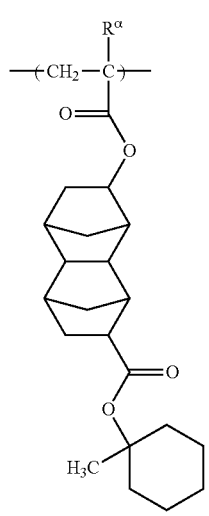
(a1-3-6)
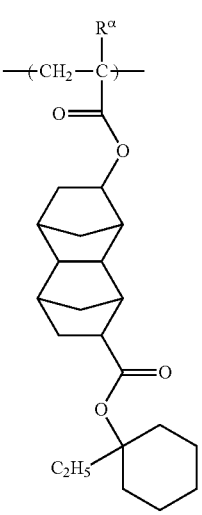
(a1-3-7)
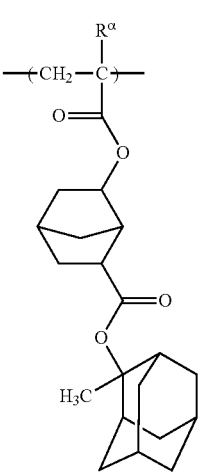
(a1-3-8)
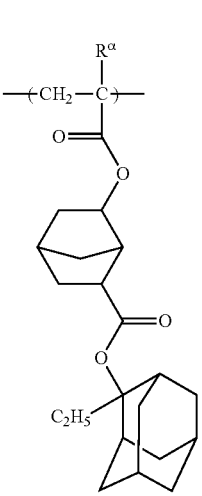

(a1-3-9)
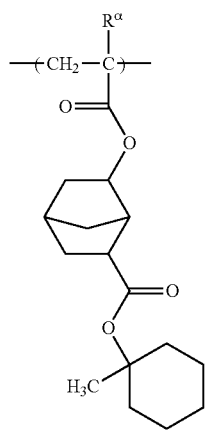
(a1-3-10)
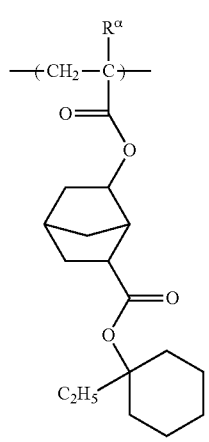
(a1-3-11)
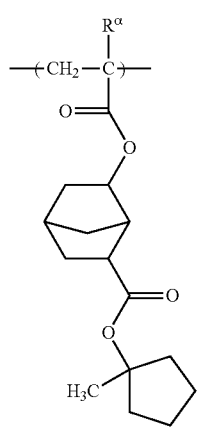
(a1-3-12)
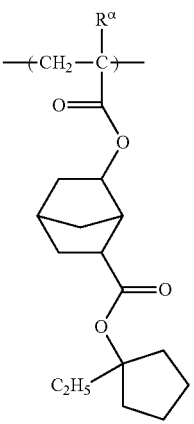
(a1-3-13)
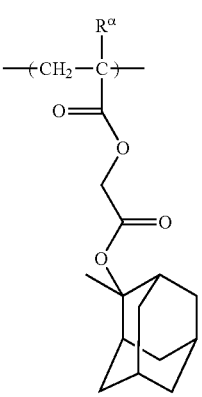
(a1-3-14)
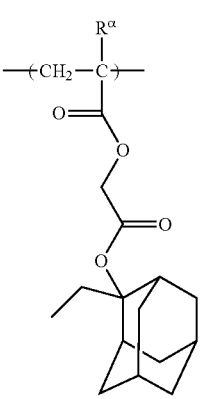
(a1-3-15)
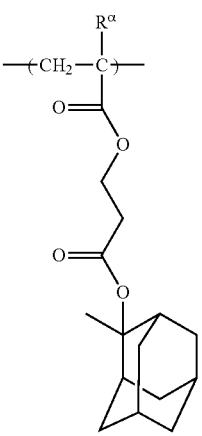

-continued
(a1-3-16)
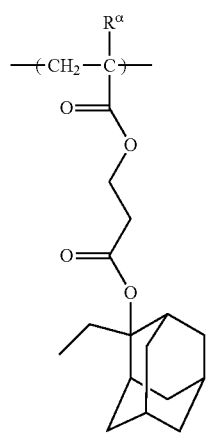
(a1-3-17)
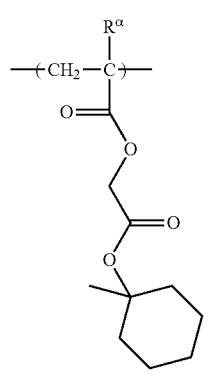
(a1-3-18)
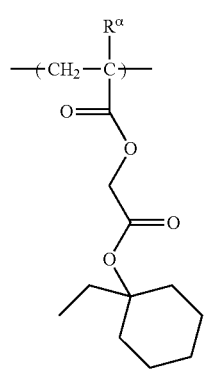
[Chemical Formula 23]
(a1-3-19)
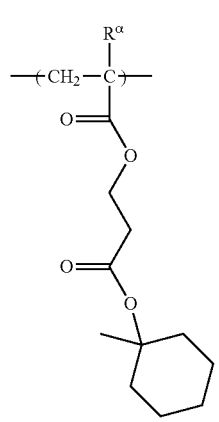
-continued
(a1-3-20)
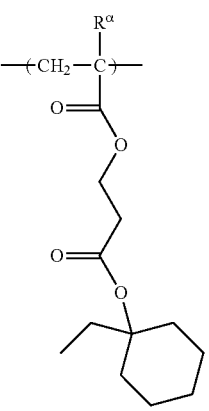
(a1-3-21)
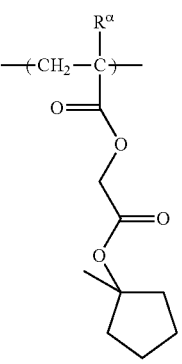
(a1-3-22)
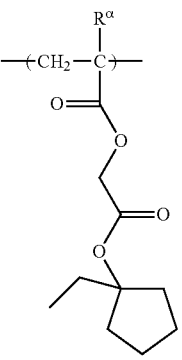
(a1-3-23)
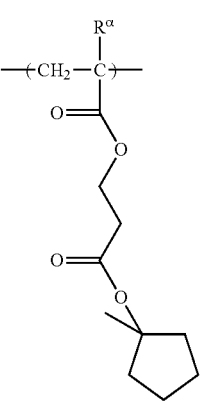

(a1-3-24)
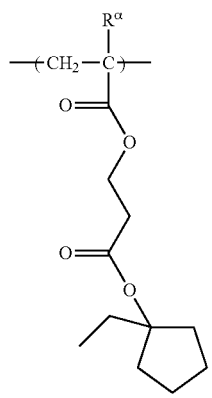
[Chemical Formula 24]
(a1-3-25)
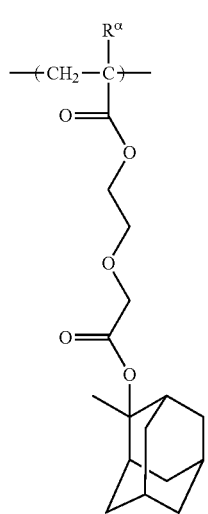
(a1-3-26)
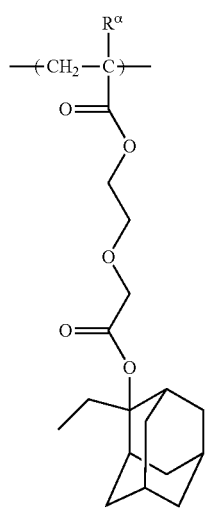
(a1-3-27)
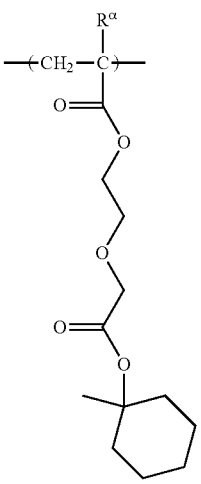
(a1-3-28)
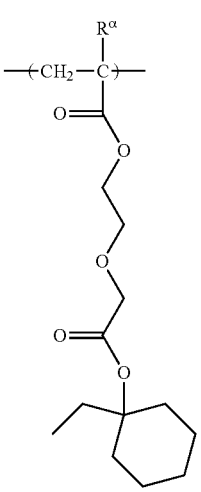
(a1-3-29)
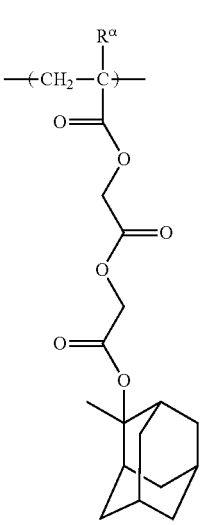

(a1-3-30)
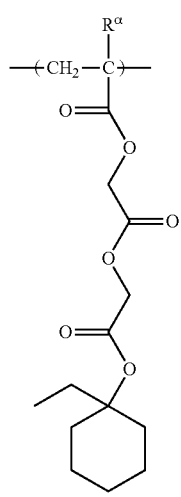
(a1-3-31)
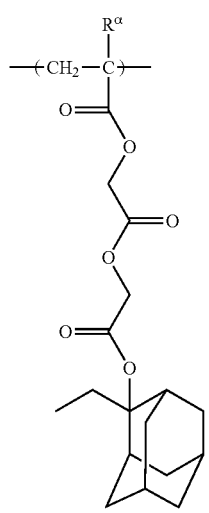
(a1-3-32)
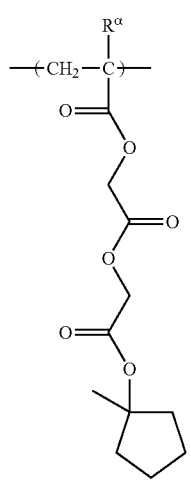
[Chemical Formula 25]
(a1-4-1)
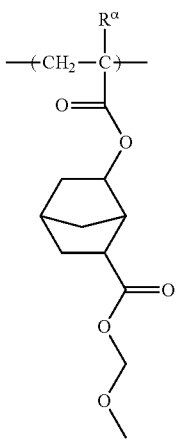
(a1-4-2)
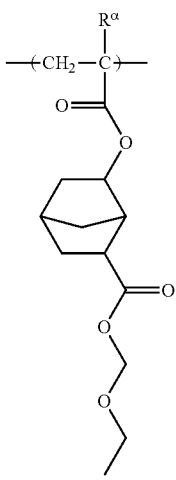
(a1-4-3)
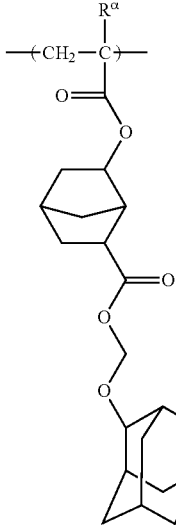

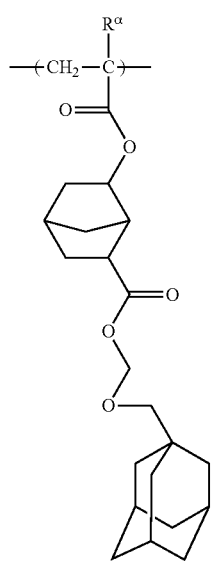 (a1-4-4)
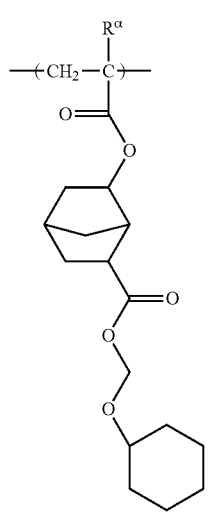 (a1-4-5)
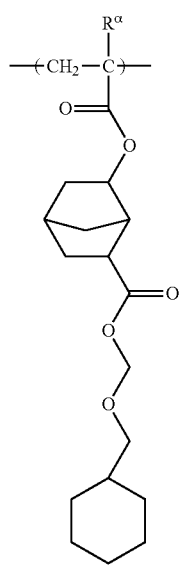 (a1-4-6)
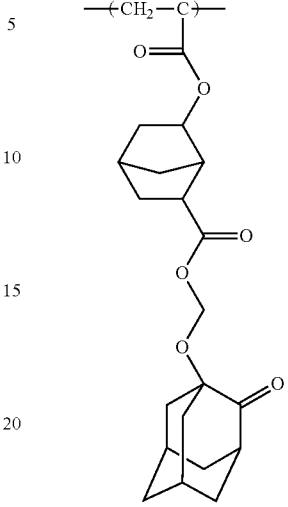 (a1-4-7)
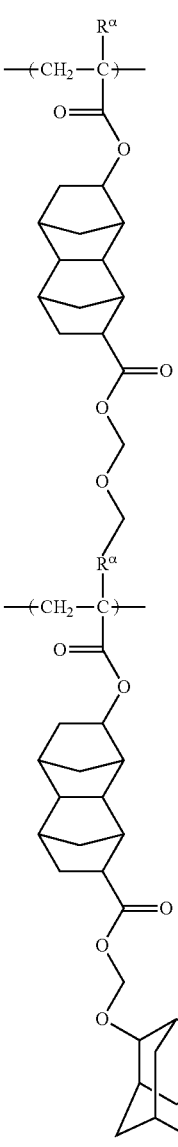 (a1-4-8)
(a1-4-9)

(a1-4-10)
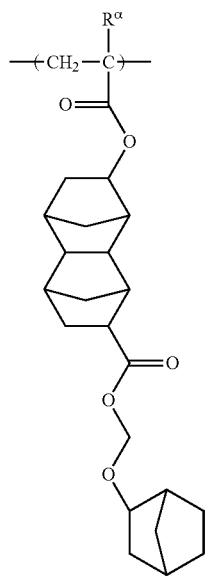
(a1-4-11)
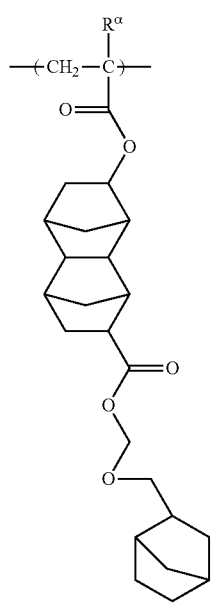
(a1-4-12)
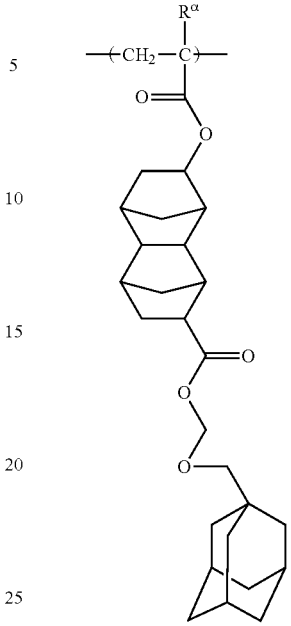
(a1-4-13)
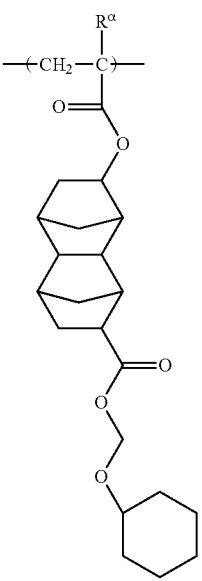

-continued (a1-4-14)

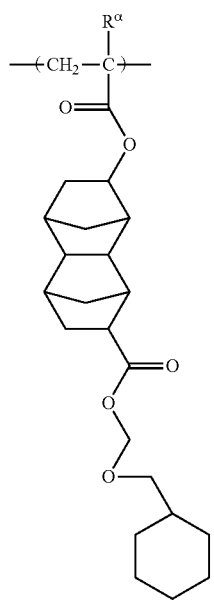

(a1-4-15)

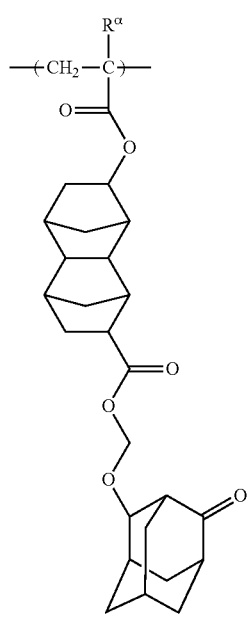

[Chemical Formula 26]

(a1-0-11)

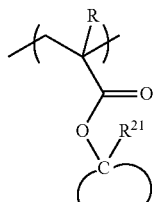

(a1-0-12)

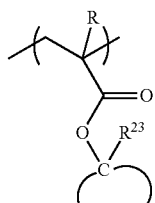

(a1-0-13)

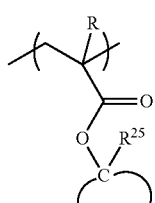

(a1-0-14)

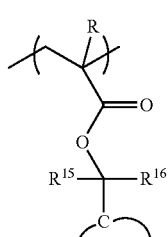

(a1-0-15)

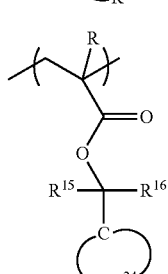

(a1-0-2)

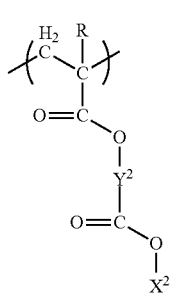

In the present invention, as the structural unit (a1), it is preferable to include at least one structural unit selected from the group consisting of a structural unit represented by general formula (a1-0-11) shown below, a structural unit represented by general formula (a1-0-12) shown below, a structural unit represented by general formula (a1-0-13) shown below, a structural unit represented by general formula (a1-0-14) shown below, a structural unit represented by general formula (a1-0-15) shown below and a structural unit represented by general formula (a1-0-2) shown below.

It is particularly desirable that the structural unit (a1) include at least one member selected from the group consisting of a structural unit represented by general formula (a1-0-11) shown below, a structural unit represented by general formula (a1-0-12) shown below and a structural unit represented by general formula (a1-0-13) shown below.

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom having $R^{22}$ bonded thereto; $R^{23}$ represents a branched alkyl group; $R^{24}$ represents a group which forms an aliphatic polycyclic group with the carbon atom having $R^{24}$ bonded thereto; $R^{25}$ represents a linear alkyl group of 1 to 5 carbon atoms; each of $R^{15}$ and $R^{16}$ independently represents an alkyl group; $Y^2$ represents a divalent linking group; and $X^2$ represents an acid dissociable group.

In the formulas, R, $Y^2$ and $X^2$ are the same as defined above.

In general formula (a1-0-11), as the alkyl group for $R^{21}$, the same alkyl groups as those described above for $R^{14}$ in formulas (1-1) to (1-9) can be used, and a methyl group, an ethyl group or an isopropyl group can be preferably used.

As the aliphatic monocyclic group formed by $R^{22}$ and the carbon atom having $R^{22}$ bonded thereto, the same aliphatic cyclic groups as those described above in relation to the aforementioned tertiary alkyl ester-type acid dissociable group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and particularly preferably a 5- or 6-membered ring.

The monocycloalkane may or may not have part of the carbon atoms constituting the ring replaced with an ether bond (—O—).

Further, the monocycloalkane may have a substituent such as an alkyl group of 1 to 5 carbon atoms, a fluorine atom or a fluorinated alkyl group of 1 to 5 carbon atoms.

As an examples of $R^{22}$ constituting such an aliphatic monocyclic group, a linear alkylene group which may have an ether bond (—O—) interposed between the carbon atoms can be given.

Specific examples of structural units represented by general formula (a1-0-11) include structural units represented by the aforementioned formulas (a1-1-16) to (a1-1-23), (a1-1-27) and (a1-1-31). Among these, structural units represented by general formula (a1-1-02) shown below which includes the structural units represented by the aforementioned formulas (a1-1-16), (a1-1-17), (a1-1-20) to (a1-1-23), (a1-1-27), (a1-1-31), (a1-1-32) and (a1-1-33) are preferable. Further, a structural unit represented by general formula (a1-1-02') shown below is also preferable.

In the formulas, h represents an integer of 1 to 4, and is preferably 1 or 2.

[Chemical Formula 27]

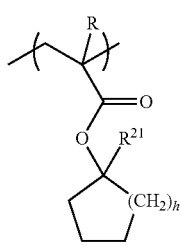
(a1-1-02)

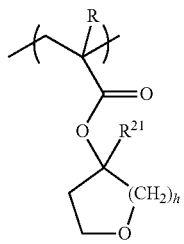
(a1-1-02')

In the formulas, R and $R^{21}$ are the same as defined above; and h represents an integer of 1 to 4.

In general formula (a1-0-12), as the branched alkyl group for $R^{23}$, the same alkyl groups as those described above for $R^{14}$ which are branched in the formulas (1-1) to (1-9) can be used, and an isopropyl group is particularly desirable.

As the aliphatic polycyclic group formed by $R^{24}$ and the carbon atoms having $R^{24}$ bonded thereto, the same aliphatic cyclic groups as those described above in relation to the aforementioned tertiary alkyl ester-type acid dissociable group and which are polycyclic can be used.

Specific examples of structural units represented by general formula (a1-0-12) include structural units represented by the aforementioned formulas (a1-1-26) and (a1-1-28) to (a1-1-30).

As the structural unit (a1-0-12), a structural unit in which the aliphatic polycyclic group formed by $R^{24}$ and the carbon atom having $R^{24}$ bonded thereto is a 2-adamantyl group is preferable, and a structural unit represented by the aforementioned formula (a1-1-26) is particularly desirable.

In general formula (a1-0-13), R and $R^{24}$ are the same as defined above.

As the linear alkyl group for $R^{25}$, the same linear alkyl groups as those described above for $R^{14}$ in the aforementioned formulas (1-1) to (1-9) can be mentioned, and a methyl group or an ethyl group is particularly desirable.

Specific examples of structural units represented by general formula (a1-0-13) include structural units represented by the aforementioned formulas (a1-1-1), (a1-1-2) and (a1-1-7) to (a1-1-15) exemplified as specific examples of the structural unit represented by general formula (a1-1).

As the structural unit (a1-0-13), a structural unit in which the aliphatic polycyclic group formed by $R^{24}$ and the carbon atom having $R^{24}$ bonded thereto is a 2-adamantyl group is preferable, and a structural unit represented by the aforementioned formula (a1-1-1) or (a1-1-2) is particularly desirable.

In general formula (a1-0-14), R and $R^{22}$ are the same as defined above. $R^{15}$ and $R^{16}$ are the same as defined for $R^{15}$ and $R^{16}$ in the general formulas (2-1) to (2-6).

Specific examples of structural units represented by general formula (a1-0-14) include structural units represented by the aforementioned formulas (a1-1-35) and (a1-1-36) exemplified as specific examples of the structural unit represented by general formula (a1-1).

In general formula (a1-0-15), R and $R^{24}$ are the same as defined above. $R^{15}$ and $R^{16}$ are the same as defined for $R^{15}$ and $R^{16}$ in the general formulas (2-1) to (2-6).

Specific examples of structural units represented by general formula (a1-0-15) include structural units represented by the aforementioned formulas (a1-1-4) to (a1-1-6) and (a1-1-34) exemplified as specific examples of the structural unit represented by general formula (a1-1).

Examples of structural units represented by general formula (a1-0-2) include structural units represented by the aforementioned formulas (a1-3) and (a1-4), and the structural unit represented by the formula (a1-3) is particularly preferable.

As the structural unit represented by general formula (a1-0-2), a structural unit in which $Y^2$ is a group represented by the aforementioned formula $—Y^{21}—O—Y^{22}—$ or $—Y^{21}—C(=O)—Y^{22}—$ is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 28]

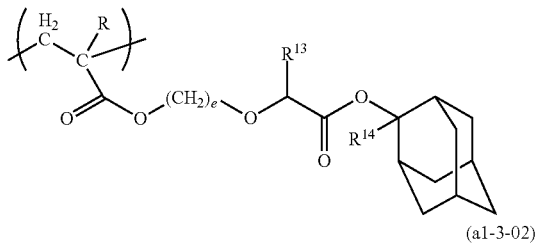

(a1-3-01)

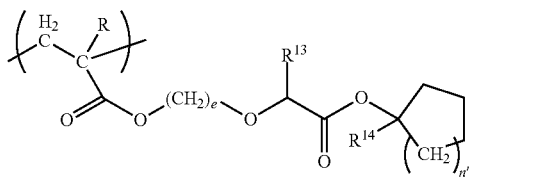

(a1-3-02)

In the formulas, R is the same as defined above; $R^{13}$ represents a hydrogen atom or a methyl group; $R^{14}$ represents an alkyl group; e represents an integer of 1 to 10; and n' represents an integer of 0 to 3.

[Chemical Formula 29]

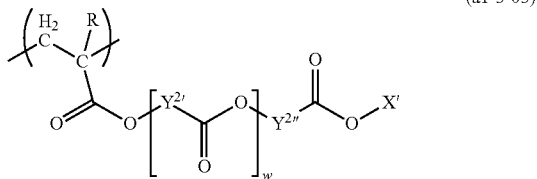

(a1-3-03)

In the formula, R is as defined above; each of $Y^{2'}$ and $Y^{2''}$ independently represents a divalent linking group; X' represents an acid dissociable group; and w represents an integer of 0 to 3.

In general formulas (a1-3-01) and (a1-3-02), $R^{13}$ is preferably a hydrogen atom.

$R^{14}$ is the same as defined for $R^{14}$ in the aforementioned formulas (1-1) to (1-9).

e is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group (i) in which a substituent is bonded to the carbon atom to which an atom adjacent to the acid dissociable group is bonded, on the ring skeleton to form a tertiary carbon atom. Among these, a group represented by the aforementioned general formula (1-1) is particularly desirable.

w represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable, and a structural unit represented by general formula (a1-3-03-1) is particularly desirable.

[Chemical Formula 30]

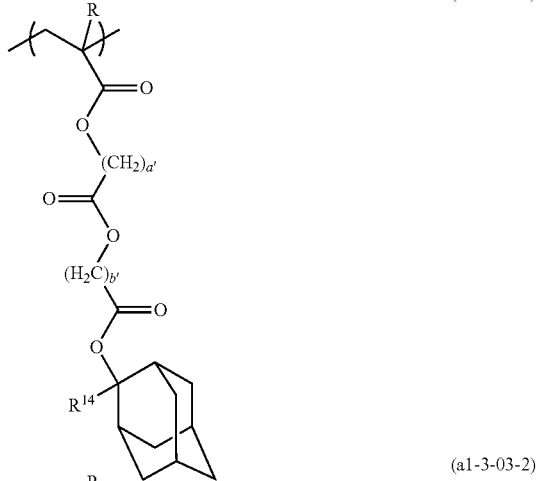

(a1-3-03-1)

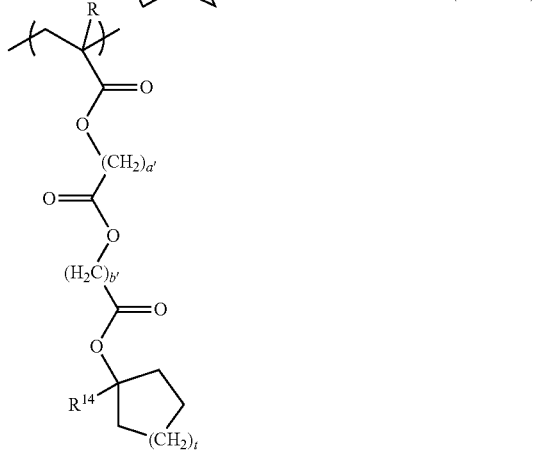

(a1-3-03-2)

In the formulas, R and R$^{14}$ are the same as defined above; a' represents an integer of 1 to 10; b' represents an integer of 1 to 10; and t represents an integer of 0 to 3.

In general formulas (a1-3-03-1) and (a1-3-03-2), a' is the same as defined above, and is preferably an integer of 1 to 8, more preferably 1 to 5, and particularly preferably 1 or 2.

b' is the same as defined above and is preferably an integer of 1 to 8, particularly preferably 1 to 5, and most preferably 1 or 2.

t is preferably an integer of 1 to 3, and particularly preferably 1 or 2.

Specific examples of structural units represented by general formula (a1-3-03-1) or (a1-3-03-2) include structural units represented by the aforementioned formulas (a1-3-29) to (a1-3-32).

As the structural unit (a1) contained in the component (A1), one type of structural unit may be used, or two or more types may be used.

In the component (A1), the amount of the structural unit (a1) based on the combined total of all structural units constituting the component (A1) is preferably 15 to 70 mol %, more preferably 15 to 60 mol %, and still more preferably 20 to 55 mol %.

When the amount of the structural unit (a1) is at least as large as the lower limit of the above-mentioned range, a pattern can be easily formed using a resist composition containing the component (A1), and various lithography properties such as sensitivity, resolution, LWR and the like are improved. On the other hand, when the amount of the structural unit (a1) is no more than the upper limit of the above-mentioned range, a good balance can be achieved with the other structural units.

[Structural Unit (a2)]

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C(═O)— structure (lactone ring). The term "lactone ring" refers to a single ring containing a —O—C(═O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water (in particular, in the case of an alkali developing process).

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 31]

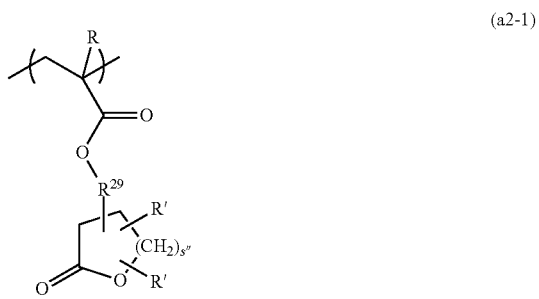

(a2-1)

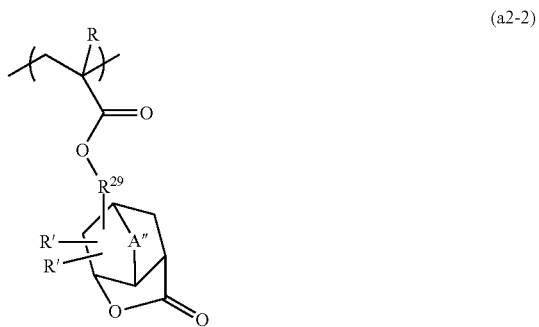

(a2-2)

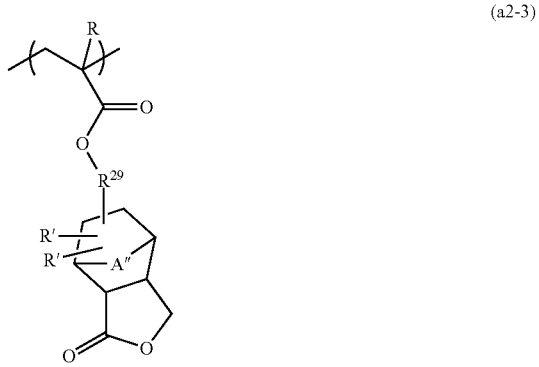

(a2-3)

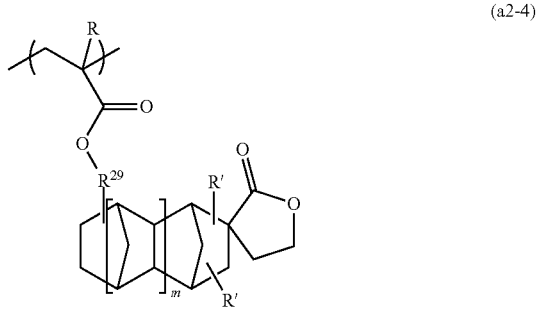

(a2-4)

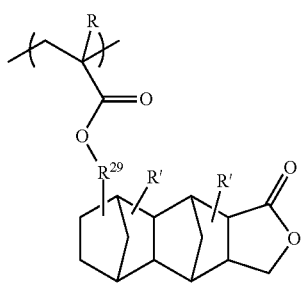

(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group, an alkoxy group, a halogen atom, a halogenated alkyl group, a hydroxy group, an oxygen atom (=O), —COOR", —OC(=O)R", a hydroxyalkyl group, or a cyano group, wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as R in the structural unit (a1).

The alkyl group for R' is preferably an alkyl group of 1 to 6 carbon atoms. Further, the alkyl group is preferably a linear alkyl group or a branched alkyl group. Specific examples include a methyl group, ethyl group, propyl group, isopropyl group, n-butyl group, isobutyl group, tert-butyl group, pentyl group, isopentyl group, neopentyl group and hexyl group. Among these examples, a methyl group or an ethyl group is preferable, and a methyl group is particularly desirable.

The alkoxy group for R' is preferably an alkoxy group of 1 to 6 carbon atoms. Further, the alkoxy group is preferably a linear alkoxy group or a branched alkoxy group. Specific examples of the alkoxy groups include the aforementioned alkyl groups for the substituent having an oxygen atom (—O—) bonded thereto.

Examples of the halogen atom for R' include a fluorine atom, a chlorine atom, a bromine atom and an iodine atom, and a fluorine atom is preferable.

Examples of the halogenated alkyl group for R' include groups in which part or all of the hydrogen atoms within the aforementioned alkyl groups has been substituted with the aforementioned halogen atoms. As the halogenated alkyl group, a fluorinated alkyl group is preferable, and a perfluoroalkyl group is particularly desirable.

In the —COOR" group and the —OC(=O)R" group for R', R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for R' preferably has 1 to 6 carbon atoms, and specific examples thereof include the aforementioned alkyl groups for the substituent in which at least one hydrogen atom has been substituted with a hydroxy group.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $R^1$ in the formula (a5-1). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above in relation to the aliphatic hydrocarbon group for $Y^1$.

s" is preferably 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 32]

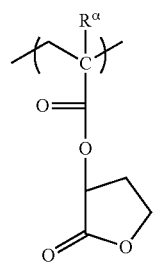

(a2-1-1)

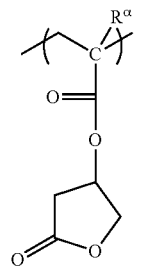

(a2-1-2)

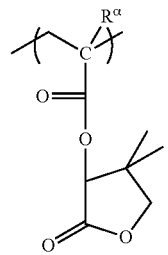

(a2-1-3)

(a2-1-4) 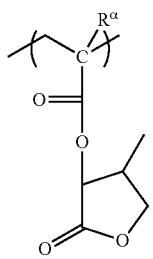
(a2-1-5) 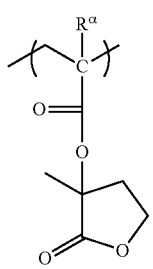
(a2-1-6) 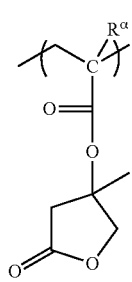
(a2-1-7) 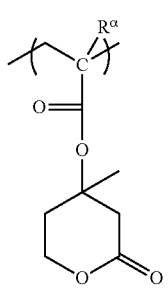
(a2-1-8) 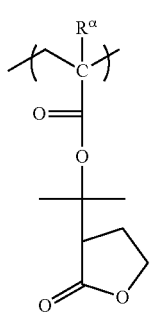
(a2-1-9) 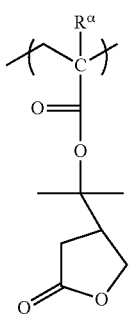
(a2-1-10) 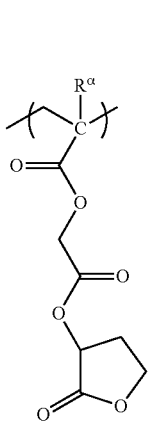
(a2-1-11) 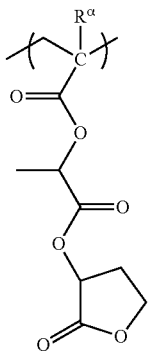
(a2-1-12) 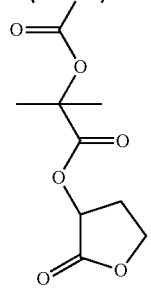

(a2-1-13)
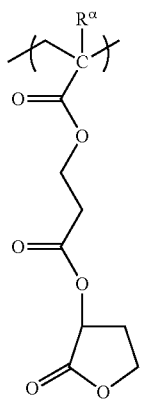
[Chemical Formula 33]
(a2-2-1)
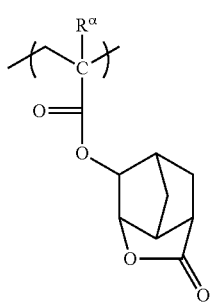
(a2-2-2)
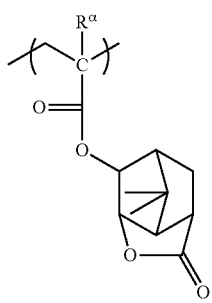
(a2-2-3)
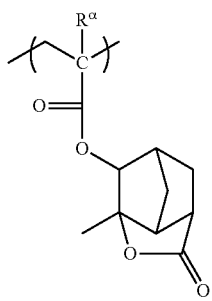
(a2-2-4)
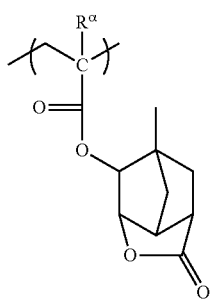
(a2-2-5)
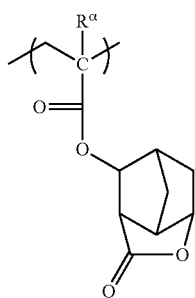
(a2-2-6)
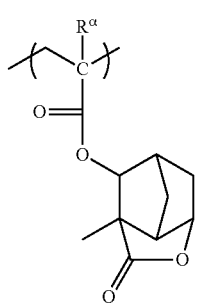
(a2-2-7)
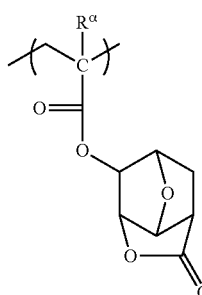
(a2-2-8)
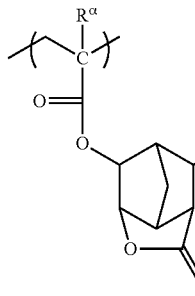
(a2-2-9)
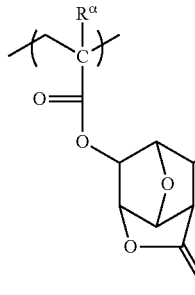

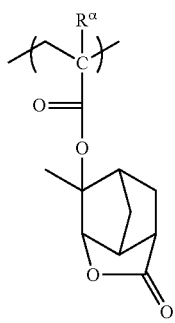 (a2-2-10)
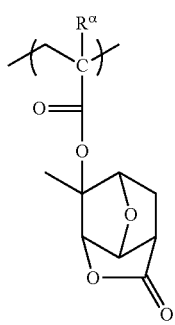 (a2-2-11)
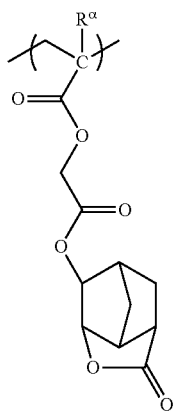 (a2-2-12)
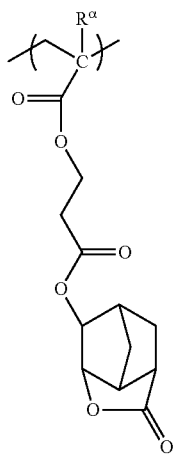 (a2-2-13)
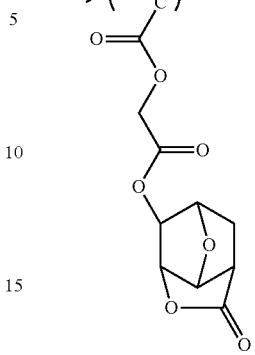 (a2-2-14)
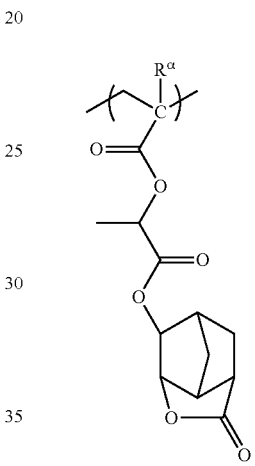 (a2-2-15)
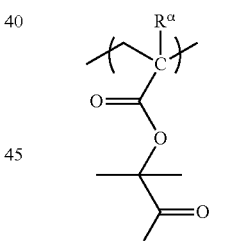 (a2-2-16)
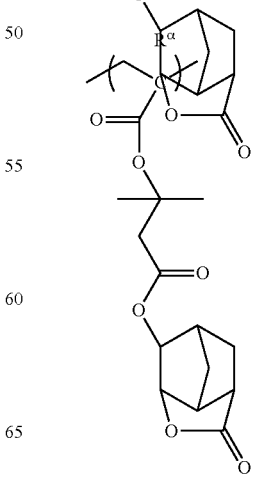 (a2-2-17)

[Chemical Formula 34]
(a2-3-1)
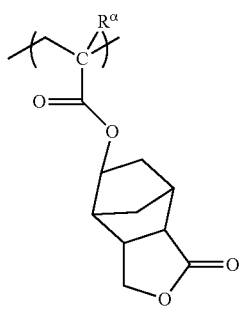
(a2-3-2)
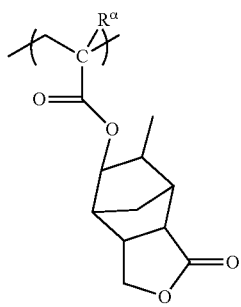
(a2-3-3)
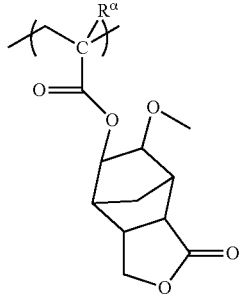
(a2-3-4)
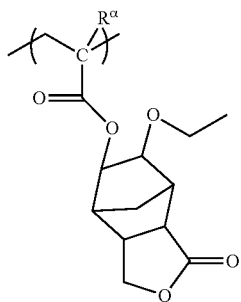
(a2-3-5)
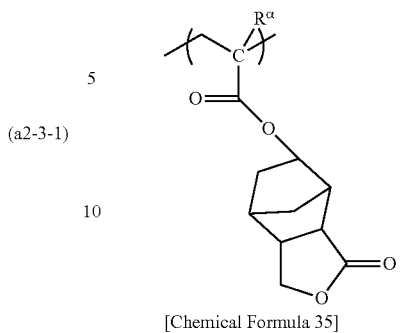
[Chemical Formula 35]
(a2-4-1)
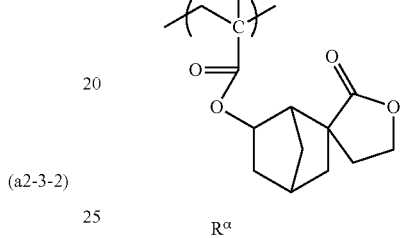
(a2-4-2)
(a2-4-3)
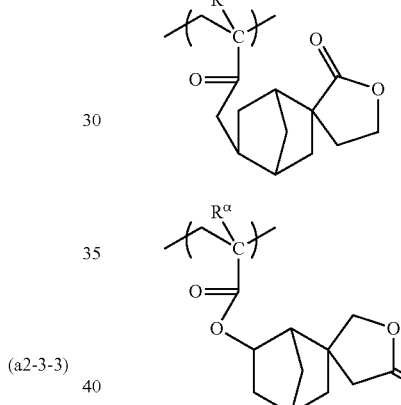
(a2-4-4)
(a2-4-5)
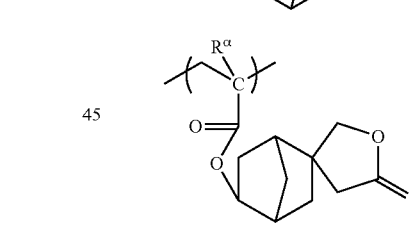
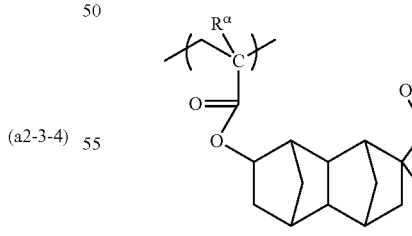
(a2-4-6)
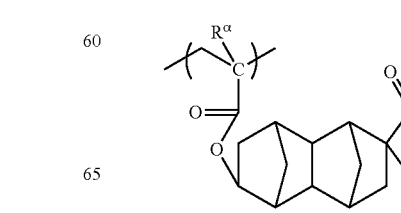

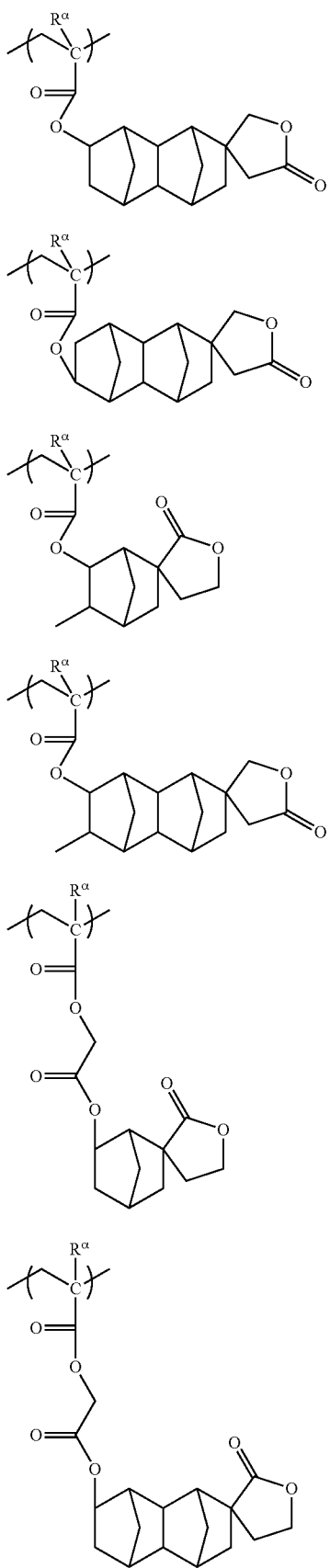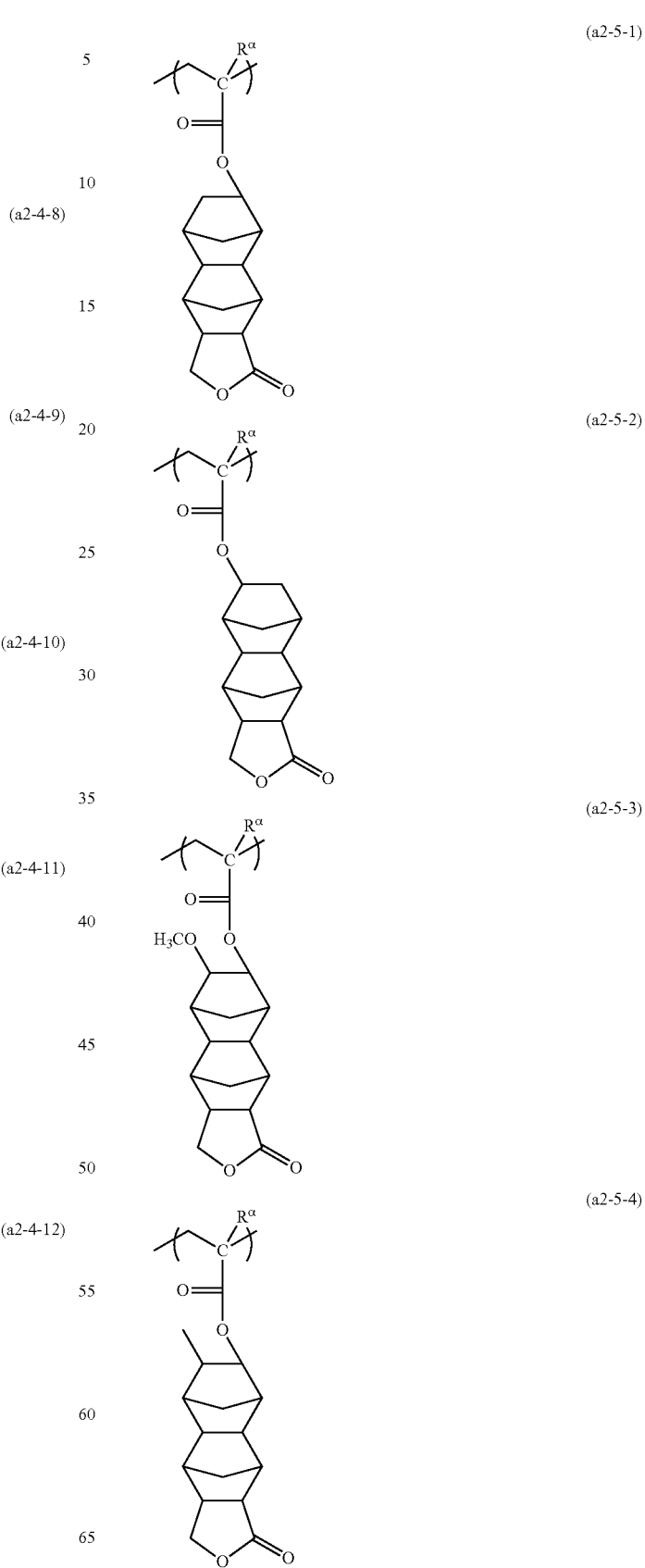

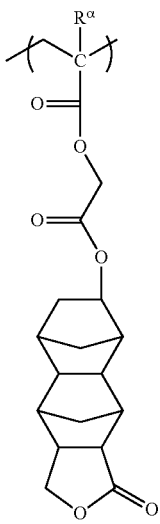

(a2-5-5)

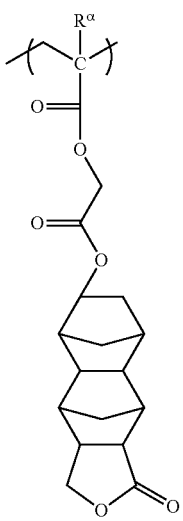

(a2-5-6)

As the structural unit (a2) contained in the component (A1), one type of structural unit may be used, or two or more types may be used.

As the structural unit (a2), at least one structural unit selected from the group consisting of structural units represented by formulas (a2-1) to (a2-5) is preferable, and at least one structural unit selected from the group consisting of structural units represented by formulas (a2-1) to (a2-3) is more preferable.

Of these, it is preferable to use at least one structural unit selected from the group consisting of structural units represented by formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 10 to 45 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

[Structural Unit (a3)]

The structural unit (a3) is a structural unit derived from an acrylate ester which may have the hydrogen atom bonded to the carbon atom on the α-position substituted with a substituent and contains a polar group-containing aliphatic hydrocarbon group (provided that, structural units which fall under the definition of the aforementioned structural units (a5), (a1) and (a2) are excluded from the structural unit (a3)).

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 37]

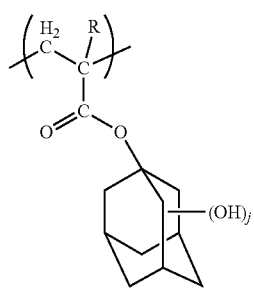

(a3-1)

-continued

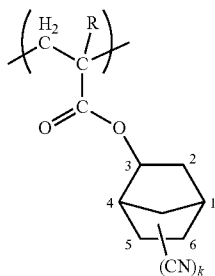
(a3-2)

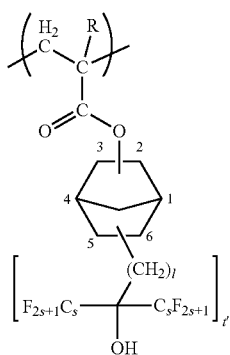
(a3-3)

In the formulas, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxy groups be bonded to the 3rd and 5th positions of the adamantyl group. When j is 1, it is preferable that the hydroxy group be bonded to the 3rd position of the adamantyl group.

j is preferably 1, and it is particularly desirable that the hydroxy group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbonyl group or 3-norbonyl group be bonded to the terminal of the carboxy group of the acrylic acid. It is preferable that the fluorinated alkyl alcohol be bonded to the 5th or 6th position of the norbornyl group.

As the structural unit (a3) contained in the component (A1), one type of structural unit may be used, or two or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

[Other Structural Unit]

The component (A1) may also have a structural unit other than the above-mentioned structural units (a5), (a1), (a2) and (a3), as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of the other structural unit include a structural unit (a0) containing a —$SO_2$-containing cyclic group, a structural unit (a4) derived from an acrylate ester which may have the hydrogen atom bonded to the carbon atom on the α-position substituted with a substituent and contains an acid non-dissociable aliphatic polycyclic group, a structural unit (a6) derived from a hydroxystyrene and a structural unit (a7) derived from a styrene.

—Structural Unit (a0)

The structural unit (a0) is a structural unit containing —$SO_2$-containing cyclic group.

By virtue of the structural unit (a0) containing a —$SO_2$— containing cyclic group, the adhesion between a resist film formed using a resist composition containing the component (A1) including the structural unit (a0) and a substrate can be improved. Further, the structural unit (a0) contributes to improvement in various lithography properties such as sensitivity, resolution, exposure latitude (EL margin), line width roughness (LWR), line edge roughness (LER) and mask reproducibility.

Here, an "—$SO_2$— containing cyclic group" refers to a cyclic group having a ring containing —$SO_2$— within the ring skeleton thereof, i.e., a cyclic group in which the sulfur atom (S) within —$SO_2$— forms part of the ring skeleton of the cyclic group.

In the —$SO_2$— containing cyclic group, the ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings.

The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and particularly preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—SO$_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —SO$_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

As the alkyl group, alkoxy group, halogen atom, halogenated alkyl group, —COOR", —OC(=O)R" and hydroxyalkyl group as a substituent, the same alkyl groups, alkoxy groups, halogen atoms, halogenated alkyl groups, —COOR", —OC(=O)R" and hydroxyalkyl groups as those described above for R' in the general formulas (a2-1) to (a2-5).

More specific examples of the —SO$_2$— containing cyclic group include groups represented by general formulas (3-1) to (3-4) shown below.

[Chemical Formula 38]

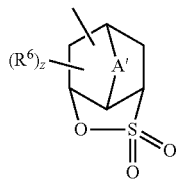

(3-1)

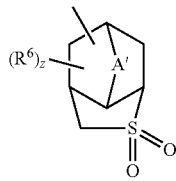

(3-2)

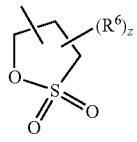

(3-3)

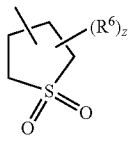

(3-4)

In the formulas, A' represents an oxygen atom, a sulfur atom or an alkylene group of 1 to 5 carbon atoms which may contain an oxygen atom or a sulfur atom; z represents an integer of 0 to 2; and R$^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms for A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkylene group. Specific examples of such alkylene groups include —O—CH$_2$—, —CH$_2$—O—CH$_2$—, —S—CH$_2$— and —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

If there are two of the R$^6$ groups, as indicated by the value z, then the two of the R$^6$ groups may be the same or different from each other.

As the alkyl group, alkoxy group, halogenated alkyl group, —COOR", —OC(=O)R" and hydroxyalkyl group for R$^6$, the same alkyl groups, alkoxy groups, halogenated alkyl groups, —COOR", —OC(=O)R" and hydroxyalkyl groups as those described above for the substituent which the —SO$_2$— containing cyclic group may have, can be mentioned.

Specific examples of the cyclic groups represented by general formulas (3-1) to (3-4) are shown below. In the formulas shown below, "Ac" represents an acetyl group.

[Chemical Formula 39]

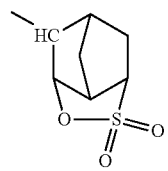

(3-1-1)

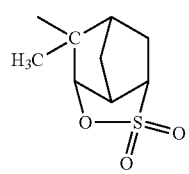

(3-1-2)

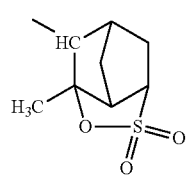

(3-1-3)

103
-continued
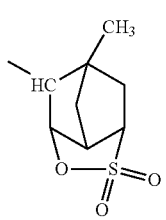 (3-1-4)
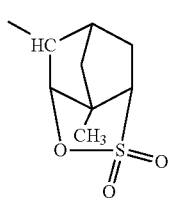 (3-1-5)
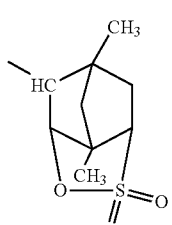 (3-1-6)
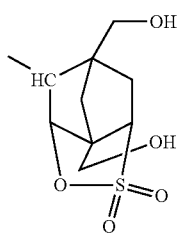 (3-1-7)
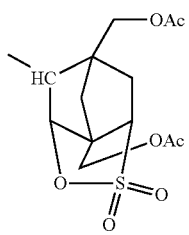 (3-1-8)
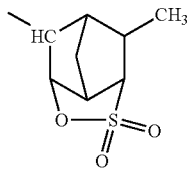 (3-1-9)
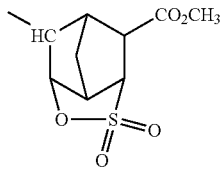 (3-1-10)
104
-continued
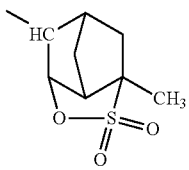 (3-1-11)
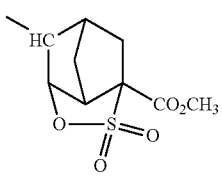 (3-1-12)
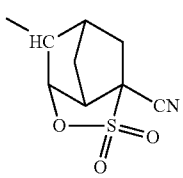 (3-1-13)
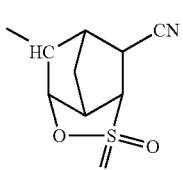 (3-1-14)
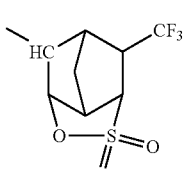 (3-1-15)
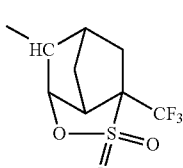 (3-1-16)
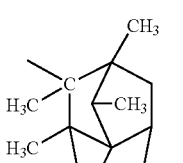 (3-1-17)
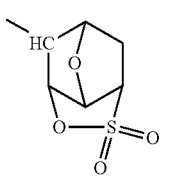 (3-1-18)

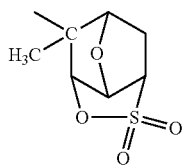
(3-1-19)
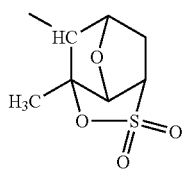
(3-1-20)
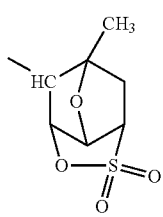
(3-1-21)
[Chemical Formula 40]
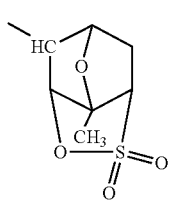
(3-1-22)
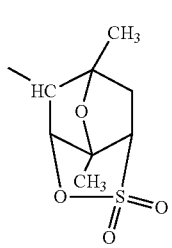
(3-1-23)
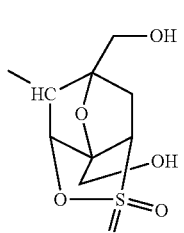
(3-1-24)
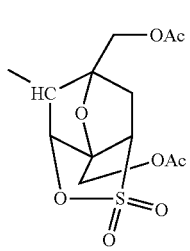
(3-1-25)
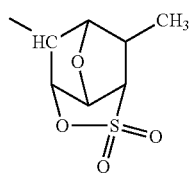
(3-1-26)
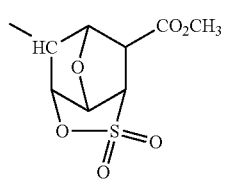
(3-1-27)
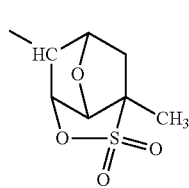
(3-1-28)
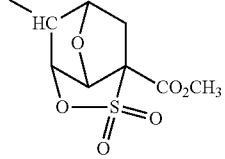
(3-1-29)
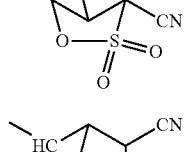
(3-1-30)
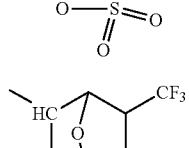
(3-1-31)
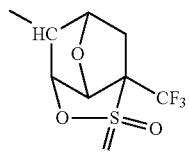
(3-1-32)
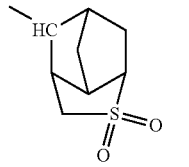
(3-1-33)
[Chemical Formula 41]
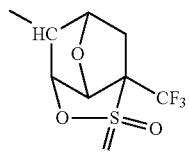
(3-2-1)

-continued

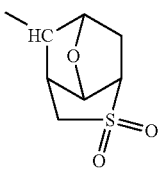
(3-2-2)

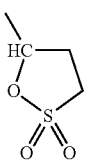
(3-3-1)

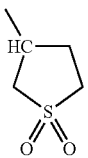
(3-4-1)

As the —SO$_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by the chemical formula (3-1-1) is most preferable.

More specifically, examples of the structural unit (a0) include structural units represented by general formula (a0-0) shown below.

[Chemical Formula 42]

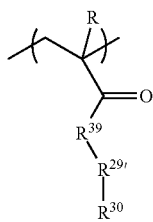
(a0-0)

In the formula, R represents a hydrogen atom, an alkyl group of 1 to 5 carbon atoms or a halogenated alkyl group of 1 to 5 carbon atoms; $R^{39}$ represents —O— or —NH—; $R^{30}$ represents a —SO$_2$— containing cyclic group; and $R^{29'}$ represents a single bond or a divalent linking group.

In general formula (a0-0), R is the same as defined above for R in the structural unit (a1).

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-0), $R^{39}$ represents —O— or —NH—.

In formula (a0-0), $R^{30}$ is the same those as defined for the aforementioned —SO$_2$-containing group.

In the formula (a0-0), $R^{29'}$ may be a single bond or a divalent linking group. In terms of the effects of the present invention and excellent lithography properties, a divalent linking group is preferable.

As the divalent linking group for $R^{29'}$, for example, the same divalent linking groups as those described above for $R^1$ in the formula (a5-1) can be mentioned.

As the divalent linkage group for $R^{29'}$, an alkylene group, a divalent aliphatic hydrocarbon group or a divalent linkage group containing a hetero atom is preferable. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above in relation to the aliphatic hydrocarbon group for $Y^2$.

As the divalent linking group containing an ester bond, a group represented by general formula: —$R^{20}$—C(=O)—O— (in the formula, $R^{20}$ represents a divalent linking group) is particularly desirable. Namely, the structural unit (a0) is preferably a structural unit represented by general formula (a0-0-1) shown below.

[Chemical Formula 43]

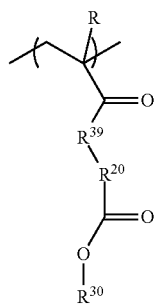
(a0-0-1)

In the formula, R represents a hydrogen atom, an alkyl group of 1 to 5 carbon atoms or a halogenated alkyl group of 1 to 5 carbon atoms; $R^{39}$ represents —O— or —NH—; $R^{20}$ represents a divalent linking group; and $R^{30}$ represents an —SO$_2$— containing cyclic group.

$R^{20}$ is not particularly limited. For example, the same divalent linking groups as those described for $R^{29'}$ in general formula (a0-0) can be mentioned.

As the divalent linking group for $R^{20}$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $R^{29'}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing an oxygen atom, a divalent linking group containing an ether bond or an ester bond is preferable, and a group represented by the aforementioned formulas —$Y^{21}$—O—$Y^{22}$—, [$Y^{21}$—C(=O)—O]$_{m'}$—$Y^{22}$— or a group represented by the aforementioned formula —$Y^{21}$—O—C(=O)—$Y^{22}$— is more preferable. $Y^{21}$, $Y^{22}$ and m' are the same as defined above.

Among these, a group represented by the formula —$Y^{21}$—O—C(=O)—$Y^{22}$— is preferable, a group represented by the formula —$(CH_2)_c$—O—C(=O)—$(CH_2)_d$— is particularly desirable. c represents an integer of 1 to 5, and is preferably an integer of 1 to 3, and more preferably an integer of 1 or 2. d represents an integer of 1 to 5, and is preferably an integer of 1 to 3, and more preferably an integer of 1 or 2.

In particular, as the structural unit (a0), a structural unit represented by general formula (a0-0-11) or (a0-0-12) shown below is preferable, and a structural unit represented by general formula (a0-0-12) is more preferable.

[Chemical Formula 44]

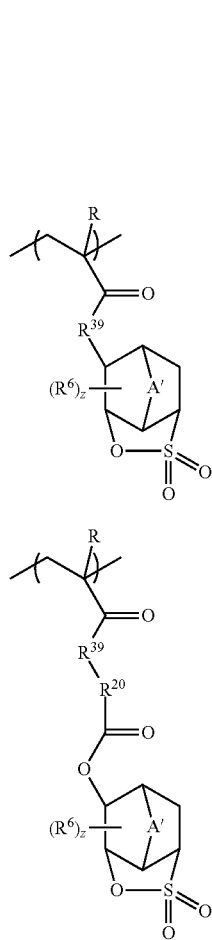

(a0-0-11)

(a0-0-12)

In the formulas, R, A', $R^6$, z, $R^{39}$ and $R^{20}$ are the same as defined above.

In general formula (a0-0-11), A' is preferably a methylene group, an ethylene group, an oxygen atom (—O—) or a sulfur atom (—S—).

In the formula (a0-0-12), as $R^{20}$, a linear or branched alkylene group or a divalent linking group containing an oxygen atom is preferable. As the linear or branched alkylene group and the divalent linking group containing an oxygen atom for $R^{20}$, the same linear or branched alkylene groups and the divalent linking groups containing an oxygen atom as those described above can be mentioned.

As the structural unit represented by general formula (a0-0-12), a structural unit represented by general formula (a0-0-12a) or (a0-0-12b) shown below is particularly desirable.

[Chemical Formula 45]

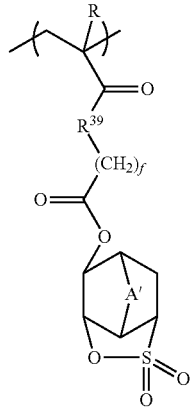

(a0-0-12a)

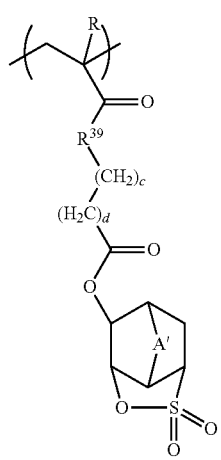

(a0-0-12b)

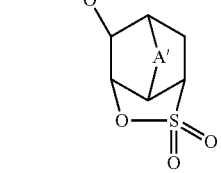

In the formulas, R, $R^{39}$ and A' are the same as defined above; each of c and d is the same as defined above; and f represents an integer of 1 to 5 (preferably an integer of 1 to 3).

As the structural unit (a0) contained in the component (A1), one type of structural unit may be used, or two or more types may be used.

In terms of achieving an excellent shape for a resist pattern formed using a resist composition containing the component (A1) and excellent lithography properties such as EL margin, LWR and mask reproducibility, the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

—Structural Unit (a4)

The structural unit (a4) is a structural unit derived from an acylate ester which may have the hydrogen atom bonded to the carbon atom on the α-position substituted with a substituent and contains an acid non-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 46]

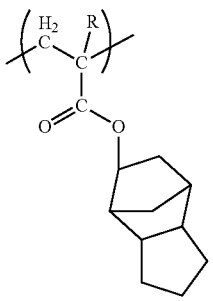
(a4-1)

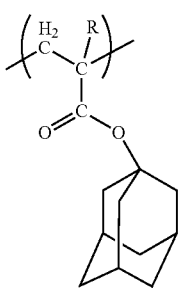
(a4-2)

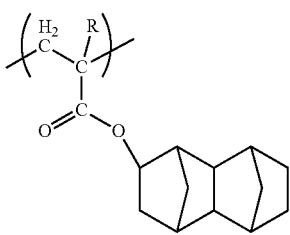
(a4-3)

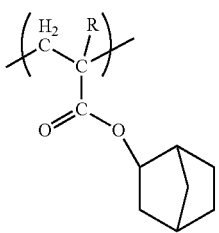
(a4-4)

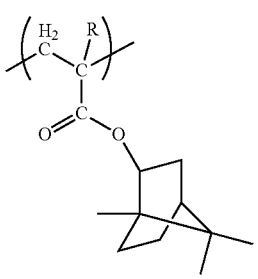
(a4-5)

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

—Structural Unit (a6)

As the structural unit (a6), a structural unit represented by general formula (a6-1) shown below is preferable because the solubility in an organic solvent becomes excellent, and the etching resistance can be improved.

[Chemical Formula 47]

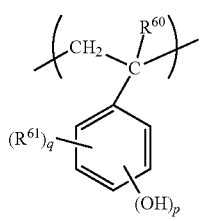
(a6-1)

In the formula, $R^{60}$ represents a hydrogen atom or an alkyl group of 1 to 5 carbon atoms; $R^{61}$ represents an alkyl group of 1 to 5 carbon atoms; p represents an integer of 1 to 3; and q represents an integer of 0 to 2.

In the formula (a6-1), specific examples of the alkyl group of 1 to 5 carbon atoms for $R^{60}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group. As $R^{60}$, a hydrogen atom or a methyl group is preferable.

p represents an integer of 1 to 3, and is preferably 1.

The bonding position of the hydroxy group may be o-position, m-position or p-position of the phenyl group. When p is 1, p-position is preferable in terms of availability and low cost. When p is 2 or 3, a desired combination of the bonding positions can be given.

q represents an integer of 0 to 2. q is preferably 0 or 1, and most preferably 0 from industrial viewpoint.

As the alkyl group for $R^{61}$, the same alkyl groups as those described above for $R^{60}$ can be used.

When q is 1, the bonding position of $R^{61}$ may be o-position, m-position or p-position of the phenyl group.

When q is 2, a desired combination of the bonding positions can be used. Here, the plurality of the $R^{61}$ group may be the same or different from each other.

When the structural unit (a6) is included in the component (A1), the amount of the structural unit (a6) based on the combined total of all the structural units that constitute the component (A1) is preferably within the range from 50 to 90 mol %, more preferably 50 to 85 mol %, and still more preferably 60 to 80 mol %.

—Structural Unit (a7)

As the structural unit (a7), a structural unit represented by general formula (a7-1) shown below is preferable because the solubility in an alkali developing solution can be controlled, and heat resistance and dry etching resistance are improved.

[Chemical Formula 48]

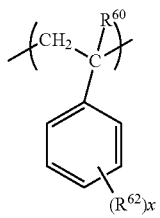

(a7-1)

In the formula, $R^{60}$ represents a hydrogen atom or an alkyl group of 1 to 5 carbon atoms; $R^{62}$ represents an alkyl group of 1 to 5 carbon atoms; and x represents an integer of 0 to 3.

In general formula (a7-1), $R^{60}$ is the same as defined above for $R^{60}$ in the structural unit (a6-1).

In the formula (a7-1), as the alkyl group for $R^{62}$, the same alkyl groups as those described above for $R^{61}$ in the formula (a6-1) can be used.

x represents an integer of 0 to 3, preferably 0 or 1, and most preferably 0 in terms of industrials.

When x represents 1, the substituting position of $R^{62}$ may be o-position, m-position or p-position. When x is 2 or 3, a desired combination of the substituting positions can be used. Here, the plurality of the $R^{62}$ groups may be the same or different from each other.

When the structural unit (a7) is included in the component (A1), the amount of the structural unit (a7) based on the combined total of all the structural units that constitute the component (A1) is preferably within the range from 10 to 50 mol %, more preferably from 15 to 45 mol %, and still more preferably 20 to 40 mol %.

In the resist composition according to the present invention, it is preferable that the component (A) contains a polymeric compound (A1) having a structural unit (a5).

Examples of the component (A1) include a polymeric compound consisting of a repeating structure of the structural unit (a5) and the structural unit (a1); a polymeric compound consisting of a repeating structure of the structural unit (a5), the structural unit (a1) and the structural unit (a2); and a polymeric compound consisting of a repeating structure of the structural unit (a5), the structural unit (a1), the structural unit (a2) and the structural unit (a3).

Specific examples of the component (A1) include a polymeric compound consisting of a repeating structure of the structural unit (a51) represented by the general formula (a5-1), the structural unit represented by the general formula (a1-0-12), the structural unit represented by the general formula (a2-1) and the structural unit represented by the general formula (a3-1); and a polymeric compound consisting of a repeating structure of the structural unit (a51) represented by the general formula (a5-1), the structural unit represented by the general formula (a1-0-12) and a structural unit represented by the general formula (a2-1).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight of the component (A1) is no more than the upper limit of the above-mentioned range, the resist composition exhibits a satisfactory solubility in a resist solvent. On the other hand, when the weight average molecular weight is at least as large as the lower limit of the above-mentioned range, the dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.2 to 2.5. Here, Mn is the number average molecular weight.

The component (A1) can be obtained, for example, by a conventional radical polymerization or the like of the monomers corresponding to each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding to structural units, commercially available monomers may be used, or the monomers may be synthesized by a conventional method.

In the component (A), as the component (A1), one type may be used alone, or two or more types may be used in combination.

In the component (A), the amount of the component (A1) based on the total weight of the component (A) is may be appropriately adjusted within the range from 10 to 100% by weight.

When the amount of the component (A1) is at least 10% by weight, the film retention properties at exposed portions of the resist film become excellent, and the resolution and the shape of resist pattern to be formed become excellent.

<Base Component; Component (A')>

The resist composition according to the present invention may contain a base component which exhibits increased solubility in an alkali developing solution under action of acid other than the component (A) (hereafter, referred to as "component (A')"), as long as the effects of the present invention are not impaired.

It is preferable that the component (A') is a resin component which exhibits increased solubility in an alkali developing solution by the action of acid, it is more preferable that the component (A') contains a polymeric compound which exhibits increased solubility in an alkali developing solution by the action of acid and it is particularly preferable that the component (A') includes a polymeric compound (hereafter, referred to as "component (A'1)") which has the aforementioned structural unit (a1).

The component (A'1) preferably includes the aforementioned structural unit (a2), as well as the structural unit (a1).

Furthermore, it is preferable that the component (A'1) has the aforementioned structural unit (a3), (a0), (a4), (a6) or (a7), as well as the structural unit (a1) or the structural units (a1) and (a2).

Examples of the component (A'1) include a polymeric compound consisting of a repeating structure of the structural unit (a1) and the structural unit (a2); and a polymeric compound consisting of a repeating structure of the structural unit (a1), the structural unit (a2) and the structural unit (a3).

Specific examples of the component (A1) include a polymeric compound consisting of a repeating structure of the structural unit represented by the general formula (a1-0-12) and a structural unit represented by the general formula (a2-1); a polymeric compound consisting of a repeating structure of the structural unit represented by the general formula (a1-

0-11) and the structural unit represented by the general formula (a2-1); a polymeric compound consisting of a repeating structure of the structural unit represented by the general formula (a1-0-12), a structural unit represented by the general formula (a2-1) and the structural unit represented by the general formula (a3-1); and a polymeric compound consisting of a repeating unit of the structural unit represented by the general formula (a1-0-13), the structural unit represented by the general formula (a2-1) and the structural unit represented by the general formula (a3-1).

The amount of each structural unit in the component (A'1), the weight average molecular weight (Mw) of the component (A'1) and the dispersity (Mw/Mn) are the same as those described above in relation to the component (A1), respectively.

As the component (A'1), one type may be used, or two or more types may be used in combination.

In the resist composition according to the present invention, the mixing ratio (weight ratio) of the component (A1) to the component (A'1) (i.e., (A1)/(A'1)) is preferably within a range from 100/0 to 1/99, more preferably from 90/10 to 10/90, and is still more preferably from 60/40 to 20/80.

When the amount of the component (A1) relative to the total amount of the component (A1) and component (A'1) is within the above-mentioned range, the amount of the structural unit (a5) in the entire base component is controlled, and the film retention properties at exposed portions of the resist film become excellent, and the resolution of the resist pattern to be formed further improved. Further, a resist pattern having more fine size can be easily obtained. As a result, the lithography properties and the shape of a resist pattern can be improved.

In the resist composition according to the present invention, the amount of the component (A) can be appropriately adjusted depending on the thickness of the resist film to be formed, and the like.

<Acid Supply Component; Component (Z)>

In the method of forming a resist pattern according to the present invention, an "acid supply component" which supplies acid to be provided to the resist film is used.

The "acid supply component" includes a component which exhibits acidity by itself, that is, a component which acts as a proton donor (hereafter, referred to as "acidic compound component" or component (G)); and a component which is decomposed by heat or light and then acts as an acid (hereafter, referred to as "acid generator component" or "component (B)").

In the present invention, it is preferable that a resist composition is used, which contains the acid supply component, that is, an acidic compound component or an acid generator component, as in one embodiment of the method of forming a resist pattern according to the present invention described below.

[Acidic Compound Component; Component (G)]

In the present invention, as the component (G), an acidic salt having an acid strength capable of increasing the solubility of the base component (A) in the alkali developing solution (hereafter, referred to as "component (G1)") or an acid other than the acidic salt (acid which does not form a salt and is not ionic; hereafter, referred to as "component (G2)") can be used.

The "an acidic salt having an acid strength capable of increasing the solubility of the base component (A) in the alkali developing solution" includes an acid which can cleave at least a part of bonds within the acid decomposable group in the structural unit (a1) by the bake treatment (PEB) in the step (3), in the case where the polymeric compound (A1) containing the structural units (a5) and (a1) is used.

—Component (G1)

Examples of the component (G1) include an ionic compound (salt compound) which consists of a nitrogen-containing cation moiety and a counteranion. Even if forming a salt, the component (G1) exhibits acidity by itself, and acts as a proton donor.

Each of the cation moiety and the anion moiety in the component (G1) will be described.

(Cation Moiety of Component (G1))

The cation moiety in the component (D1) is not particularly limited as long as it contains a nitrogen atom, and a cation moiety represented by general formula (G1c-1) shown below is particularly used.

[Chemical Formula 49]

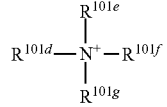

(G1c-1)

In the formula, $R^{101d}$, $R^{101e}$, $R^{101f}$ and $R^{101g}$ each represents a hydrogen atom, a linear, branched or cyclic alkyl group, an alkenyl group, an oxoalkyl group or an oxoalkenyl group of 1 to 12 carbon atoms, an aryl group of 6 to 20 carbon atoms or an arylalkyl group of 6 to 20 carbon atoms, an aralkyl group of 7 to 12 carbon atoms, or an aryloxoalkyl group, and part or all hydrogen atoms within these groups may be substituted with a halogen atom, an alkoxy group or a sulfur atom; $R^{101d}$ and $R^{101e}$ or $R^{101d}$, $R^{101e}$ and $R^{101f}$ may be mutually bonded with the nitrogen atom to form a ring, provided that, when a ring is formed, each of $R^{101d}$ and $R^{101e}$, or each of $R^{101d}$, $R^{101e}$ and $R^{101f}$ independently represents an alkylene group of 3 to 10 carbon atoms, or forms a hetero aromatic ring containing the nitrogen atom in the ring thereof.

In the formula (G1c-1), $R^{101d}$, $R^{101e}$, $R^{101f}$ and $R^{101g}$ each independently represents a hydrogen atom, a linear, branched or cyclic alkyl group, an alkenyl group, an oxoalkyl group or an oxoalkenyl group of 1 to 12 carbon atoms, an aryl group or an arylalkyl group of 6 to 20 carbon atoms, an aralkyl group of 7 to 12 carbon atoms or an aryloxoalkyl group.

The alkyl group for $R^{101d}$ to $R^{101g}$ may be linear, branched, cyclic, or a combination thereof. As examples of the combination, a group in which the cyclic alkyl group is bonded to the terminal of the linear or branched alkyl group or interposed within the aforementioned linear or branched alkyl group, can be given.

The linear or branched alkyl group preferably has 1 to 20 carbon atoms, more preferably 1 to 15, and still more preferably 1 to 10.

Specific examples of linear alkyl group include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of branched alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The cyclic alkyl group may be either a monocyclic group or a polycyclic group. The aliphatic cyclic group preferably has 3 to 30 carbon atoms, more preferably 5 to 30, still more preferably 5 to 20, particularly preferably 6 to 15, and most preferably 6 to 12. As the aliphatic cyclic group, a group in which one hydrogen atom has been removed from a monocycloalkane or a polycycloalkane such as a bicycloalkane, tricycloalkane or tetracycloalkane can be used. Specific examples of groups in which one hydrogen atom have been removed from a monocycloalkane include a cyclopentyl group and a cyclohexyl group. In addition, examples of the group in which one hydrogen atom has been removed from a polycycloalkane include an adamantyl group, a norbornyl group, an isobornyl group, a tricyclodecyl group, a tetracyclododecyl group and the like.

Among these, as the alkyl group for $R^{101d}$ to $R^{101g}$, a linear or branched alkyl group is preferable, and the number of carbon atoms is preferably 1 to 10, and a methyl group, an ethyl group, a propyl group or a butyl group is particularly preferable.

The alkenyl group for $R^{101d}$ to $R^{101g}$ preferably has 2 to 10 carbon atoms, more preferably 2 to 5, and still more preferably 2 to 4. Specific examples thereof include a vinyl group, a propenyl group (allyl group), a butynyl group, a 1-methylpropenyl group and a 2-methylpropenyl group.

The oxoalkyl group for $R^{101d}$ to $R^{101g}$ preferably has 2 to 10 carbon atoms, and examples thereof include a 2-oxoethyl group, a 2-oxopropyl group, a 2-oxocyclopentyl group and a 2-oxocyclohexyl group can be mentioned.

As the oxoalkenyl group for $R^{101d}$ to $R^{101g}$, an oxo-4-cyclohexenyl group and a 2-oxo-4-propenyl group can be mentioned.

The aryl group for $R^{101d}$ to $R^{101g}$ is preferably a phenyl group or a naphthyl group. As the arylalkyl group, a group in which one or more hydrogen atoms within the aryl group have been substituted with an alkyl group (preferably an alkyl group of 1 to 5 carbon atoms) can be mentioned.

As the aralkyl group or aryloxoalkyl group for $R^{101d}$ to $R^{101g}$, a benzyl group, a phenylethyl group, a phenethyl group, a 2-phenyl-2-oxoethyl group, 2-(1-naphthyl)-2-oxoethyl group and 2-(2-naphthyl)-2-oxoethyl group can be mentioned, respectively.

The hydrogen atoms within the alkyl group, the alkenyl group, the oxoalkyl group, the oxoalkenyl group, the aryl group, the arylalkyl group, the aralkyl group and the aryloxoalkyl group for $R^{101d}$ to $R^{101g}$ may or may not be substituted with a halogen atom such as a fluorine atom, an alkoxy group or a sulfur atom.

In the case where $R^{101d}$ to $R^{101g}$ is constituted from a combination of an alkyl group and a hydrogen atom, at least a part of hydrogen atom within the alkyl group is preferably substituted with a halogen atom such as a fluorine atom, an alkoxy group and a sulfur atom, in terms of storage stability and lithography properties.

In addition, $R^{101d}$ and $R^{101e}$, or $R^{101d}$ and $R^{101e}$ and $R^{101f}$ may be mutually bonded together with the nitrogen atom to form a ring. Examples of the ring to be formed include a piperidine ring, a hexamethyleneimine ring, an azole ring, a pyridine ring, a pyrimidine ring, an azepine ring, a pyrazine ring, a quinoline ring and a benzoquinoline ring.

In addition, the ring skeleton may have an oxygen atom, and specific examples include an oxazole ring and an isoxazole ring.

In particular, the cation moiety represented by the formula (G1c-1) is preferably a nitrogen-containing cation moiety having a pKa of 7 or less.

In the present invention, pKa refers to an acid dissociation constant which is generally used as a parameter which shows the acid strength of an objective substance. The pKa value of the cation moiety within the component (G1) can be determined by a conventional method. In addition, the pKa value can be estimated using a known soft ware such as "ACD/Labs" (product name, manufactured by Advanced Chemistry Development, Inc.).

The pKa value of the component (G1) is preferably 7 or less, and is appropriately adjusted according to the type or pKa value of counteranion such that the cation moiety becomes a weak base relative to the counteranion. Specifically the pKa value is preferably from −2 to 7, more preferably from −1 to 6.5, and still more preferably from 0 to 6. When the pKa value is no more than the upper limit of the above-mentioned range, the basicity of the cation moiety becomes sufficiently weak, and the component (G1) itself becomes an acidic compound. In addition, when the pKa values is no less than the lower limit of the above-mentioned range, the cation moiety easily forms a salt with a counteranion, the acidity of the component (G1) becomes suitable, and the deterioration of the storage stability caused by being excessive acidic of the component (G1) can be suppressed.

As the cation moiety which satisfies the above pKa value, a cation moiety represented by any one of general formulas (G1c-11) to (G1c-13) shown below is particularly preferable.

[Chemical Formula 50]

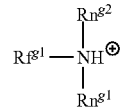

(G1c-11)

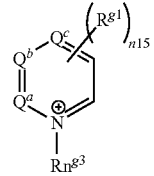

(G1c-12)

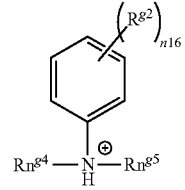

(G1c-13)

In the formula, $Rf^{g1}$ represents a fluorinated alkyl group of 1 to 12 carbon atoms; each of $Rn^{g1}$ and $R^{g2}$ independently represents a hydrogen atom or an alkyl group of 1 to 5 carbon atoms, and $Rn^{g1}$ and $R^{g2}$ may be mutually bonded to form a ring; each of $Q^a$ to $Q^c$ independently represents a carbon atom or a nitrogen atom; $Rn^{g3}$ represents a hydrogen atom or a methyl group; $Rn^{g4}$ and $Rn^{g5}$ each independently represents an alkyl group of 1 to 5 carbon atoms or an aromatic hydrocarbon group; each of $R^{g1}$ and $R^{g2}$ independently represents a hydrocarbon group; each of n15 and n16 represents an integer of 0 to 4; n15 and n16 are an integer of 2 or more, a plurality of $R^{g1}$ and $R^{g2}$ with which the hydrogen atoms on the adjacent carbon atom have been substituted may be mutually bonded to form a ring.

In the formula (G1c-11), $Rf^{g1}$ represents a fluorinated alkyl group of 1 to 12 carbon atoms, and a fluorinated alkyl group in which 50% of the hydrogen atoms within the alkyl group have been fluorinated is preferable.

In formula (G1c-13), $Rn^{g4}$ and $Rn^{g5}$ each independently represents an alkyl group of 1 to 5 carbon atoms or an aromatic hydrocarbon group, and is the same the alkyl group of 1 to 5 carbon atoms and aryl groups as those described above in the explanation of $R^{101d}$, $R^{101e}$, $R^{101f}$ and $R^{101g}$ in formula (G1c-1).

In the formulas (G1c-12) and (G1c-13), n15 and n16 represent an integer of 0 to 4, and preferably an integer of 0 to 2, and more preferably 0.

In the formulas (G1c-12) and (G1c-13), each of $R^{g1}$ and $R^{g2}$ independently represents a hydrocarbon group, and an alkyl group of 1 to 12 carbon atoms or an alkenyl group of 1 to 12 carbon atoms is preferable. The alkyl group and alkenyl group are the same groups as those described above in the formula (G1c-1).

When n15 and n16 are integers of 2 or more, the plurality of $R^{g1}$ and $R^{g2}$ may be the same or different from each other. When n15 and n16 are an integer of 2 or more, the plurality of $R^{g1}$ and $R^{g2}$ with which the hydrogen atoms on the adjacent carbon atom have been substituted may be mutually bonded to form a ring. As the ring to be formed, a benzene ring and a naphthalene ring can be mentioned. That is, the compounds represented by any one of formulas (G1c-12) and (G1c-13) may be a fused-ring compounds in which two or more rings have been fused.

Specific examples of structural units represented by general formulas (G1c-11) to (G1c-3) are shown below.

[Chemical Formula 51]

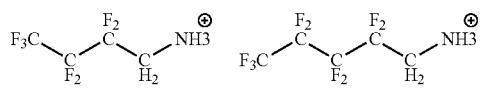

[Chemical Formula 52]

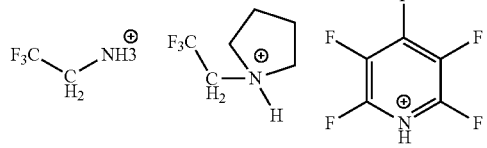
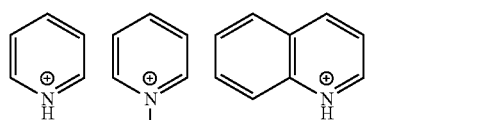
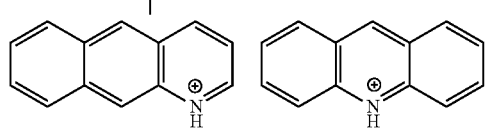
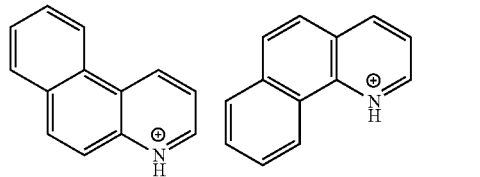
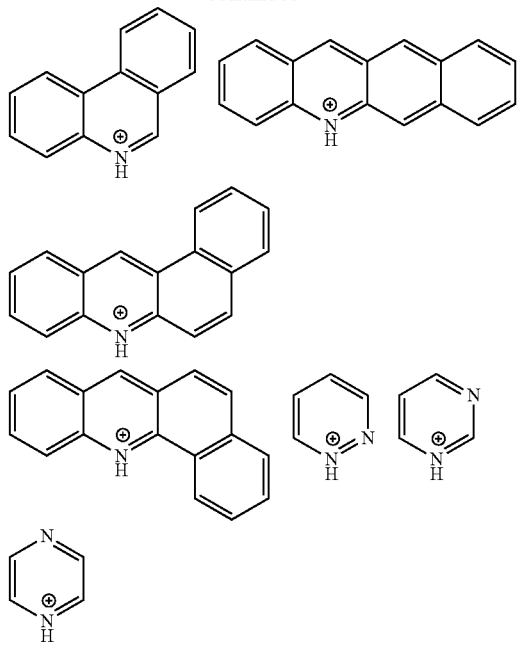

[Chemical Formula 53]

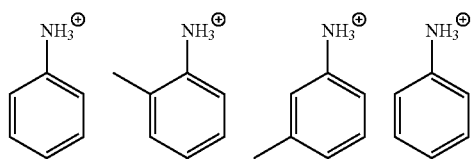
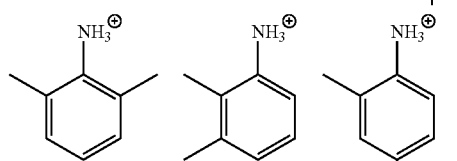
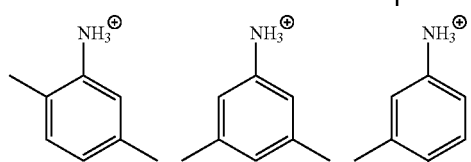
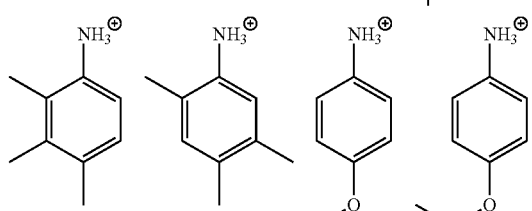
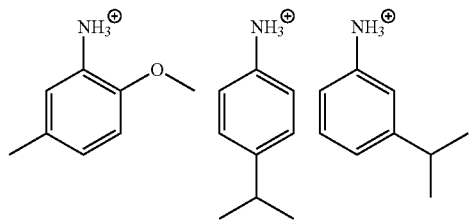

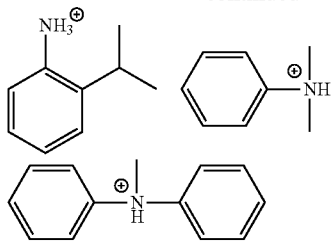

(Anion Moiety of Component (G1))

The anion moiety of the component (G1) is not particularly limited, and any of those generally used as an anion moiety of a salt used in a resist composition may be appropriately selected for use.

Among these, as the anion moiety of the component (G1), those which forms a salt with the aforementioned cation moiety of the component (G1) to form a component (G1) capable of increasing the solubility of the component (A) in an alkali developing solution are preferable.

The acid salt "capable of increasing the solubility of the component (A) in an alkali developing solution" refers to an acid salt capable of causing cleavage of at least a part of the bond within the structure of the acid decomposable group in the structural unit (a1) by conducting baking in the aforementioned step (3) when a component (A1) having a structural units (a5) and (a1) is used.

That is, the anion moiety of the component (G1) preferably has a strong acidity. Specifically, the pKa of the anion moiety is more preferably 0 or less, still more preferably −15 to −1, and most preferably −13 to −3. When the pKa of the anion moiety is no more than 0, the acidity of the anion can be rendered satisfactorily strong relative to a cation having a pKa of 7 or less, and the component (G1) itself becomes an acidic compound. On the other hand, when the pKa of the anion moiety is −15 or more, deterioration of the storage stability caused by the component (G1) being excessively acidic can be prevented.

As the anion moiety of the component (G1), an anion moiety having at least one anion group selected from a sulfonate anion, a carboxylate anion, a sulfonylimide anion, a bis(alkylsulfonyl)imide anion and a tris(alkylsulfonyl)methide anion is preferable.

Specific examples include anions represented by general formula: "$R^{4\prime\prime\prime}SO_3^-$"($R^{4\prime\prime\prime}$ represents a linear, branched or cyclic alkyl group which may have a substituent, a halogenated alkyl group, an aryl group or an alkenyl group)".

In the general formula "$R^{4\prime\prime\prime}SO_3^-$", $R^{4\prime\prime\prime}$ represents a linear, branched or cyclic alkyl group, a halogenated alkyl group, an aryl group or an alkenyl group.

The linear or branched alkyl group for $R^{4\prime\prime\prime}$ preferably has 1 to 10 carbon atoms, more preferably 1 to 8 carbon atoms, and most preferably 1 to 4 carbon atoms.

The cyclic alkyl group for $R^{4\prime\prime\prime}$ preferably has 4 to 15 carbon atoms, more preferably 4 to 10, and most preferably 6 to 10.

When $R^{4\prime\prime\prime}$ represents an alkyl group, examples of "$R^{4\prime\prime\prime}SO_3^-$" includes alkylsulfonates, such as methanesulfonate, n-propanesulfonate, n-butanesulfonate, n-octanesulfonate, 1-adamantanesulfonate, 2-norbornanesulfonate and d-camphor-10-sulfonate.

The halogenated alkyl group for $R^{4\prime\prime\prime}$ is a group in which part of all of the hydrogen atoms in the alkyl group have been substituted with a halogen atom. As the alkyl group, an alkyl group of 1 to 5 carbon atoms is preferred. Among these, a linear or branched alkyl group is preferred, and more preferably a methyl group, an ethyl group, a propyl group, an isopropyl group, an n-butyl group, a tert-butyl group, a tert-pentyl group or an isopentyl group. Examples of the halogen atom which substitutes the hydrogen atoms include a fluorine atom, a chlorine atom, an iodine atom and a bromine atom.

With respect to the halogenated alkyl group, 50 to 100% of the hydrogen atoms in the alkyl group (alkyl group before halogenation) are preferably substituted with the halogen atoms, and all of the hydrogen atoms are more preferably substituted with the halogen atoms.

As the halogenated alkyl group, a fluorinated alkyl group is desirable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms because the acid strength increases.

Specific examples of the fluorinated alkyl group include a trifluoromethyl group, a heptafluoro-n-propyl group and a nonafluoro-n-butyl group.

The aryl group for $R^{4\prime\prime\prime}$ is preferably an aryl group of 6 to 20 carbon atoms.

The alkenyl group for $R^{4\prime\prime\prime}$ is preferably an alkenyl group of 2 to 10 carbon atoms.

With respect to $R^{4\prime\prime\prime}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4\prime\prime\prime}$ may have one substituent, or two or more substituents.

Examples of the substituent include a halogen atom, a hetero atom, an alkyl group, and a group represented by formula $X^3$-Q'- (in the formula, Q' represents a divalent linking group containing an oxygen atom; and $X^3$ represents a hydrocarbon group of 3 to 30 carbon atoms which may have a substituent).

Examples of halogen atoms and alkyl groups include the same halogen atoms and alkyl groups as those described above in relation to the halogenated alkyl group for $R^{4\prime\prime\prime}$.

Examples of hetero atoms include an oxygen atom, a nitrogen atom, and a sulfur atom.

In the group represented by formula $X^3$-Q'-, Q' represents a divalent linking group containing an oxygen atom.

Q' may contain an atom other than an oxygen atom. Examples of atoms other than oxygen include a carbon atom, a hydrogen atom, a sulfur atom and a nitrogen atom.

Examples of divalent linkage groups containing an oxygen atom include non-hydrocarbon, oxygen atom-containing linkage groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and a combination of any of the aforementioned non-hydrocarbon, oxygen atom-containing linkage groups with an alkylene group. To the combination, a sulfonyl group (—$SO_2$—) may further be linked.

Specific examples of the combinations of the aforementioned non-hydrocarbon, oxygen atom-containing linkage groups with anlkylene groups include —$R^{91}$—O—, —$R^{92}$—O—C(=O)—, —C(=O)—O—$R^{93}$—O—C(=O)—, —$SO_2$—O—$R^{94}$—O—C(=O)— and —$R^{95}$—$SO_2$—O—$R^{94}$—O—C(=O)— (in the formulas, $R^{91}$ to $R^{95}$ each independently represent an alkylene group.)

The alkylene group for $R^{91}$ to $R^{95}$ is preferably a linear or branched alkylene group, and preferably has 1 to 12 carbon atoms, more preferably 1 to 5, and most preferably 1 to 3.

Specific examples of the alkylene group include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$-]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Q' is preferably a divalent linking group containing an ester bond or ether bond, and more preferably a group of —$R^{91}$—O—, —$R^{92}$—O—C(=O)— or —C(=O)—O—$R^{93}$—O—C(=O)—.

In the group represented by the formula $X^3$-Q'-, the hydrocarbon group for $X^3$ may be either an aromatic hydrocarbon group or an aliphatic hydrocarbon group.

The aromatic hydrocarbon group for $X^3$ is a hydrocarbon group having an aromatic ring. The aromatic hydrocarbon group preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 3, and particularly preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxy group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is most desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the aforementioned halogenated alkyl group as the substituent for the aromatic hydrocarbon group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic hydrocarbon group for $X^3$ may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $X^3$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom. As the "hetero atom", there is no particular limitation as long as it is an atom other than carbon atom and hydrogen atom, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may be a group consisting of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein the H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group for $X^3$, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and particularly preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The cyclic aliphatic hydrocarbon group (aliphatic cyclic group) for $X^3$ represents an aliphatic cyclic group of 3 to 30 carbon atom which may have a substituent. In the aliphatic cyclic group, part of the carbon atoms constituting the aliphatic cyclic group may be substituted with a substituent group containing a hetero atom, or part or all of the hydrogen atoms constituting the aliphatic cyclic group may be substituted with a substituent group containing a hetero atom.

As the "hetero atom", there is no particular limitation as long as it is an atom other than carbon atom and hydrogen atom, and examples thereof include a halogen atom, an oxygen atom, a sulfur atom and a nitrogen atom. Examples of the halogen atom include a fluorine atom, a chlorine atom, an iodine atom and a bromine atom.

The substituent group containing a hetero atom may be a group consisting of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein the H may be substituted with a substituent such as an alkyl group or an acyl group), —S—, —S(=O)$_2$— and —S(=O)$_2$—O—. These substituents may be contained in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The aliphatic cyclic group for $X^3$ may be either a monocyclic group or a polycyclic group. The aliphatic cyclic group has 3 to 30 carbon atoms, preferably 5 to 30, more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 54]

(L1)

(L2)

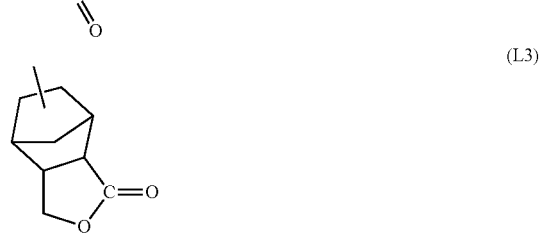

(L3)

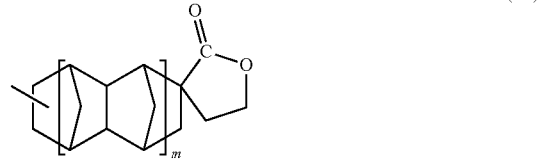

(L4)

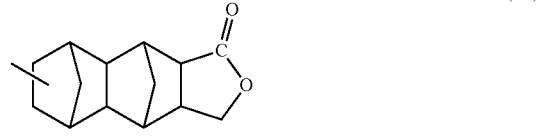

(L5)

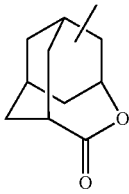
(L6)

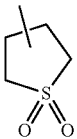
(S1)

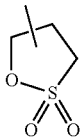
(S2)

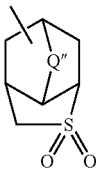
(S3)

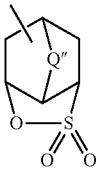
(S4)

In the formulas, Q" represents an alkylene group of 1 to 5 carbon atoms, —O—, —S—, —O—$R^{94}$— or —S—$R^{95}$—, and $R^{94}$ and $R^{95}$ each independently represent an alkylene group of 1 to 5 carbon atoms; and m represents an integer of 0 or 1.

In the formulas, the alkylene group for Q", $R^{94}$ and $R^{95}$ is preferably a linear or branched alkylene group, and has 1 to 5 carbon atoms, and more preferably 1 to 3 carbon atoms.

Specific examples of the alkylene group include a methylene group [—$CH_2$-], alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, an ethylene group [—$CH_2CH_2$-], alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, a trimethylene group (n-propylene group) [—$CH_2CH_2CH_2$-], alkyltrimethylene groups such as —CH($CH_3$)$CH_2CH_2$— and —$CH_2$CH($CH_3$)$CH_2$—, a tetramethylene group [—$CH_2CH_2CH_2CH_2$-], alkyltetramethylene groups such as —CH($CH_3$)$CH_2CH_2CH_2$— and —$CH_2$CH($CH_3$)$CH_2CH_2$—, and a pentamethylene group [—$CH_2CH_2CH_2CH_2CH_2$-].

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxy group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In particular, $X^3$ is preferably a linear alkyl group which may have a substituent, or a cyclic group which may have a substituent. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the formulas (L2) to (L6), (S3) and (S4) are preferable.

Among the above, As $R^{4"}$, a halogenated alkyl group or a group having $X^3$-Q'- as a substituent is preferable.

When the $R^{4"}$ has $X^3$-Q'- as a substituent, as $R^{4"}$, a group represented by formula: $X^3$-Q'-$Y^3$— (in the formula, Q' and $X^3$ are the same as defined above, and $Y^3$ represents an alkylene group of 1 to 4 carbon atoms which may have a substituent or a fluorinated alkylene group of 1 to 4 carbon atoms which may have a substituent) is preferable.

In the group represented by the formula $X^3$-Q'-$Y^3$—, as the alkylene group for $Y^3$, the same alkylene group as those described above for Q' in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^3$ include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2$$CF_2$—, —CF($CF_2CF_3$)$CF_2$—, —CF($CF_2CF_2CF_3$)—, —C($CF_3$)($CF_2CF_3$)—, —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)—, —C($CF_3$)$_2$$CH_2$—, —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)$CH_2CH_2$—, —$CH_2$CH($CH_3$)$CH_2$—, —CH($CH_3$)CH($CH_3$)—, —C($CH_3$)$_2$$CH_2$—, —CH($CH_2CH_3$)$CH_2$—, —CH($CH_2CH_2CH_3$)— and —C($CH_3$)($CH_2CH_3$)—.

As $Y^3$, a fluorinated alkylene group is preferable, and a fluorinated alkylene group in which the carbon atom bonded to the adjacent sulfur atom is fluorinated is particularly desirable. Examples of such fluorinated alkylene groups include —$CF_2$—, —$CF_2CF_2$—, —$CF_2CF_2CF_2$—, —CF($CF_3$)$CF_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2$$CF_2$—, —CF($CF_2CF_3$)$CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups or atoms other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxy group.

Specific examples of groups represented by formula $R^{4'''}SO_3$— in which $R^{4'''}$ represents $X^3$-$Q'$-$Y$— include anions represented by the following formulae (b1) to (b9).

[Chemical Formula 55]

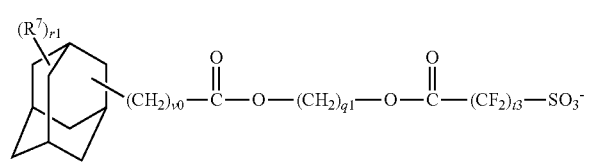
(b1)

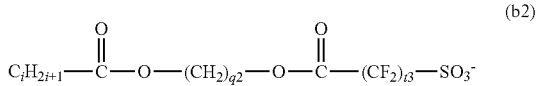
(b2)

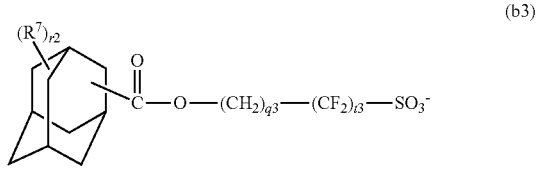
(b3)

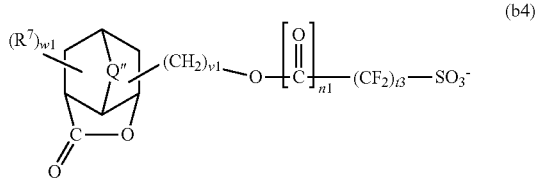
(b4)

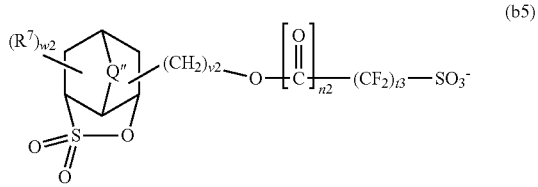
(b5)

[Chemical Formula 56]

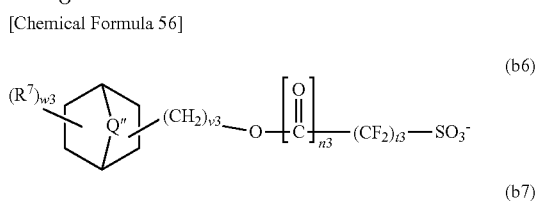
(b6)

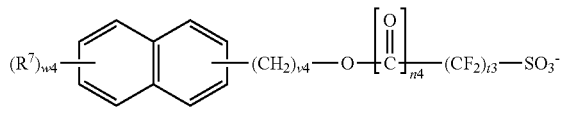
(b7)

-continued

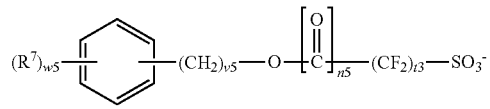
(b8)

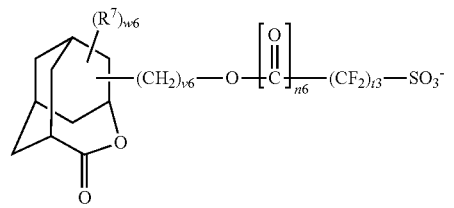
(b9)

In the formulas, each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^7$ represents a substituent; each of n1 to n6 independently represents 0 or 1; each of v0 to v6 independently represents an integer of 0 to 3; each of w1 to w6 independently represents an integer of 0 to 3; and Q" is the same as defined above.

As the substituent for $R^7$, the same groups as those which the aforementioned aliphatic hydrocarbon group or aromatic hydrocarbon group for $X^3$ may have as a substituent can be used.

If there are two or more of the $R^7$ group, as indicated by the values r1, r2, and w1 to w6 then the two or more of the $R^7$ groups may be the same or different from each other.

Further, as preferable examples of the anion moiety of the component (G1), an anion represented by general formula (G1a-3) shown below and an anion moiety represented by general formula (G1a-4) shown below can also be mentioned.

[Chemical Formula 57]

(G1a-3)

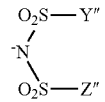
(Ga1-4)

In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

In the formula (G1a-3), X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In the formula (G1a-4), each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller number of carbon atoms of the alkylene group for X" or those of the alkyl group for Y" and Z" within the above-mentioned range of the number of carbon atoms is preferable, in terms of improving the solubility in a resist solution.

Further, in the alkylene group for X" or the alkyl group for Y" and Z", the large number of hydrogen atoms substituted with fluorine atoms is preferable, because the acid strength increases and the transparency to high energy radiation of 200 nm or less or electron beam is improved.

The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As the anion moiety of the component (G1), an anion represented by the aforementioned formula "$R^{4\prime\prime}SO_3^-$" (in particular, any one of anions represented by the aforementioned formulae (b1) to (b9) in which $R^{4\prime\prime}$ is "$X^3$-$Q'$-$Y^3$-") or an anion represented by the aforementioned formula (G1a-3) is most preferable.

As the component (G1), one type may be used alone, or two or more types may be used in combination.

In the resist composition according to the present invention, the amount of the component (G1) within the component (G) is preferably 40% by weight or more, still more preferably 70% by weight or more, and may be even 100% by weight. When the amount of the component (G1) is at least as large as the lower limit of the above-mentioned range, the storage stability and the lithography properties become excellent.

In the resist composition, the amount of the component (G1), relative to 100 parts by weight of the component (A) is preferably from 0.5 to 30 parts by weight, more preferably from 1 to 20 parts by weight, and most preferably from 2 to 15 parts by weight. When the amount of the component (G1) is within the above-mentioned range, the lithography properties becomes excellent.

—Component (G2)

The component (G2) does not fall under the definition of the component (G1), and exhibits acidity by itself, and acts as a proton donor. As the component (G2), an ionic acid which does not form a salt can be mentioned.

The component (G2) is not particularly limited, as long as it has an acid strength capable of increasing the solubility of the base component (A) in the alkali developing solution. As the component (G2), in terms of the reactivity with the acid dissociable group of the base component and ease in increasing the solubility of the resist film in an alkali developing solution, an imine acid or a sulfonic acid compound is preferable, and sulfonylimide, bis(alkylsulfonyl)imide, tris(alkylsulfonyl)methide and compounds having a fluorine atom within these compounds can be mentioned.

In particular, a compound represented by any one of general formulae (G2-1) to (G2-3) shown below (preferably a compound represented by general formula (G2-2)), a compound in which an anion represented by any one of the general formulae (b1) to (b9) has "—$SO_3^-$" replaced by "—$SO_3H$", a compound in which an anion represented by the general formula (G1a-3) or (G1a-4) has "$N^-$" replaced by "NH", and camphorsulfonic acid are preferable. Other examples include acid components such as a fluorinated alkyl group-containing carboxylic acid, a higher fatty acid, a higher alkylsulfonic acid, and a higher alkylarylsulfonic acid.

[Chemical Formula 58]

(G2-1)

(G2-2)

(G2-3)

In formula (G2-1), w' represents an integer of 1 to 5; in the formula (G2-2), $R^f$ represents a hydrogen atom or an alkyl group (provided that part or all of the hydrogen atoms within the alkyl group may be substituted with a fluorine atom, a hydroxy group, an alkoxy group, a carboxy group or an amino group); and y' represents an integer of 2 or 3; in the formula (G2-3), $R^f$ is the same as defined above; and z' represents an integer of 2 or 3.

Examples of the compounds represented by the formula (G2-1) include $(C_4F_9SO_2)_2NH$ and $(C_3F_7SO_2)_2NH$.

In the formula (G2-2), the alkyl group for $R^f$ preferably has 1 or 2 carbon atoms, and more preferably 1.

Examples of the alkoxy group which may have a hydrogen atom(s) substituted with a substituent include a methoxy group and an ethoxy group.

An example of a compound represented by the aforementioned formula (G2-2) includes a compound represented by a chemical formula (G2-21) shown below.

[Chemical Formula 59]

(G2-21)

In the formula (G2-3), $R^f$ is the same as defined for $R^f$ in the formula (G2-2).

An example of a compound represented by the aforementioned formula (G2-3) includes a compound represented by a chemical formula (G2-31) shown below.

[Chemical Formula 60]

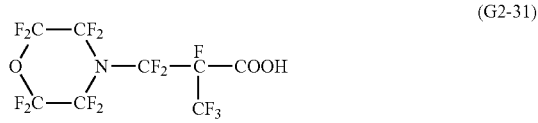

(G2-31)

As the fluorinated alkyl group-containing carboxylic group, for example, $C_{10}F_{21}COOH$ can be mentioned.

Examples of the higher fatty acid include higher fatty acids having an alkyl group of 8 to 20 carbon atoms, and specific examples thereof include dodecanoic acid, tetradecanoic acid, and stearic acid.

The alkyl group of 8 to 20 carbon atoms may be either linear or branched. Further, the alkyl group of 8 to 20 carbon atoms may have a phenylene group, an oxygen atom or the like interposed within the chain thereof. Furthermore, the alkyl group of 8 to 20 carbon atoms may have part of the hydrogen atoms substituted with a hydroxy group or a carboxy group.

Examples of the higher alkylsulfonic acid include sulfonic acids having an alkyl group preferably with an average of 9 to 21 carbon atoms, more preferably 12 to 18 carbon atoms, and specific examples thereof include decanesulfonic acid, dodecanesulfonic acid, tetradecanesulfonic acid, tetradecanesulfonic acid, pentadecanesulfonic acid and octadecanesulfonic acid.

Examples of the higher alkylarylsulfonic acid include alkylbenzenesulfonic acids and alkylnaphthalenesulfonic acids having an alkyl group preferably with an average of 6 to 18 carbon atoms, more preferably 9 to 15 carbon atoms, and specific examples thereof include dodecylbenzenesulfonic acid and decylnaphthalenesulfonic acid.

Examples of the acid components include alkyldiphenyletherdisulfonic acids preferably with an average of 6 to 18 carbon atoms, more preferably 9 to 15, and preferable examples thereof include dodecyldiphenyletherdisulfonic acid.

Examples of the component (G2) other than those described above include organic carboxylic acid, a phosphorus oxo acid or derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosho oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phosphinic acid esters and phenylphosphinic acid.

When the component (G) includes the component (G2), as the component (G2), one type of structural unit may be used, or two or more types may be used in combination.

Among these, as the component (G2), one or more compounds selected from the group consisting of sulfonylimide, bis(alkylsulfonyl)imide, tris(alkylsulfonyl)methide and compounds having a fluorine atom within these compounds is preferably used, and one or more compounds having a fluorine atom within these compounds is particularly preferably used.

In addition, when the resist composition includes the component (G2), the amount of the component (G2) in the resist composition, relative to 100 parts by weight of the component (A) is preferably from 0.5 to 20 parts by weight, more preferably from 1 to 15 parts by weight, and still more preferably from 1 to 10 parts by weight. When the amount of the component (G2) is at least as large as the lower limit of the above-mentioned range, the solubility of the resist film in an alkali developing solution is likely to be increased. On the other hand, when the amount of the component (G2) is no more than the upper limit of the above-mentioned range, an excellent sensitivity can be obtained.

[Acid-Generator Component; Component (B)]

In the present invention, as the acid supply component (Z), an acid generator component which is decomposed by heat or light and acts as an acid (hereafter, referred to as "component (B)") can be used.

The component (B) is different from the compound (G), and generates an acid by exposure in the step (2) or by bake treatment (PEB) in the step (3). The component (B) itself is not necessary to exhibit acidity.

As the component (B), there is no particular limitation, and any of the known acid generators used in conventional chemically amplified resist compositions can be used.

As the acid generators, a thermal acid generator which generates an acid by heating, and a photo acid generator which generates an acid upon exposure can be mentioned. Examples of these acid generators are numerous, and include onium salt acid generators such as iodonium salts and sulfonium salts; oxime sulfonate acid generators; diazomethane acid generators such as bisalkyl or bisaryl sulfonyl diazomethane and poly(bis-sulfonyl)diazomethane; nitrobenzylsulfonate acid generators; iminosulfonate acid generators; and disulfone acid generators.

These acid generator components are known as photo-acid generators (PAG), but also have a function as thermal acid generators (TAG). Therefore, as the acid generator component used in the present invention, any acid generator can be appropriately selected from those which have been conventionally known as acid generators for a chemically amplified resist.

The "thermal acid generator component which generates acid by heating" is a component which generates an acid by heating at a temperature preferably lower than a PEB temperature in the step (3), specifically, at a temperature of 200° C. or lower, and more preferably at a temperature of 50 to 150° C. By virtue of using the thermal acid generator which generates an acid at a heating temperature equal to or lower than a PEB temperature, the operation becomes easy. Moreover, it becomes easy to control the generation of acid from the thermal-acid generator and the deprotection reaction of the base component at different temperatures, respectively. By virtue of using a thermal-acid generator which preferably generates acid at a temperature of 50° C. or higher, the stability in the resist composition becomes excellent.

In the onium salt acid generators, as anion moiety of the component (B), an anion moiety having at least one anion group selected from a sulfonate anion, a carboxylate anion, a sulfonylimide anion, a bis(alkylsulfonyl)imide anion and a tris(alkylsulfonyl)methide anion is preferable. Further, specific examples of the anion moiety includes the same anion moiety as described above for the aforementioned component (G1).

In addition, as the cation moiety, the cation moiety represented by general formula (b-c1) or general formula (b-c2) can be mentioned.

[Chemical Formula 61]

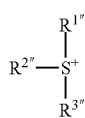

(b-c1)

(b-c2)

In formulas, $R^{1\prime\prime}$ to $R^{3\prime\prime}$ and $R^{5\prime\prime}$ to $R^{6\prime\prime}$ each independently represents an aryl group, an alkyl group or an alkenyl group which may have a substituent. In formula (b-c1), two of $R^{1\prime\prime}$ to $R^{3\prime\prime}$ may be mutually bonded to form a ring with the sulfur atom; $R^{4\prime\prime}$ represents an alkyl group, a halogenated alkyl group, an aryl group or an alkenyl group which may have a substituent.

In formula (b-c1), $R^{1\prime\prime}$ to $R^{3\prime\prime}$ each independently represents an aryl group which may have a substituent, an alkyl group which may have a substituent or an alkenyl group which may have a substituent. Two of $R^{1\prime\prime}$ to $R^{3\prime\prime}$ may be mutually bonded to form a ring with the sulfur atom.

Examples of the aryl group for $R^{1\prime\prime}$ to $R^{3\prime\prime}$ include an unsubstituted aryl group of 6 to 20 carbon atoms; and a substituted aryl group in which part or all of the hydrogen atoms of the aforementioned unsubstituted aryl group has been substituted with an alkyl group, an alkoxy group, a halogen atom, a hydroxy group, an oxo group (=O), an aryl group, an alkoxyalkyloxy group, an alkoxycarbonylalkyloxy group, $-C(=O)-O-R^{6\prime}$, $-O-C(=O)-R^{7\prime}$ or $-O-R^{8\prime}$. Each of $R^{6\prime}$, $R^{7\prime}$ and $R^{8\prime}$ independently represents a linear or branched saturated hydrocarbon group of 1 to 25 carbon atoms, a cyclic saturated hydrocarbon group of 3 to 20 carbon atoms or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1\prime\prime}$ to $R^{3\prime\prime}$ is preferably an alkyl group having 1 to 5 carbon atoms, and a methyl group, an ethyl group, a propyl group, an n-butyl group, or a tert-butyl group is most desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is most desirable.

The halogen atom as the substituent for the substituted aryl group is preferably a fluorine atom.

As the aryl group as a substituent in the substituted aryl group, the same aryl groups as those described above for $R^{1\prime\prime}$ to $R^{3\prime\prime}$ can be used.

Examples of alkoxyalkyloxy groups as the substituent for the substituted aryl group include groups represented by general formula shown below:

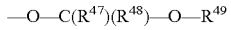  general formula:

[In the formula, $R^{47}$ and $R^{48}$ each independently represents a hydrogen atom, or a linear or branched alkyl group; and $R^{49}$ represents an alkyl group].

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

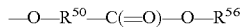  general formula:

[In the formula, $R^{50}$ represents a linear or branched alkylene group, and $R^{56}$ represents a tertiary alkyl group.]

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

The alkyl group for $R^{56}$ is a tertiary alkyl group, and examples thereof include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula $-O-R^{50}-C(=O)-O-R^{56}$ has been substituted with $R^{56\prime}$ can also be mentioned. $R^{56\prime}$ represents a hydrogen atom, an alkyl group, a fluorinated alkyl group or an aliphatic cyclic group which may contain a hetero atom.

The alkyl group for $R^{56\prime}$ is the same as defined for the alkyl group for the aforementioned $R^{49}$.

Examples of the fluorinated alkyl group for $R^{56\prime}$ include groups in which part or all of the hydrogen atoms within the alkyl group for $R^{49}$ has been substituted with a fluorine atom.

Examples of the aliphatic cyclic group for $R^{56\prime}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56\prime}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by the aforementioned formulas (L1) to (L6) and (S1) to (S4).

As the aliphatic cyclic group for $R^{56'}$ in which a hydrogen atom has been substituted with a hetero atom, an aliphatic cyclic group in which a hydrogen atom has been substituted with an oxygen atom (=O) can be mentioned.

In the groups —C(=O)—O—$R^{6'}$, —O—C(=O)—$R^{7'}$, —O—$R^{8'}$, each of $R^{6'}$, $R^{7'}$ and $R^{8'}$ each represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The linear or branched, saturated hydrocarbon group preferably has 1 to 25 carbon atoms, more preferably 1 to 15, and still more preferably 4 to 10.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

Example of the halogenated alkyl group as the substituent for the linear or branched, saturated hydrocarbon group includes a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—) in the ring structure thereof. More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or a lower alkyl group can be used.

Alternatively, $R^{6'}$, $R^{7'}$ and $R^{8'}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6'}$, $R^{7'}$ and $R^{8'}$ include a vinyl group, a propenyl group (an allyl group) and a butynyl group.

Examples of the branched aliphatic unsaturated hydrocarbon group for $R^{6'}$, $R^{7'}$ and $R^{8'}$ include a 1-methylpropenyl group and a 2-methylpropenyl group.

The aforementioned linear or branched, aliphatic unsaturated hydrocarbon group may have a substituent. Examples of substituents include the same substituents as those which the aforementioned linear or branched alkyl group may have.

Among the aforementioned examples, as $R^{7'}$ and $R^{8'}$, in terms of improvement in lithography properties and shape of the resist pattern, a linear or branched, saturated hydrocarbon group of 1 to 15 carbon atoms or a cyclic saturated hydrocarbon group of 3 to 20 carbon atoms is preferable.

Examples of the alkyl group for $R^{1'''}$ to $R^{3'''}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1'''}$ to $R^{3'''}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

When two of $R^{1'''}$ to $R^{3'''}$ are mutually bonded to form a ring with the sulfur atom, it is preferable that the two of $R^{1'''}$ to $R^{3'''}$ form a 3 to 10-membered ring including the sulfur atom, and it is particularly desirable that the two of $R^{1'''}$ to $R^{3'''}$ form a 5 to 7-membered ring including the sulfur atom.

Specific examples of the cation moiety within the compound represented by the formula (b-c1) are shown below.

[Chemical Formula 62]
(b-1-1)
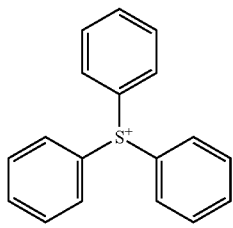
(b-1-2)
(b-1-3)
[Chemical Formula 63]
(b-1-4)
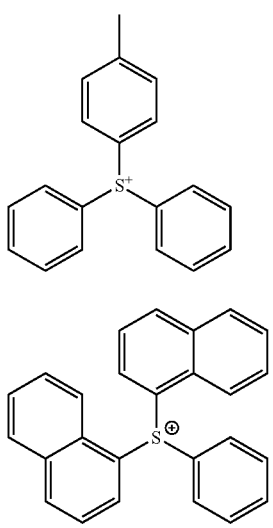
(b-1-5)
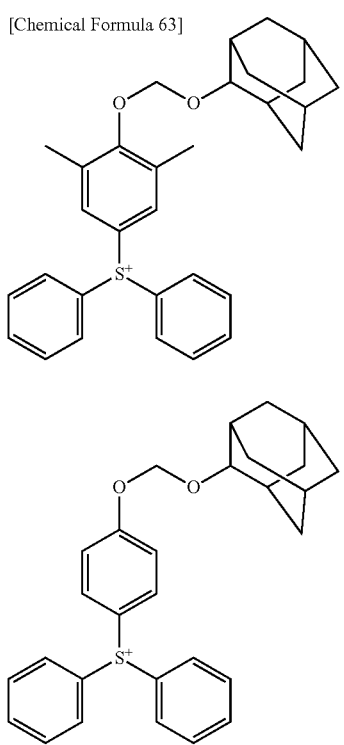
(b-1-6)
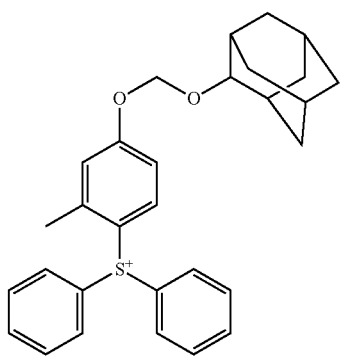
[Chemical Formula 64]
(b-1-7)
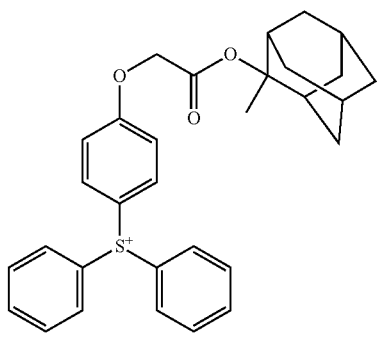
(b-1-8)
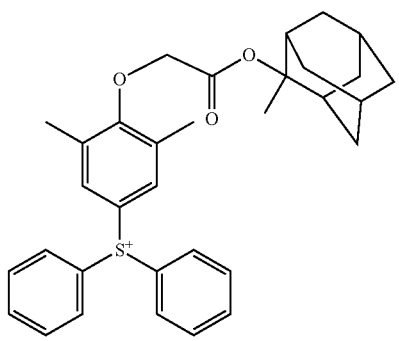
(b-1-9)
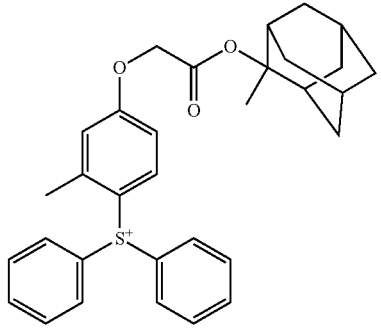

[Chemical Formula 65]
(b-1-10)
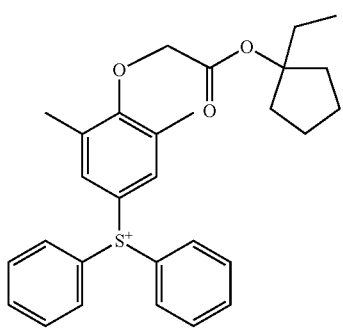
(b-1-11)
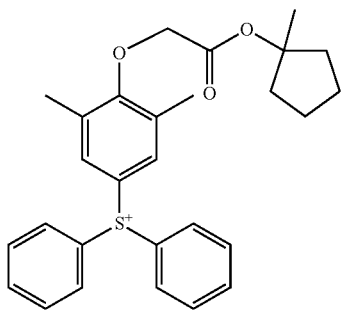
(b-1-12)
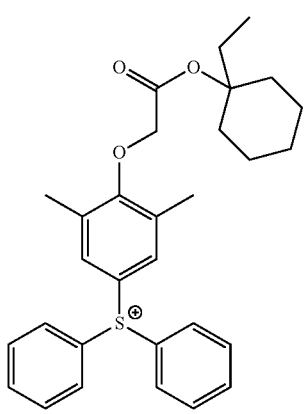
(b-1-13)
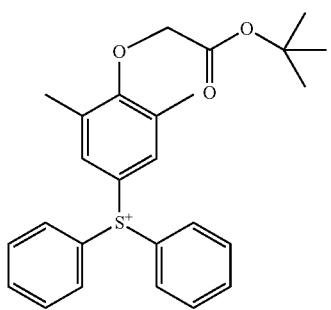
[Chemical Formula 66]
(b-1-14)
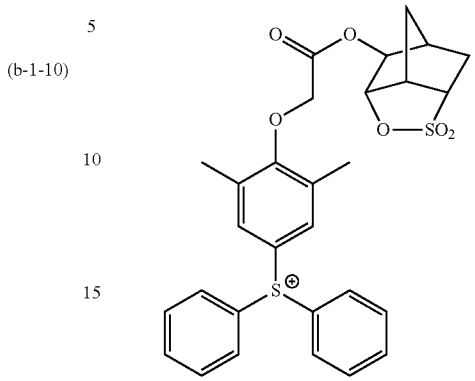
(b-1-15)
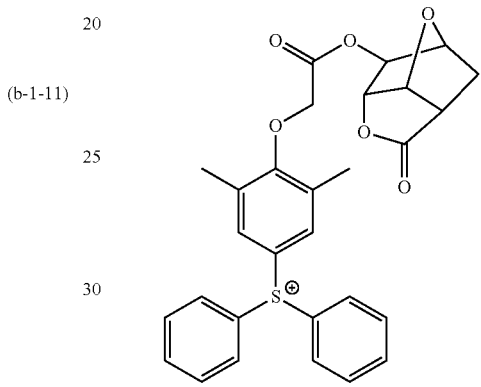
(b-1-16)
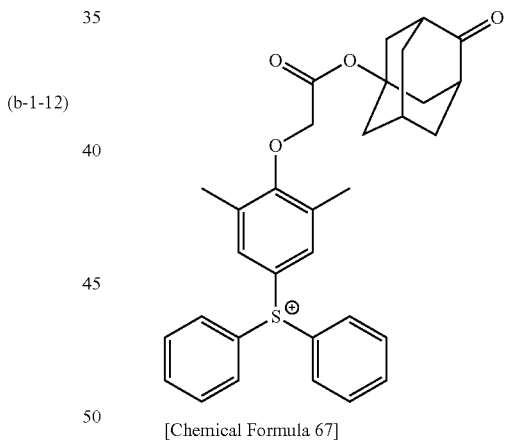
[Chemical Formula 67]
(b-1-17)
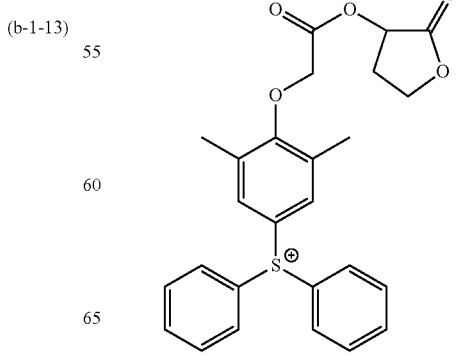

(b-1-18)
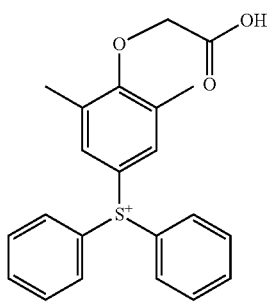
(b1-1-22)
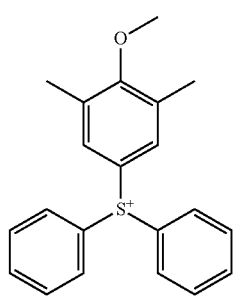
[Chemical Formula 69]
(b-1-19)
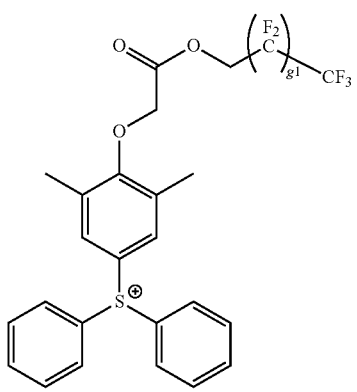
(b-1-23)
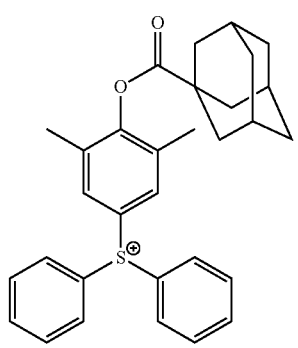
In the formula, g1 represents a recurring number, and is an integer of 1 to 5.
[Chemical Formula 68]
(b-1-24)
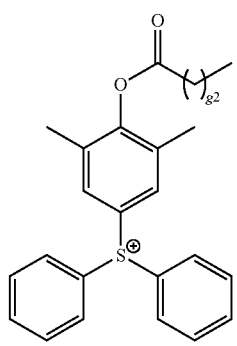
(b-1-20)
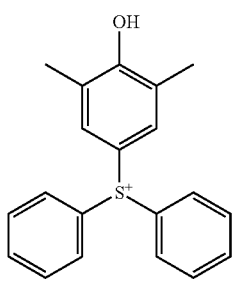
(b-1-25)
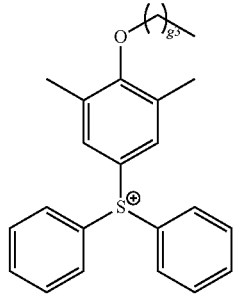
(b-1-21)
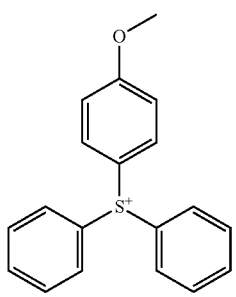
In the formulas, g2 and g3 represent recurring numbers, wherein g2 is an integer of 0 to 20, and g3 is an integer of 0 to 20.

[Chemical Formula 70]
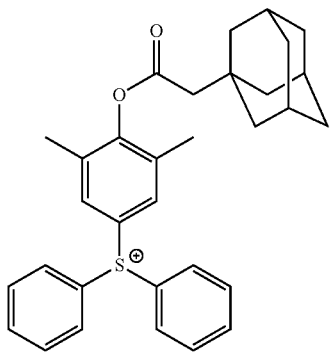
(b-1-26)
(b-1-27)
(b-1-28)
[Chemical Formula 71]
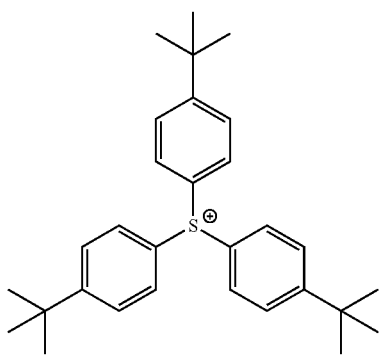
(b-1-29)
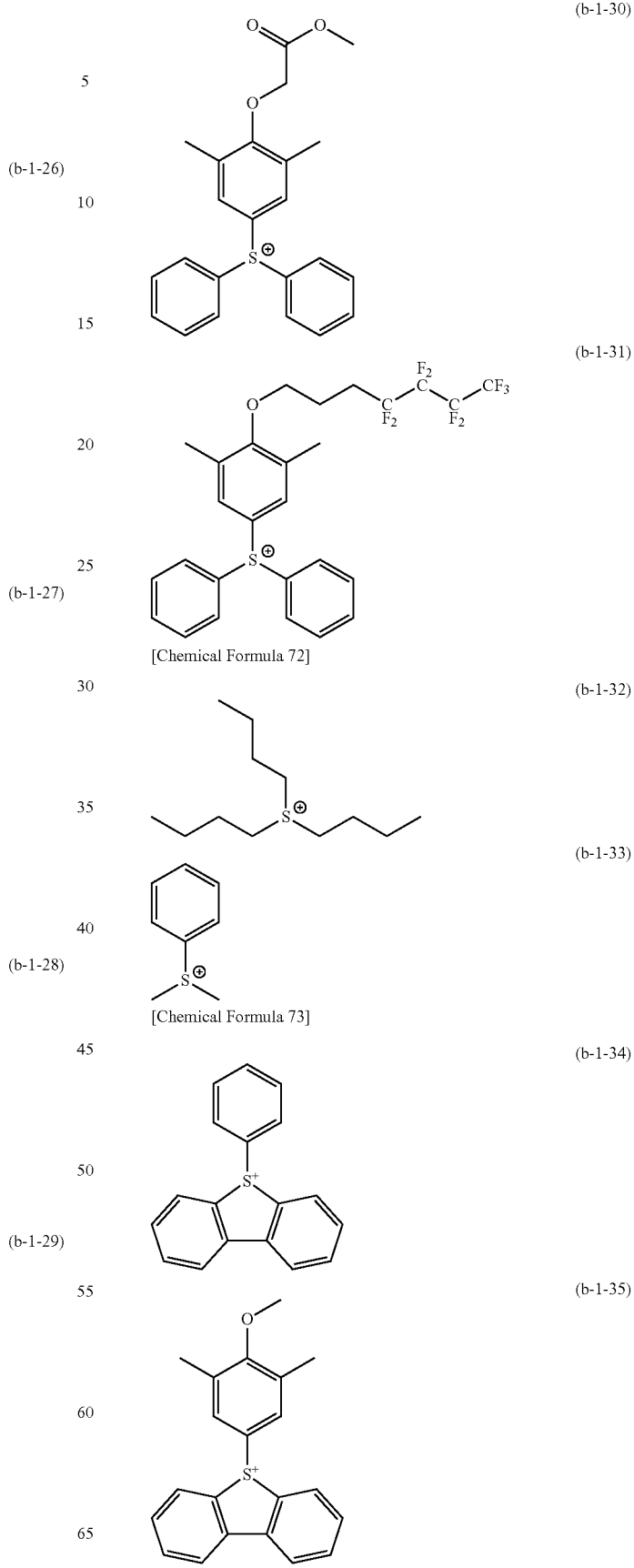
(b-1-30)
(b-1-31)
[Chemical Formula 72]
(b-1-32)
(b-1-33)
[Chemical Formula 73]
(b-1-34)
(b-1-35)

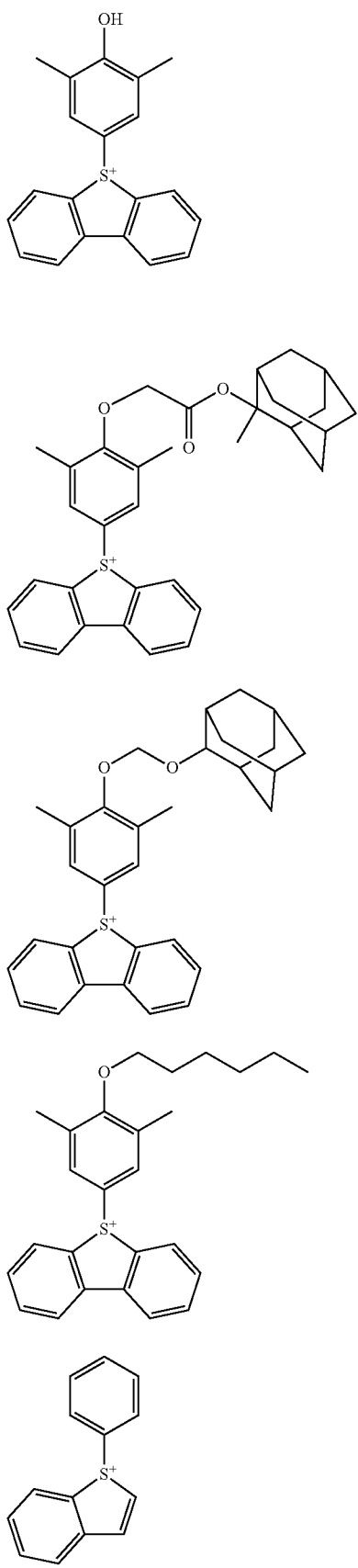
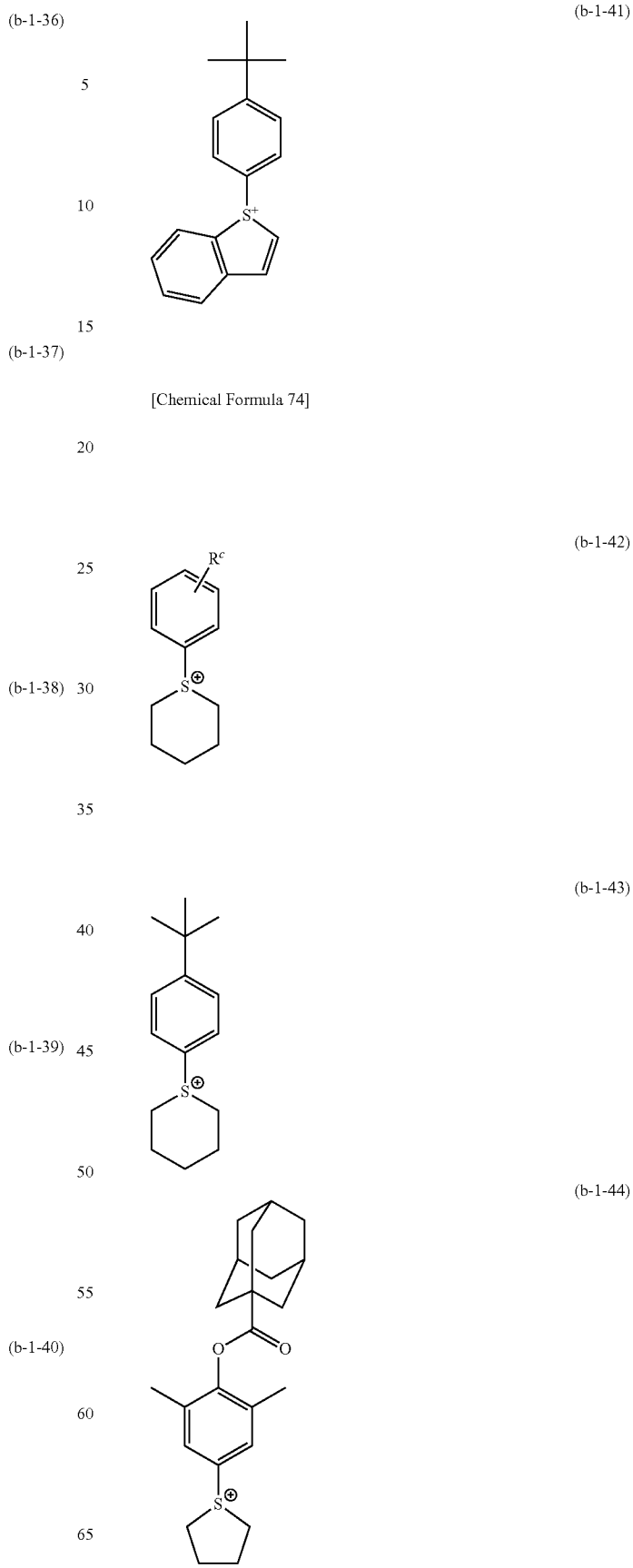
[Chemical Formula 74]

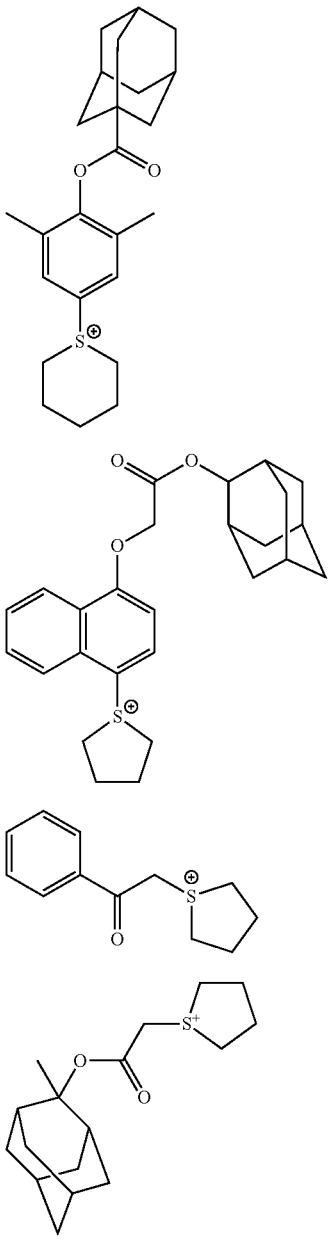

(b-1-45)

(b-1-46)

(b-1-47)

(b-1-48)

In the formula, examples of $R^C$ are the same as the substituents described above in relation to the substituted aryl group (i.e., an alkyl group, an alkoxy group, an alkoxyalkyloxy group, an alkoxycarbonylalkyloxy group, a halogen atom, a hydroxy group, an oxo group (=O), an aryl group, —C(=O)—O—$R^{6'}$, —O—C(=O)—$R^{7'}$ and —O—$R^{8'}$).

In formula (b-c2), $R^{5'''}$ and $R^{6'''}$ each independently represents an aryl group which may have a substituent, an alkyl group which may have a substituent or an alkenyl group which may have a substituent.

As the aryl group for $R^{5'''}$ and $R^{6'''}$, the same aryl groups as those described above for $R^{1'''}$ to $R^{3'''}$ can be used.

As the alkyl group for $R^{5'''}$ and $R^{6'''}$, the same alkyl groups as those described above for $R^{1'''}$ to $R^{3'''}$ can be used.

As the alkenyl group for $R^{5'''}$ and $R^{6'''}$, the same as the alkenyl groups for $R^{1'''}$ to $R^{3'''}$ can be used.

Specific examples of the cation moiety of the compound represented by general formula (b-c2) include diphenyliodonium and bis(4-tert-butylphenyl)iodonium.

In the present description, an oxime sulfonate acid generator is a compound having at least one group represented by general formula (B-1) shown below, and has a feature of generating acid by irradiation. Such oxime sulfonate acid generators are widely used for a chemically amplified resist composition, and can be appropriately selected.

[Chemical Formula 75]

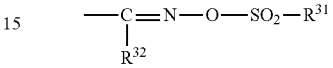

(B-1)

In the formula (B-1), $R^{31}$ and $R^{32}$ each independently represent an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like.

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which part of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. As the alkyl group or aryl group for $R^{32}$, the same alkyl groups or aryl groups as those described above for $R^{31}$ can be used.

As $R^{32}$, a cyano group, an alkyl group of 1 to 8 carbon atoms having no substituent or a fluorinated alkyl group of 1 to 8 carbon atoms is particularly desirable.

Preferable examples of the oxime sulfonate-based acid generator include compounds represented by general formula (B-2) or (B-3) shown below.

[Chemical Formula 76]

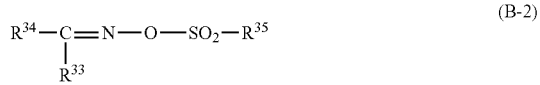

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 77]

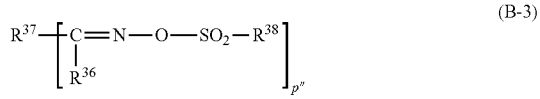

(B-3)

In the formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxide sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxide sulfonate-based acid generators disclosed in Japanese Unexamined Patent Application, First Publication No. Hei 9-208554 (Chemical Formulas 18 and 19 shown in paragraphs [0012] to [0014]) and oxide sulfonate-based acid generators disclosed in WO 2004/074242A2 (Examples 1 to 40 described at pages 65 to 85) may be preferably used.

Furthermore, as preferable examples, the following can be used.

[Chemical Formula 78]

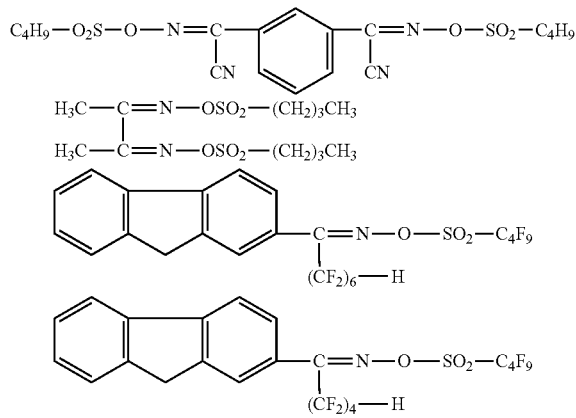

Of the aforementioned diazomethane-based acid generators, specific examples of suitable basally or binary sulfonyl diazomethane include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethane, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be mentioned.

As the component (B), one type of these acid generators may be used alone, or two or more types may be used in combination.

In the case where the resist composition of the present invention contains the component (B), when the component (B) is a thermal acid generator, the amount of the component (B) relative to 100 parts by weight of the component (A) is preferably 0.5 to 30 parts by weight, and more preferably 1 to 20 parts by weight. When the component (B) is an photo-acid generator, the amount of the component (B) relative to 100 parts by weight of the component (A) is preferably 0.5 to 30 parts by weight, and more preferably 1 to 20 parts by weight. When the amount of the component (B) is within the above-mentioned range, formation of a resist pattern can be satisfactorily performed. In addition, when the amount of the component (B) is at least as large as the lower limit of the above-mentioned range, solubility of the resist film in the developing solution is likely to be increased and resolution is increased. On the other hand, when the amount is no more than the upper limit of the above-mentioned range, sensitivity becomes excellent. In addition, in the case of the photo-acid generator, when the amount is no more than the upper limit of the above-mentioned range, the transparency of the resist film becomes excellent.

In the case where the resist composition of the present invention contains the component (B), the amount of the component (B) relative to the combined total amount of the component (G) and component (B) is preferably 50% by weight or less, and more preferably 20% by weight or more.

As the component (Z), one type may be used, or two or more types of compounds may be used in combination. For example, an acidic compound and an acid generator component are used in combination.

<Other Components>

To the resist composition according to the present invention, a photo-base generator component, an acid proliferating agent component, a fluorine additive, an amine and the like may be added.

[Photo-Base Generator Component; Component (C)]

In the method of forming a resist pattern according to the present invention, a photo-base generator component (hereafter, referred to as "component (C)") can be added, as well as the component (A).

The component (C) may be any compound capable of being decomposed by irradiation of radiation to generate a base, and examples thereof include a compound containing a carbamate group (a urethane bond), a compound containing an acyloxyimino group, an ionic compound (an anion-cation complex), and a compound containing a carbamoyloxyimino group. Among these, a compound containing a carbamate group (a urethane bond), a compound containing an acyloxyimino group, and an ionic compound (an anion-cation complex) are preferable.

In addition, the component (C) preferably has a ring structure in the molecule thereof. Examples of the ring structure include benzene, naphthalene, anthracene, xanthone, thioxanthone, anthraquinone, fluorene, and the like.

In particular, as the component (C), a compound represented by general formula (C1) shown below (hereafter, referred to as "component (C1)") is particularly preferred in terms of photo-decomposability. When irradiating these components, at least a bond between the nitrogen atom and a carbon atom within carbonyl group adjacent to the nitrogen atom within the formula (C1) is cleaved, thereby generating a carbon dioxide and an amine or ammonia. After decomposition, the resulting product having a partial structure represented by —N($R^{01}$)($R^{02}$) preferably has a high boiling point. In addition, in terms of diffusion control during PEB, it is preferable that the resulting product having a partial structure represented by —N($R^{01}$)($R^{02}$) has a large molecular weight or a bulky structure.

[Chemical Formula 79]

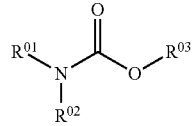

(C1)

In the formula, each of $R^{01}$ and $R^{02}$ independently represent a hydrogen atom or a monovalent hydrocarbon group which may have a hetero atom; $R^{01}$ and $R^{02}$ may be mutually bonded to form a cyclic group together with the nitrogen atom adjacent to $R^{01}$ and $R^{02}$; and $R^{03}$ represents a monovalent photo functional group.

In the formula (C1), the hetero atom that the hydrocarbon group for $R^{01}$ and $R^{02}$ may have is an atom other than carbon and hydrogen, and examples thereof include an oxygen atom, a nitrogen atom, a sulfur atom and a halogen atom. Examples of the halogen atom include a fluorine atom, a chlorine atom, a bromine atom and an iodine atom.

The hydrocarbon group may be either an aromatic hydrocarbon group or an aliphatic hydrocarbon group, and is preferably an aliphatic hydrocarbon group.

The aromatic hydrocarbon group for $R^{01}$ and $R^{02}$ is a hydrocarbon group having an aromatic ring, and example thereof include the same aromatic hydrocarbon groups as those described above for $X^3$ in the formula $X^3$-Q'- exemplified as a substituent for $R^{4''}$.

Examples of the aliphatic hydrocarbon group for $R^{01}$ and $R^{02}$ include the same aliphatic hydrocarbon groups as those described above for $X^3$ in the formula $X^3$-Q'-exemplified as a substituent for $R^{4''}$.

In the general formula (C1), $R^{01}$ and $R^{02}$ may be mutually bonded to form a cyclic group together with the nitrogen atom adjacent to these groups.

The cyclic group may be either an aromatic cyclic group or an aliphatic cyclic group. In the case of aliphatic cyclic group, the cyclic group may be saturated or unsaturated. Generally, a saturated aliphatic cyclic group is preferred.

The cyclic group may have a nitrogen atom other than the nitrogen atom bonded to $R^{01}$ and $R^{02}$ in the ring skeleton. In addition, the cyclic group may have a hetero atom other than carbon atom and nitrogen atom (for example, oxygen atom and sulfur atom).

The cyclic group may be either a monocyclic group or a polycyclic group.

In the case of monocyclic group, the number of atoms constituting the skeleton of the cyclic group is preferably 4 to 7, and more preferably 5 to 6. That is, the cyclic group is preferably a 4 to 7-membered ring, and more preferably a 5 to 6-membered ring. Specific examples of the monocyclic cyclic group include a group in which a hydrogen atom has been removed from —NH— group in the monocyclic heterocyclic compound containing —NH— group in the ring structure thereof, such as piperidine, pyrrolidine, morpholine, pyrrole, imidazole, pyrazole, 1,2,3-triazole, 1,2,4-triazole, tetrazole, piperazine, and the like.

In the case of polycyclic group, the cyclic group is preferably a bicyclic-, tricyclic- or tetracyclic group, and the number of atoms constituting the ring skeleton is preferably 7 to 12, and more preferably 7 to 10. Specific examples of the polycyclic nitrogen-containing hetero cyclic group include a group in which a hydrogen atom has been removed from —NH— group in the polycyclic heterocyclic compound containing —NH-group in the ring structure thereof, such as indole, isoindole, carbazole, benzimidazole, indazole, benzotriazole, and the like.

The cyclic group may have a substituent. Examples of the substituent include the same substituents as those described above for substituting a hydrogen atom bonded to the aromatic ring in the aromatic hydrocarbon group.

The cyclic group formed by $R^{01}$ and $R^{02}$ mutually bonded together with the adjacent nitrogen atom, a group represented by general formula (II) shown below is particularly preferred.

[Chemical Formula 80]

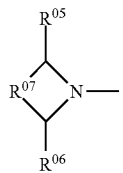

(II)

In the formula, each of $R^{05}$ and $R^{06}$ independently represents a hydrogen atom or an alkyl group; $R^{07}$ represents a linear alkylene group of 1 to 3 carbon atoms in which a carbon atom may be replaced by an oxygen atom or a nitrogen atom and a hydrogen atom may be substituted with a substituent.

In the formula (II), as the alkyl group for $R^{05}$ and $R^{06}$, the same alkyl groups as those described above in the explanation of aliphatic hydrocarbon groups for $R^{01}$ and $R^{02}$, and a linear or branched alkyl group is preferable, and a methyl group is particularly preferred.

With respect to $R^{07}$, examples of the alkylene group in which a carbon atom may be replaced by an oxygen atom or a nitrogen atom include —$CH_2$—, —$CH_2$—O—, —$CH_2$—NH—, —$CH_2$—$CH_2$—, —$CH_2$—O—$CH_2$—, —$CH_2$—NH—$CH_2$—, —$CH_2$—$CH_2$—$CH_2$—, —$CH_2$—$CH_2$—O—$CH_2$— and —$CH_2$—$CH_2$—NH—$CH_2$—.

Examples of the substituent for substituting a hydrogen atom in the alkylene group include the same substituents as those described above for substituting a hydrogen atom bonded to the aromatic ring in the aromatic hydrocarbon group. The hydrogen atom to be substituted with a substituent may be either a hydrogen atom bonded to a carbon atom or a hydrogen atom bonded to a nitrogen atom.

In the formula (C1), $R^{03}$ represents a monovalent photo functional group.

Here, the term "photo functional group" refers to a group which can absorb the exposure energy generated by exposure treatment in the step (2).

The photo functional group is preferably a ring-containing group, and may be a hydrocarbon ring or a heterocyclic ring. Preferable examples of the photo functional group include a group having a cyclic structure as those described above for $R^{01}$ and $R^{02}$ and a group having an aromatic ring. Specific examples of the ring skeleton in the ring-containing group include benzene, biphenyl, indene, naphthalene, fluorene, anthracene, phenanthrene, xanthone, thioxanthone, anthraquinone and the like.

In addition, the ring skeleton may have a substituent. As the substituent, in terms of base generation efficiency, a nitro group is particularly preferred.

As the component (C1), a compound represented by general formula (C1-11) shown below or general formula (C1-12) shown below is particularly desirable.

[Chemical Formula 81]

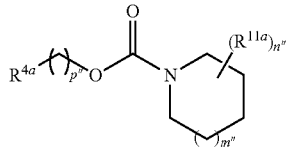

(C1-11)

(C1-12)

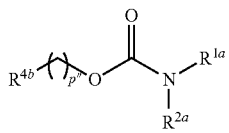

In the formulas, each of $R^{4a}$ and $R^{4b}$) independently represents a ring skeleton selected from benzene, biphenyl, indene, naphthalene, fluorene, anthracene, phenanthrene, xanthone, thioxanthone and anthraquinone; each of $R^{1a}$ and $R^{2a}$ independently represents an alkyl group of 1 to 15 carbon atoms or a cycloalkyl group of 1 to 15 carbon atoms; $R^{11a}$ represents an alkyl group of 1 to 5 carbon atoms; m" represents 0 or 1; n" represents 0 to 3; and each of p" represents 0 to 3.

In the formulas (C1-11) and (C1-12), $R^{4a}$ and $R^{4b}$ preferably have a nitro group as a substituent, in terms of base generation efficiency, and particularly preferably have the nitro group at ortho position thereof.

As $R^{1a}$ and $R^{2a}$ in terms of controlling the diffusion length of the base to be generated, a cycloalkyl group of 5 to 10 carbon atoms is preferred.

m" is preferably 1. n" is preferably 0 to 2. p" is preferably 0 or 1.

Specific examples of the component (C1) are shown below.

[Chemical Formula 82]

(C1-11-1)

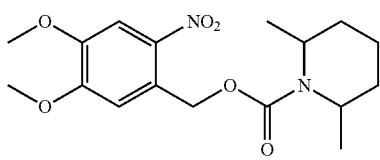

(C1-11-2)

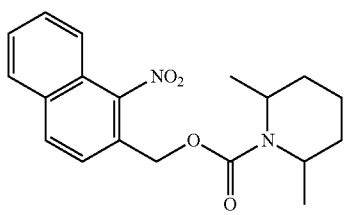

(C1-11-3)

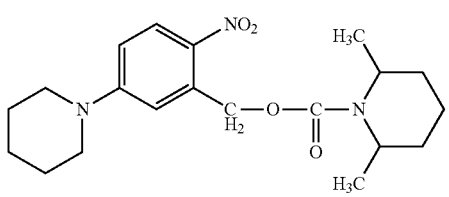

(C1-11-4)

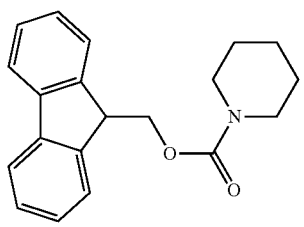

(C1-11-5)

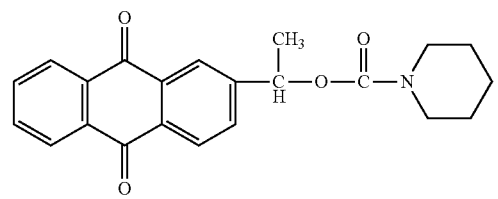

[Chemical Formula 83]

(C1-12-1)

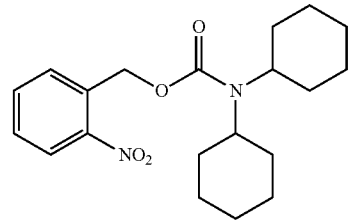

(C1-12-2)

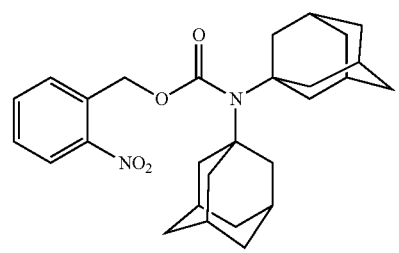

(C1-12-3)

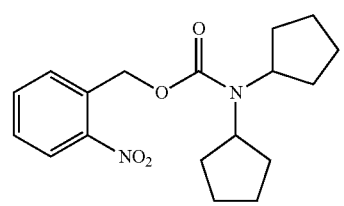

(C1-12-4)

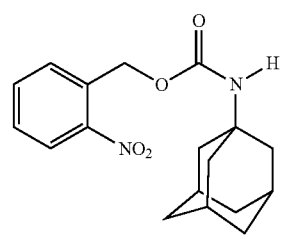

As a preferable example of the component (C), a compound represented by general formula (C2) shown below (hereafter, referred to as "component (C2)") can also be given.

After the component (C2) absorbs an exposure energy generated by an exposure treatment in the step (2), a trans double bond within a group represented by —CH=CH—C(=O)— is isomerized to a cis double bond, and cyclization reaction in the molecule occurs by heating, thereby generating a base represented by $NHR^{01}R^{02}$.

The component (C2) is preferable since the component (C2) generates base, and easily achieves an insoluble effect in the alkali developing solution in the step (4).

[Chemical Formula 84]

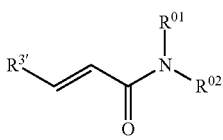

(C2)

In the formula (C2), $R^{O1}$ and $R^{O2}$ are the same as defined for $R^{O1}$ and $R^{O2}$ in the formula (C1); and $R^{3'}$ represents an aromatic cyclic group having a hydroxy group at ortho position.

In the formula (C2), $R^{O1}$ and $R^{O2}$ may be mutually bonded to form a cyclic group represented by the formula (II) together with the nitrogen atom adjacent to these groups. Preferable examples of $R^{O1}$ and $R^{O2}$ include the same groups as those described for $R^{1a}$ and $R^{2a}$ in the formula (C1-12).

As the aromatic cyclic group for $R^{3'}$, the same groups containing the aromatic ring as those described above for $R^{O3}$ in the formula (C1) can be mentioned, and as the ring skeleton, a benzene ring, a biphenyl ring, an indene ring, a naphthalene ring, a fluorene ring, an anthracene ring and a phenanthrene ring are preferable, and a benzene ring is more preferable.

The aromatic cyclic group for $R^{3'}$ may have a substituent other than the hydroxy group on the ortho position. Examples of the substituent include a halogen atom, a hydroxy group, a mercapto group, a sulfide group, a silyl group, a silanol group, a nitro group, a nitroso group, a sulfino group, a sulfo group, a sulfonate group, a phosphino group, a phosphinyl group, a phosphono group, a phosphonato group, an amino group, an ammonio group, and a monovalent organic group such as an alkyl group.

Specific examples of the component (C2) are shown below.

[Chemical Formula 85]

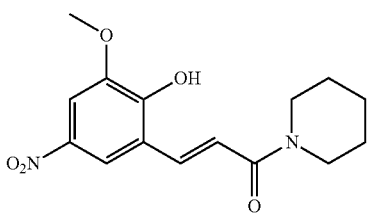

(C2-1)

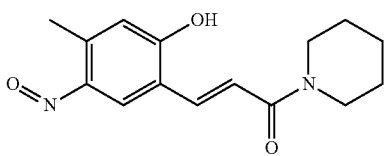

(C2-2)

As a preferable example of the component (C), a compound represented by general formula (C3) shown below (hereafter, referred to as "component (C3)") can also be given.

After the component (C3) absorbs an exposure energy generated by an exposure treatment in the step (2), a decarboxylation reaction of the component (C3) occurs, followed by reacting with water, and then an amine (base) is generated.

[Chemical Formula 86]

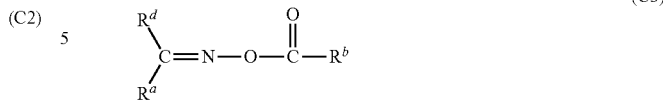

(C3)

In the formula, $R^a$ and $R^d$ represents a hydrogen atom or a hydrocarbon group of 1 to 30 carbon atoms which may have a substituent, provided that, in the case where both of $R^a$ and $R^d$ are hydrocarbon groups of 1 to 30 carbon atoms which may have a substituent, these groups are mutually bonded to form a ring; and $R^b$ represents an aryl group which may have a substituent or an aliphatic cyclic group which may have a substituent.

In the formula (C3), $R^a$ represents a hydrogen atom, or a hydrocarbon group of 1 to 30 carbon atoms which may have a substituent.

The hydrocarbon group of 1 to 30 carbon atoms which may have a substituent for $R^a$ may be an aromatic hydrocarbon group or an aliphatic hydrocarbon group.

Examples of the aromatic hydrocarbon group for $R^a$ include the same aromatic hydrocarbon groups as those described above for $X^3$ in the formula $X^3$-Q'- exemplified as a substituent for $R^{4''}$.

Examples of the aliphatic hydrocarbon group for $R^a$ include the same aliphatic hydrocarbon groups as those described above for $X^3$ in the formula $X^3$-Q'- exemplified as a substituent for $R^{4''}$.

In the case where $R^a$ in the formula (C3) represents a hydrocarbon group of 1 to 30 carbon atoms which may have a substituent, the group may form a ring together with the adjacent carbon atom. The ring structure to be formed may be either a monocyclic ring structure or a polycyclic ring structure. The number of carbon atoms including the adjacent carbon atom is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given, provided that the carbon atom bonded thereto is regarded as part of the ring.

In the formula (C3), $R^a$ is preferably a hydrogen atom, or a cyclic group which may have a substituent. The cyclic group may be either an aromatic hydrocarbon group which may have a substituent, or an aliphatic cyclic group which may have a substituent.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the formulas (L2) to (L6), (S3) and (S4) are preferable.

As the aromatic hydrocarbon group which may have a substituent, a naphthyl group which may have a substituent, or a phenyl group which may have a substituent is more preferable.

Examples of the aryl group for $R^b$ in the formula (C3) include the same aromatic hydrocarbon group as those described above for $R^a$ in the formula (C3), exclusive of an arylalkyl group. As the aryl group for $R^b$, a phenyl group is more preferable.

As the aliphatic cyclic group for $R^b$ in the formula (C3), the same aliphatic cyclic group as those described above for $R^a$ in the formula (C3) can be mentioned. The aliphatic cyclic group for $R^b$ is preferably an aliphatic polycyclic group, more preferably a group in which one or more hydrogen atoms have been removed from a polycycloalkane, and most preferably a group in which one or more hydrogen atoms have been removed from adamantane.

As the substituent which the aromatic hydrocarbon group and aliphatic cyclic group for $R^b$ may have, the same groups as those described above for $R^a$ in the formula (C3) can be given.

As $R^d$ in the formula (C3), the same groups as those described above for $R^a$ in the formula (C3) can be mentioned.

In the formula (C3), $R^d$ is preferably a cyclic group which may have a substituent.

The cyclic group may be either an aromatic hydrocarbon group which may have a substituent, or an aliphatic cyclic group which may have a substituent, and an aromatic hydrocarbon group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the formulas (L2) to (L6), (S3) and (S4) are preferable.

As $R^d$ in the formula (C3), a naphthyl group which may have a substituent, or a phenyl group which may have a substituent is more preferable, and most preferably a phenyl group which may have a substituent.

In the case where both of $R^a$ and $R^d$ in the formula (C3) represent a hydrocarbon group of 1 to 30 carbon atoms which may have a substituent, these groups are mutually bonded to form a ring. The ring structure to be formed may be either a monocyclic ring structure or a polycyclic ring structure. The number of carbon atoms including the carbon atom bonded to $R^a$ and $R^d$ in the formula (C3) is preferably 5 to 30, and more preferably 5 to 20.

Specifically, among the cyclic aliphatic hydrocarbon groups (aliphatic cyclic groups) for $R^a$ described above, aliphatic cyclic groups of 5 to 30 carbon atoms can be given, provided that the carbon atom bonded to $R^d$ and $R^d$ is regarded as part of the ring.

Specific examples of the component (C3) are shown below.

[Chemical Formula 87]

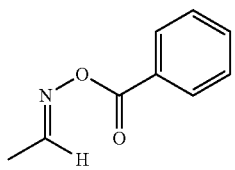

(C3-1)

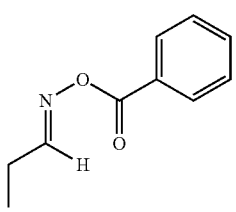

(C3-2)

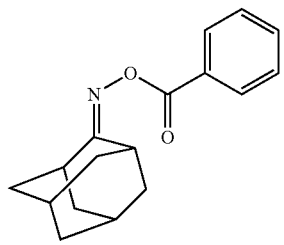

(C3-3)

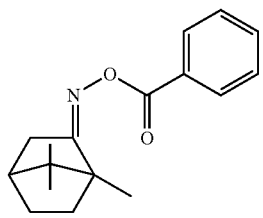

(C3-4)

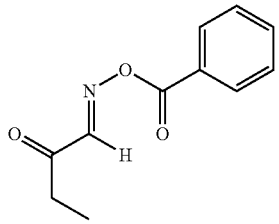

(C3-5)

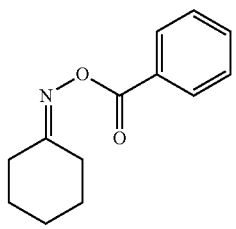

(C3-6)

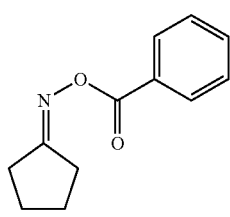

(C3-7)

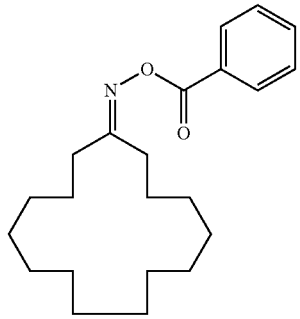

(C3-8)

163
-continued
(C3-9)
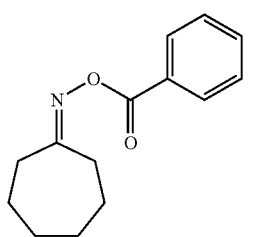
(C3-10)
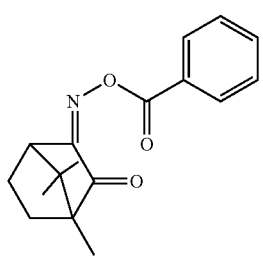
[Chemical Formula 88]
(C3-11)
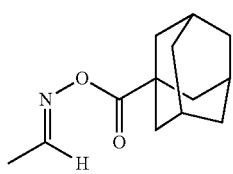
(C3-12)
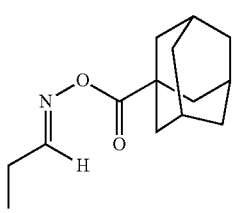
(C3-13)
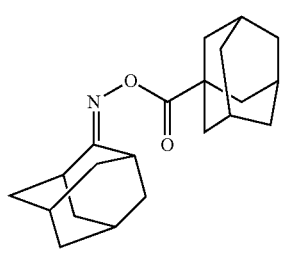
(C3-14)
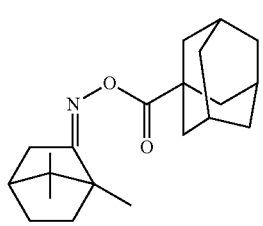
(C3-15)
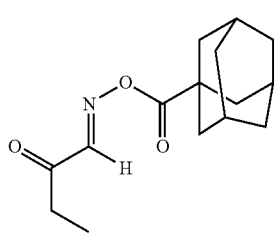
164
-continued
(C3-16)
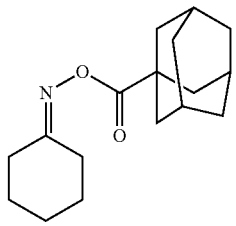
(C3-17)
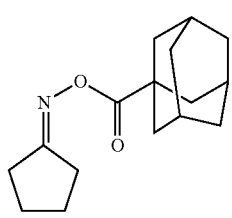
(C3-18)
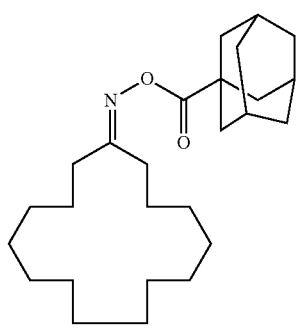
(C3-19)
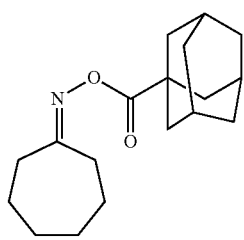
(C3-20)
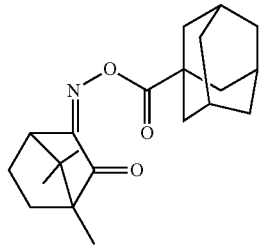
Further, as a preferable example of the component (C), the following compounds (C4) containing an acyloxyimino group can also be mentioned.

[Chemical Formula 89]

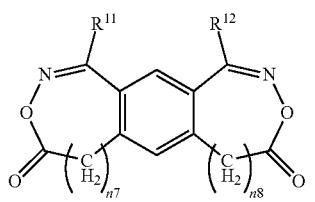
(C4-1)

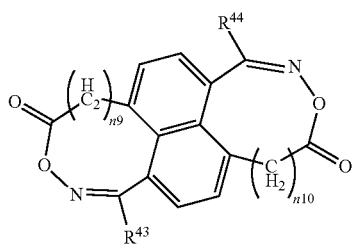
(C4-2)

In the formulas, $R^{11}$, $R^{12}$, $R^{43}$ and $R^{44}$ each independently represent a hydrogen atom and an alkyl group of 1 to 5 carbon atoms; and n7 to n10 each independently represent 0 to 3.

As the component (C) other than the aforementioned compounds, any of the conventional known photo base generators used in chemically amplified resist compositions can be used.

Examples of the photo base generator include an ionic photo base generator (anion-cation complex), a triphenylsulfonium compound and triphenylmethanol; photoactive carbamates such as benzylcarbamate and benzoincarbamate; amides such as o-carbamoylhydroxylamine, o-carbamoyloxime, an aromaticsulfoneamide, α-lactam and N-(2-allylethynyl)amide; oximeester, α-aminoacetophenone and cobalt complex; and a photo base generator disclosed in Japanese Unexamined Patent Application, First Publication No. 2007-279493.

As the component (C), one type of compound may be used alone, or two or more types of compounds may be used in combination.

Among these, as the component (C), the component (C1) is preferable, at least one compound selected from compounds represented by the general formula (C1-11) or (C1-12) is more preferable, and a compound represented by the general formula (C1-12) is particularly preferable.

When the resist composition according to the present invention contains the component (C), the amount of the component (C) relative to 100 parts by weight of the component (A) is preferably within a range from 0.05 to 50 parts by weight, more preferably from 1 to 30 parts by weight, and particularly preferably from 5 to 20 parts by weight.

When the amount of the component (C) is at least as large as the lower limit of the above-mentioned range, the film retention properties at the exposed portions of resist film become excellent and the resolution of resist pattern to be formed become excellent. On the other hand, when the amount of the component (C) is no more than the upper limit of the above-mentioned range, the transparency of the resist film can be maintained.

[Acid Proliferating Agent Component; Component (H)]

In the present invention, the component (H) is decomposed under action of acid and generates free acids, the component (H) is further decomposed under the action of free acids and further generates free acids. In this manner, a chained-decomposition of the component (H) proceeds under action of acid, and a large number of free acid molecules is generated.

The component (H) is not particularly limited, as long as it is decomposable by the action of acid, and is capable of further generating acid to self-catalytically proliferate acid. Preferable examples of the component (G) include compounds having a bridged-carbon ring skeleton structure.

The term "compound having a bridged carbon ring skeleton structure" refers to a compound having a structure constituted from bridged bonds between a plurality of carbon ring in the molecule (hereafter, referred to simply as "bridged carbon ring").

By virtue of bridged bonds, the molecule of the compound having a bridged carbon ring skeleton structure becomes rigid, and the thermal stability of the compound can be improved.

The number of carbon rings is preferably 2 to 6, and more preferably 2 or 3.

The bridged carbon ring may have part or all of the hydrogen atoms substituted with an alkyl group or an alkoxy group. The alkyl group preferably has 1 to 6 carbon atoms, more preferably 1 to 3 carbon atoms, and specific examples thereof include a methyl group, an ethyl group and a propyl group. The alkoxy group preferably has 1 to 6 carbon atoms, more preferably 1 to 3 carbon atoms, and specific examples thereof include a methoxy group and an ethoxy group. In addition, the bridged carbon ring may have a unsaturated bond such as a double bond.

In the present invention, it is most preferable that the bridged carbon ring has, on the ring thereof, a hydroxy group and a sulfonate group represented by general formula (Hs) shown below which is bonded to the carbon atom adjacent to the carbon atom having the hydroxy group bonded thereto.

[Chemical Formula 90]

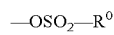  (Hs)

In the formula, $R^0$ represents an aliphatic group, an aromatic group or a heterocyclic group.

In the formula (Hs), $R^0$ represents an aliphatic group, an aromatic group or a heterocyclic group.

In the $R^0$, examples of the aliphatic group include a linear or cyclic alkyl group or a linear or cyclic alkenyl group, and the number of carbon atoms thereof is preferably 1 to 12, and more preferably 1 to 10.

The aromatic group may be either a monocyclic aromatic group or a polycyclic aromatic group, and specific examples thereof include an aryl group.

The heterocyclic group may be either a monocyclic group or a polycyclic group, and groups derived from conventionally known various heterocyclic compounds can be mentioned.

The aliphatic group, aromatic group and heterocyclic group may have a substituent. Examples of the substituent include a halogen atom, an alkyl group, an alkoxy group, an amino group, a substituted amino group and an oxygen atom (=O).

Specific examples of the aliphatic group and aromatic group include a methyl group, an ethyl group, a propyl group, a butyl group, an acyl group, a hexyl group, a vinyl group, a propylene group, an allyl group, a cyclohexyl group, a cyclooctyl group, a bycyclo hydrocarbon group, a tricyclo hydrocarbon group, a phenyl group, a tolyl group, a benzyl group, a phenethyl group, a naphthyl group, a naphthylmethyl group or substituted compound thereof.

Examples of the heterocyclic group include groups derived from various heterocyclic compounds, such as a 5-membered ring compound containing one hetero atom or a fused ring compound thereof (e.g., furan, thiophene, pyrrole, benzofuran, thionaphthene, indole or carbazole); a 5-membered ring compound containing two hetero atoms or a fused ring compound thereof (e.g., oxazole, thiazole or pyrazole); a 6-membered ring compound containing one hetero atom or a fused ring compound thereof (e.g., pyran, pyrone, coumarin, pyridine, quinoline, isoquinoline or acridine); and a 6-membered ring compound containing two hetero atoms or a fused ring compound thereof (e.g., pyridazine, pyrimidine, pyrazine or phthalazine).

In the present invention, in the case where the component (H) has a hydroxy group and a sulfonate group represented by the general formula (Hs) on the bridged carbon ring, the component (H) is decomposed under action of acid thereby instantly generating acid ($R^0SO_3H$).

In this manner, one decomposition reaction generates one acid, and in association with the decomposition reaction, the decomposition reaction proceeds at an accelerated rate, and a chained-decomposition of the component (H) proceeds.

The strength of the generated acid is preferably an acid dissociation constant (pKa) of 3 or less, and more preferably 2 or less. When pKa is 3 or less, the generated acid is likely to induce a self-decomposition. On the other hand, when the acid is weaker than the acid having a pKa of 3 or less, a self-decomposition is less likely to occur.

Examples of free acids ($R^0SO_3H$) generated by the aforementioned reaction include methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid, 2-naphthalenesulfonic acid, and the like.

Specific examples of the component (H) include compounds represented by general formulas (H1) to (H4) shown below (hereafter, these compounds corresponding to the general formulas are referred to as compounds (H1) to (H4), respectively).

In the formulas, $R^{51}$ represents a hydrogen atom, an aliphatic group or an aromatic group; and $R^{52}$ represents an aliphatic group, an aromatic group or a heterocyclic group.

In the general formulas (H1) to (H3), $R^{51}$ represents a hydrogen atom, an aliphatic group or an aromatic group. In the $R^{51}$, the aliphatic group and aromatic group is the same groups as described above for the aliphatic group and aromatic group for the aforementioned $R^0$. As $R^{51}$, an aliphatic group or an aromatic group is preferable, an aliphatic group is more preferable, a lower alkyl group is particularly preferable, and a methyl group is most preferable.

In the general formulas (H1) to (H4), $R^{52}$ represents an aliphatic group, an aromatic group or a heterocyclic group which is the same as those described above for $R^0$. As $R^{52}$, an aliphatic group or an aromatic group is preferable, and an aliphatic group is more preferable.

In the compounds (H1) to (H4), the compound (H1) has a cross-linking bond on 1st and 3rd positions of the bicyclo compound, the compounds (H2) and (H3) has a cross-linking bond on 1st and 4th positions of the bicyclo compound, and the compound (H4) has a cross-linking bond on 1st and 6th positions of the bicyclo compound (decalin).

Therefore, in the compounds (H1) to (H4), the conformational changes of the cyclohexane ring is highly suppressed, and the ring structure exhibits rigidity.

As the component (H), for example, a compound in which the bridged carbon has, on the ring thereof, a hydroxy group and a sulfonate group represented by general formula (Hs) bonded to the carbon atom adjacent to the carbon atom having the hydroxy group bonded thereto (such as the compounds (H1) to (H4)) can be readily synthesized by reacting a diol compound with a sulfonyl halide. The diol compound has two isomers, namely, cis-isomer and trans-isomer, but the cis-isomer is thermally stable, and is therefore preferably used. In addition, the compound can be stored stably as long as the acid does not coexist.

Specific examples of preferable component (H) are shown below.

[Chemical Formula 91]

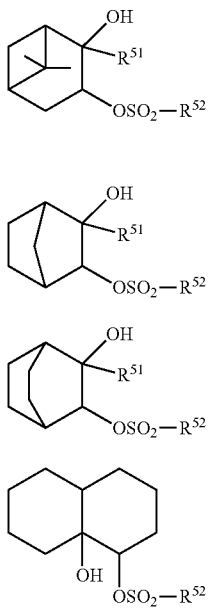

[Chemical Formula 92]

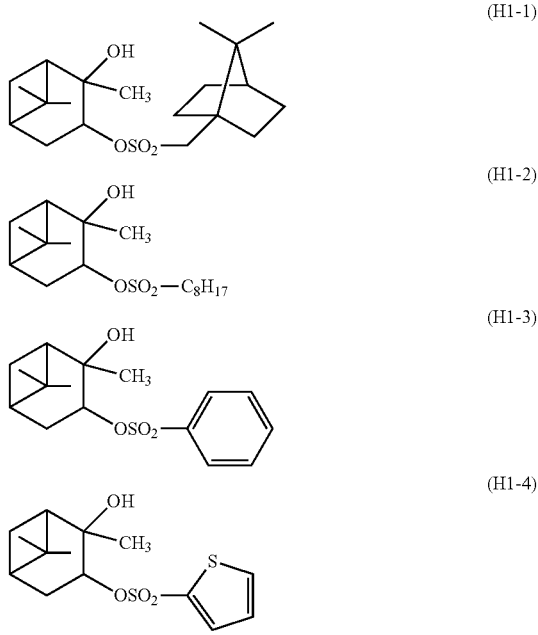

-continued

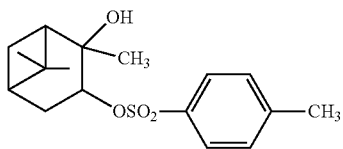
(H1-5)

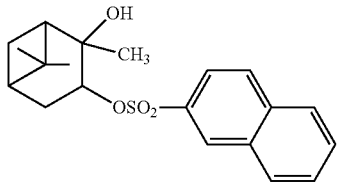
(H1-6)

[Chemical Formula 93]

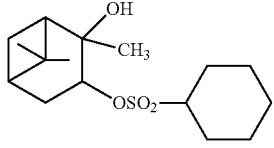
(H1-7)

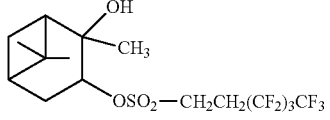
(H1-8)

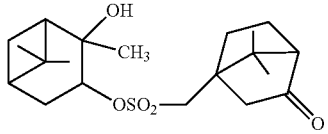
(H1-9)

[Chemical Formula 94]

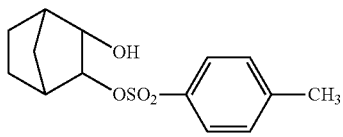
(H2-1)

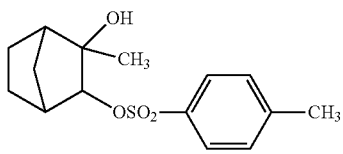
(H2-2)

Among these, as the component (H), in terms of effect of the present invention (resolution) and excellent lithography properties, the compounds (H1) and (H2) are preferable, and the compound (H1) is particularly preferred. Specifically, it is preferable to use at least one selected from the compounds represented by chemical formulas (H1-1) to (H1-9), and in particular, a compound represented by chemical formula (H1-9) is most preferable.

As the component (H), one type of compound may be used, or two or more types of compounds may be used in combination.

When the resist composition according to the present invention contains the component (H), the amount of the component (H) relative to 100 parts by weight of the component (A) is preferably 0.1 to 30 parts by weight, and more preferably 1 to 20 parts by weight. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

When the component (H) is used in combination with the component (G), the mixing ratio of the component (H) to the component (G) ((H)/(G)) in terms of molar ratio is preferably in the range of 9:1 to 1:9, more preferably in the range of 9:1 to 5:5, and particularly preferably 9:1 to 6:4. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

In addition, when the component (H) is used in combination with the component (B), the mixing ratio of the component (H) to the component (B) ((H)/(B)) in terms of molar ratio is preferably in the range of 9:1 to 1:9, more preferably in the range of 9:1 to 5:5, and particularly preferably 9:1 to 6:4. When the amount of the component (H) is at least as large as the lower limit of the above-mentioned range, the resolution can be enhanced. On the other hand, when the amount of the component (H) is no more than the upper limit of the above-mentioned range, the sensitivity becomes excellent.

[Fluorine Additive; Component (F)]

In the present invention, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870 can be used.

As the component (F), a polymer having a structural unit (f1-1) represented by general formula (f1-1) shown below can be used. The polymer is preferably a polymer (homopolymer) consisting of a structural unit represented by formula (f1-1) shown below; a copolymer of a structural unit represented by formula (f1-1) shown below and the aforementioned structural unit (a1); or a copolymer of a structural unit represented by formula (f1-1) shown below, a structural unit derived from acrylic acid or methacrylic acid and the aforementioned structural unit (a1). As the structural unit (a1) to be copolymerized with a structural unit represented by the formula (f1-1) shown below, a structural unit represented by the formula (a1-0-11) is preferable, a structural unit represented by the formula (a1-1-02) is more preferable, and a structural unit represented by the formula (a1-1-32) is particularly preferable.

[Chemical Formula 95]

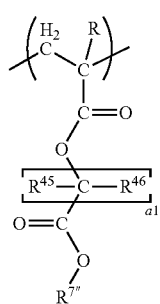
(f1-1)

In the formula, R is the same as defined above; each of $R^{45}$ and $R^{46}$ independently represents a hydrogen atom, a halogen atom, an alkyl group of 1 to 5 carbon atoms or a halogenated alkyl group of 1 to 5 carbon atoms, provided that the plurality of $R^{45}$ to $R^{46}$ may be the same or different from each other; a1 represents an integer of 1 to 5; and $R^{7\prime\prime}$ represents an organic group containing a fluorine atom.

In formula (f1-1), R is the same as defined above. As R, a hydrogen atom or a methyl group is preferable.

Examples of the halogen atom for $R^{45}$ and $R^{46}$ in the formula (f1-1) include a fluorine atom, a chlorine atom, a bromine atom and an iodine atom, and a fluorine atom is particularly desirable. Examples of the alkyl group of 1 to 5 carbon atoms for $R^{45}$ and $R^{46}$ include the same alkyl group of 1 to 5 carbon atoms as those defined above for R defined above, and a methyl group or an ethyl group is preferable. Specific examples of the halogenated alkyl group of 1 to 5 carbon atoms for $R^{45}$ or $R^{46}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly preferred. Among these, $R^{45}$ and $R^{46}$ are preferably a hydrogen atom, a fluorine atom or an alkyl group of 1 to 5 carbon atoms, and more preferably a hydrogen atom, a fluorine atom, a methyl group or an ethyl group.

In formula (f1-1), a1 represents an integer of 1 to 5, preferably an integer of 1 to 3, and more preferably 1 or 2.

In formula (f1-1), $R^{7\prime\prime}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and particularly preferably 1 to 10 carbon atoms.

The hydrocarbon group having a fluorine atom preferably has 25% or more of the hydrogen atoms within the hydrocarbon group fluorinated, more preferably 50% or more, and most preferably 60% or more, as the hydrophobicity of the resist film during immersion exposure is enhanced.

As $R^{7\prime\prime}$, a fluorinated hydrocarbon group of 1 to 5 carbon atoms is particularly preferable, and most preferably methyl group, —$CH_2$—$CF_3$, —$CH_2$—$CF_2$—$CF_3$, —$CH(CF_3)_2$, —$CH_2$—$CH_2$—$CF_3$ and —$CH_2$—$CH_2$—$CF_2$—$CF_2$—$CF_2$—$CF_3$.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight of the polymer is no more than the upper limit of the above-mentioned range, the resist composition exhibits a satisfactory solubility in a resist solvent. On the other hand, when the weight average molecular weight is at least as large as the lower limit of the above-mentioned range, the dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition of the present invention includes the component (F), the component (F) is used in an amount within a range from 0.5 to 10 parts by weight, relative to 100 parts by weight of the component (A).

[Amine; Component (D)]

In the resist composition according to the present invention, an amine (D) (hereafter referred to as "component (D)") may be added to the resist composition.

When the resist composition contains the component (G) as an acid supply component, in the resist composition liquid, the solubility of the component (A) in the alkali developing solution is likely to be increased by the action of the component (G). The occurrence of this phenomenon can be suppressed by controlling the acidity of the component (G) at an appropriate level, and also can be suppressed by adding the component (D) to reduce the acidity of the component (G) in the resist composition liquid. When the component (D) is used, it is preferable that raw materials such as the component (G) can be freely selected.

In addition, during storage of the resist composition, by virtue of the component (D), the storage stability after preparation of the resist composition liquid can be enhanced. Furthermore, by removing the component (D) from the resist film before neutralization in the step (3), lithography properties and pattern shape become particularly excellent, because the neutralization of base generated from the component (A) with the acid derived from the component (Z) in the step (3) is not suppressed by the component (D).

A multitude of these components (D) have already been proposed, and any of these known compounds may be used. It is particularly desirable that the pKa of the component (D) is equal or less than the pKa of the cation moiety of the component (G1). That is, the pKa of the component (D) is preferably 7 or less, and more preferably 6 or less.

When the resist composition contains the component (G1), it is more preferable that the pKa of the component (D) is equal or less than the pKa of the cation moiety of the component (G1) so as to prevent a cation of the component (G1) from exchanging with the component (D).

When the resist composition contains the component (G2), it is desirable that the basicity of the component (D) is low enough to suppress the extreme acidity deterioration of the component (G2), and the pKa of the component (D) is preferably 7 or less, and more preferably 6 or less.

As the component (D) which satisfies the above pKa, an amine in which one of "$H^+$" bonded to an nitrogen atom (N) has been removed from an amine represented by the formula (G1c-1) described in relation to the component (G1) can be mentioned. Specifically, a compound in which "$NH_3^+$" at the terminal of the specific examples of the compounds represented by the formulas (G1c-11) and (G1c-13) has been replaced by "$NH_2$"; and a compound in which "$NH^+$" within the ring in the specific examples of the compounds represented by the formula (G1c-12) has been replaced by "N" are preferable.

In addition, it is desirable that the component (D) is an amine having a relatively low boiling point. By virtue of the amines having a relatively low boiling point, when forming a resist film on a substrate in the step (1), the component (D) can be easily removed from the resist film.

As the component (D) which satisfies the above boiling point, an amine having a boiling point of 130° C. or lower is preferable, and an amine having a boiling point of 100° C. or lower is more preferable, and an amine having a boiling point of 90° C. or lower is particularly preferable.

Specific examples of amines which satisfies the above pKa and boiling point, aliphatic amine compounds having a fluorinated alkyl group such as trifluoroethylamine (2,2,2-trifluoroethylamine), pentafluoropropylamine (2,2,3,3,3-pentafluoropropylamine), heptafluorobutylamine (1H,1H-heptafluorobutylamine), nonafluoropentylamine (1H,1H- nonafluoropentylamine), undecafluorohexylamine (1H,1H-undecafluorohexylamine), his (2,2,2-trifluoroethyl)amine, bis(2,2,3,3,3-pentafluoropropyl)amine, and 1-(2,2,2-trifluoroethyl)pyrrolidine; pyridine-based compound such as pyridine and pentafluoropyridine; and oxazole-based compound such as oxazole and isoxazole.

As the component (D), one type of compound may be used alone, or two or more types may be used in combination.

When the resist composition according to the present invention contains the component (D), the amount of the component (D) relative to 100 parts by weight of the component (A) is preferably within a range from 0.01 to 20.0 parts by weight, more preferably from 1 to 15 parts by weight, and particularly preferably from 2 to 10 parts by weight. By ensuring the above-mentioned range, the storage stability is improved and lithography properties and resist pattern shape are also improved.

In the present invention, if desired, other miscible additives can also be added to the resist composition. Examples of such miscible additives include additive resins for improving the performance of the resist film, surfactants for improving the applicability, dissolution inhibitors, plasticizers, stabilizers, colorants, halation prevention agents, dyes, and base amplifiers.

As the sensitizers, conventional sensitizers can be contained in the resist composition, and specific examples thereof include benzophenone-type sensitizers, such as benzophenone and p,p'-tetramethyldiaminobenzophenone; carbazole-type sensitizers; acetophen-type sensitizers; naphthalene-type sensitizers; phenol-type sensitizers; anthracene-type sensitizers, such as 9-ethoxyanthracene; biacetyl; eosin; rose bengal; pyrene; phenothiazine; and anthrone. In the resist composition, the amount of the sensitizer, relative to 100 parts by weight of the component (A) is preferably from 0.5 to 20 parts by weight.

A base amplifier is decomposed by the action of a base in a chain reaction, and is capable of generating a large amount of base using a small amount of base. Therefore, by blending a base amplifier, the sensitivity of the resist composition can be improved. As the base amplifier, for example, those described in Japanese Unexamined Patent Application, First Publication No. 2000-330270 and Japanese Unexamined Patent Application, First Publication No. 2008-174515 can be used.

[Organic Solvent Component; Component (S)]

The resist composition used for the present invention can be prepared by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among the aforementioned examples, PGMEA, PGME, cyclohexanone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of PGMEA, EL, or PGMEA with a polar solvent and a mixed solvent of PGMEA, EL, or PGMEA with γ-butyrolactone are also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The resist composition according to the present invention described above can be used satisfactorily when forming a negative-tone resist pattern in an alkali developing process.

In the present invention, a resist film is formed by applying a resist composition containing a base component (A) which generates base upon exposure and exhibits increased solubility in an alkali developing solution by the action of acid to a substrate, and the resist film is then subjected to exposure, and then bake (PEB) is conducted. During this process, at the exposed portions of the resist film, an acid provided to the resist film in advance is neutralized by the base generated from the component (A) upon exposure, and the solubility of the base component (A) in an alkali developing solution is either unchanged or only slightly changed. On the other hand, at the unexposed portions of the resist film, the solubility of the base component (A) in an alkali developing solution is increased by the action of acid. Therefore, the resist film after PEB is subjected to an alkali development, the unexposed portion of the resist film is dissolved and removed, and thereby forming a negative-tone resist pattern.

The base component (A) used in the present invention exhibits increased solubility in an alkali developing solution under action of acid and generates base upon exposure. By the base component containing a part generating base upon exposure (base-generating part), base generated at exposed portions of the resist film has a short diffusion length so as to react with acid at exposed portion effectively, and a difference (dissolution contrast) between the exposed portions and the unexposed portions can be enhanced. In addition, the base-generating part is uniformly distributed in the resist film, the neutralization reaction with acid at exposed portions is likely to occur with uniformity. The synergistic effect of these, when forming a resist pattern using a resist composition of the present invention, a resist pattern with high resolution, excellent lithography properties such as exposure latitude (EL margin), reduced roughness and excellent pattern shape can be formed.

Furthermore, the resist composition according to the present invention can be preferably used in a step (1) of the method of forming a resist pattern containing steps (1) to (4) described later.

<<Method of Forming a Resist Pattern>>

The method of forming a resist pattern according to the present invention includes: a step (1) in which a resist composition containing a base component (A) that generates base upon exposure and exhibits increased solubility in an alkali developing solution by the action of acid is applied to a substrate to form a resist film; a step (2) in which the resist film is subjected to exposure; a step (3) in which baking is conducted after the step (2), such that, at an exposed portion of the resist film, the base generated from the base component (A) upon the exposure and an acid provided to the resist film in advance are neutralized, and at an unexposed portion of the resist film, the solubility of the base component (A) in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed.

In the method of forming a resist pattern according to the present invention, it is preferable that the base component (A) contains a polymeric compound having a structural unit (a51) represented by general formula (a5-1) shown below.

It is preferable that the polymeric compound has a structural unit (a1) containing an acid decomposable group that exhibits increased polarity by the action of acid. In addition, in the method of forming a resist pattern according to the present invention, it is preferable that the resist composition includes an acidic compound component or an acid generator component.

[Chemical Formula 96]

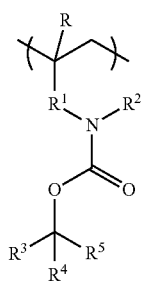

(a5-1)

In the formula, R represents a hydrogen atom, an alkyl group of 1 to 5 carbon atoms or a halogenated alkyl group of 1 to 5 carbon atoms; $R^1$ represents a single bond or a divalent linking group; $R^2$ represents a hydrogen atom, a linear, branched or cyclic alkyl group of 1 to 10 carbon atoms or an aryl group of 6 to 10 carbon atoms, $R^1$ and $R^2$ may be bonded to form a ring with the nitrogen atom having $R^1$ and $R^2$ bonded thereto, and an alkyl group or an aryl group for $R^2$ may have a substituent; $R^3$, $R^4$ and $R^5$ each independently represents a hydrogen atom, a linear, branched or cyclic alkyl group of 1 to 10 carbon atoms or an aryl group of 6 to 14 carbon atoms, $R^3$ and $R^4$, $R^4$ and $R^5$ or $R^3$ and $R^5$ may be bonded to form a ring with a carbon atom having these groups bonded thereto, and an alkyl group or an aryl group for $R^3$, $R^4$ and $R^5$ may have a substituent, provided that $R^3$, $R^4$ and $R^5$ do not all represent a hydrogen atom or an alkyl group at the same time.

In the method of forming a resist pattern according to the present invention, as the resist composition used in the step (1), the same resist composition as those described above can be mentioned.

The base component (A) is the same as those described above for the component (A) in relation to the resist composition of the present invention.

Hereinbelow, the method of forming a resist pattern according to the present invention will be described, with reference to the drawings. However, the present invention is not limited to these embodiments.

First Embodiment

FIG. 1 shows an example of one embodiment of the method of forming a resist pattern according to the present invention.

In this embodiment, a resist composition containing a base component (A) which generates base upon exposure and exhibits increased solubility in an alkali developing solution by the action of acid (component (A)) and an acidic compound component (component (G)) as an acid supply component (component (Z)) is used.

Firstly, as shown in FIG. 1(a), the resist composition is applied to a substrate 1 to form a resist film 2 (step (1); FIG. 1(a)).

Next, as shown in FIG. 1(b), the resist film 2 is subjected to exposure through a photomask 3 having a predetermined pattern formed thereon. As a result, in the exposed region (exposed portions) of the resist film 2, a base is generated from the component (A) upon exposure (step (2); FIG. 1(b)).

After exposure, baking (post exposure bake (PEB)) is conducted. By this baking, at the unexposed portions 2b of the resist film 2, the solubility of the base component (A) in an alkali developing solution can be increased by the action of acid (component G)) provided to the resist film 2 in advance by adding the component (G) to the resist composition. On the other hand, at exposed portions 2a of the resist film 2, a neutralization reaction between the base generated from the component (A) upon exposure and the acid provided to the resist film 2 proceeds, so that the solubility of the base component (A) in an alkali developing solution is either unchanged or only slightly changed. As a result, a difference in the dissolution rate in an alkali developing solution (dissolution contrast) occurs between the exposed portions 2a and the unexposed portions 2b (step (3); FIG. 1(c)).

Thereafter, developing is conducted using an alkali developing solution. By conducting development, the exposed portions 2a of the resist film 2 remains, and the unexposed portions 2b of the resist film 2 are dissolved and removed. As a result, as shown in FIG. 1(d), a resist pattern including a plurality of resist patterns arranged at intervals is formed on the substrate 1 (step (4); FIG. 1(d)).

[Step (1)]

In this embodiment, a resist film 2 is formed by applying a resist composition containing a base component (A) which generates base upon exposure and exhibits increased solubility in an alkali developing solution by the action of acid (component (A)) and an acidic compound component (component (G)) as an acid supply component (component (Z)) to a substrate 1.

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used, and a substrate provided with an organic film on the surface thereof is preferred. As the inorganic film, an inorganic antireflection film (inorganic BARC) can be used. As the organic film, an organic antireflection film (organic BARC) and an organic film such as a lower-layer organic film used in a multilayer resist method can be used. When an organic film is provided, a pattern can be formed on the substrate with a high aspect ratio, and is useful in the production of semiconductors.

Here, a "multilayer resist method" is method in which at least one layer of an organic film (lower-layer film) and at least one layer of a resist film are provided on a substrate, and a resist pattern formed on the upper resist film is used as a mask to conduct patterning of the lower-layer film. This method is considered as being capable of forming a pattern with a high aspect ratio. The multilayer resist method is broadly classified into a method in which a double-layer structure consisting of an upper-layer resist film and a lower-layer film is formed, and a method in which a multilayer structure having at least three layers consisting of an upper-layer resist film, a lower-layer film and at least one intermediate layer (thin metal film or the like) provided between the upper-layer resist film and the lower-layer film. In the multilayer resist method, a desired thickness can be ensured by the lower-layer film, and as a result, the thickness of the resist film can be reduced, and an extremely fine pattern with a high aspect ratio can be formed.

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film forming material, coating the organic film forming material on a substrate using a spinner or the like, and baking under heating conditions preferably in the range of 200 to 300° C. for 30 to 300 seconds, more preferably for 60 to 180 seconds. The organic film forming material does not need to have susceptibility to light or electron beam like a resist film, and the organic film forming material may or may not have such susceptibility. More specifically, a resist or a resin generally used in the production of a semiconductor device or a liquid crystal display device can be used.

Further, it is preferable that the organic film forming material can be subjected to etching, particularly dry etching, so that, by etching the organic film using a resist pattern, the resist pattern can be transferred to the organic film, and an organic film pattern can be formed. It is particularly desirable to use an organic film forming material which can be subjected to oxygen plasma etching or the like. As such an organic film forming material, a material conventionally used for forming an organic film such as an organic BARC can be used. Examples of such an organic film forming material include the ARC series manufactured by Brewer Science Ltd., the AR series manufactured by Rohm and Haas Company, and the SWK series manufactured by Tokyo Ohka Kogyo Co., Ltd.

In this embodiment, the acidic compound (component (G)) contained in the resist composition acts as an acid by baking (PEB) in the step (3) described later. During this process, at the exposed portions 2a of the resist film 2, the acid (acidic compound) is neutralized by the base generated from the component (A) upon exposure, and the solubility of the component (A) in an alkali developing solution is either unchanged or only slightly changed. On the other hand, at the unexposed portions 2b of the resist film 2, the solubility of the base component (A) in an alkali developing solution is increased by the action of acid (acidic compound).

The detailed description of the resist composition is the same as those described above for the resist composition of the present invention.

The method of applying the resist composition to the substrate 1 to form a resist film 2 is not particularly limited, and the resist film 2 can be formed by a conventional method.

For example, the resist composition can be applied to the substrate 1 by a conventional method such as spincoat method using a spin coater or barcoat method using a barcoater, followed by drying on a cooling plate at room temperature or conducting prebake (PEB), thereby forming a resist film 2.

In the present invention, the term "prebake" means a heat treatment which is conducted on a hot plate at 70° C. or higher between applying the resist composition to a substrate and conducting exposure.

When conducting prebake treatment, the temperature condition is preferably 80 to 150° C., and more preferably 80 to 100° C. The prebake time is preferably 40 to 120 seconds, and more preferably 60 to 90 seconds. When conducting prebake, even if the thickness of the resist film is thick, the organic solvent is easily vaporized.

By drying the resist composition at a room temperature and not conducting prebake, it is possible to reduce the number of steps for forming a resist pattern and to enhance the resolution of obtained resist pattern.

The presence or absence of the prebake can be appropriately determined in view of the aforementioned advantages, depending on the raw materials of the resist composition to be used, or depending on the target of the pattern to be formed.

The thickness of the resist film 2 formed in the step (1) is preferably 50 to 500 nm, and more preferably 50 to 450 nm. By ensuring that the thickness of the resist film satisfies the above-mentioned range, a resist pattern with a high level of resolution can be formed, and a satisfactory level of etching resistance can be achieved.

In addition, when not conducting prebake, the thickness of the resist film formed in the step (1) is preferably 300 nm or less, more preferably 200 nm or less, and particularly preferably 50 to 150 nm. When the thickness of the resist film 2 is no more than the upper limit of the above-mentioned range, even if prebake is not conducted, an organic solvent is less likely to be remained and likely to be vaporized by an application such as spin-coating at a room temperature, and hence, film thickness uniformity of the resist film 2 (in-plane uniformity of the substrate 1) is enhanced. The effect obtained by not conducting prebake can be prominently obtained especially in the case of thin resist film.

[Step (2)]

In the present embodiment, the resist film 2 formed in the step (1) is selectively exposed through a photomask 3. As a result, at exposed portions 2a, a base is generated from the component (A) upon exposure.

With respect to the exposure dose, an amount capable of generating a base from the component (A) in an amount necessary to neutralize the acid present in the exposed portions $2a$ is sufficient.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays. In terms of forming a fine resist pattern, ArF excimer laser, EUV or EB is preferable, and ArF excimer laser is particularly desirable.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used. The unexposed portions can be selectively formed by using a halftone-phase shift mask.

As a binary mask, those in which a chromium film, a chromium oxide film, or the like is formed as a light shielding portion on a quartz glass substrate are generally used.

A phase shift mask is a photomask provided with a portion (shifter) which changes the phase of light. Thus, by using a phase shift mask, incidence of light to unexposed portions can be suppressed, and the dissolution contrast to an alkali developing solution can be improved between unexposed portions and exposed portions. As a phase shift mask other than a halftone-phase shift mask, a Levenson-phase shift mask can be mentioned. As any of these phase shift masks, commercially available masks can be used.

Specific examples of the half-tone type phase shift masks include those in which an MoSi (molybdenum silicide) film, a chromium film, a chromium oxide film, an oxynitriding silicon film, or the like is formed as a light shielding portion (shifter) exhibiting a transmittance of about several 10% (generally 6%) on a substrate generally made of quartz glass.

In the present embodiment, exposure is conducted through a photomask 3, but the present invention is not limited to this embodiment. For example, the exposure may be conducted without using a photomask 3, e.g., selective exposure by drawing with electron beam (EB) or the like.

The exposure of the resist film 2 can be either a general exposure (dry exposure) conducted in air or an inert gas such as nitrogen, or immersion exposure (immersion lithography) through an immersion medium. In step (2), in terms of forming a resist pattern with a high resolution, it is preferable to conduct exposure through an immersion medium.

In immersion lithography, exposure (immersion exposure) is conducted in a state where the region between the lens and the resist film 2 formed on the substrate 1 (which was conventionally filled with air or an inert gas such as nitrogen) is filled with a solvent (a immersion medium) that has a larger refractive index than the refractive index of air.

More specifically, in immersion lithography, the region between the resist film 2 formed in the above-described manner and lens at the lowermost portion of the exposure apparatus is filled with a solvent (an immersion medium) that has a larger refractive index than the refractive index of air, and in this state, the resist film 2 is subjected to exposure (immersion exposure) through a predetermined photomask 3.

The immersion medium preferably exhibits a refractive index larger than the refractive index of air but smaller than the refractive index of the resist film 2 to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film 2 include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the immersion medium after the exposure can be removed by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

compounds and perfluoroalkylamine compounds. Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

[Step (3)]

In the present embodiment, after the step (2), baking (post exposure bake (PEB)) is conducted.

In the baking, the temperature conditions is preferably from 50 to 200° C., more preferably from 80 to 150° C., and still more preferably from 90 to 130° C. The baking time is preferably from 10 to 300 seconds, more preferably from 40 to 120 seconds, and still more preferably from 60 to 90 seconds.

In this manner, by conducting baking of the resist film 2 after exposure, in the entire the resist film 2, the acidic compound blended in the resist composition acts as an acid, and at the unexposed portions $2b$ of the resist film 2, the solubility of the base component (A) in an alkali developing solution can be increased by the action of acid (acidic compound). On the other hand, at exposed portions $2a$, a neutralization reaction between the base generated from the component (A) upon exposure and the acid (acidic compound) proceeds, so that the amount of acid to act on the base component (A) decreases. As a result, at exposed portions, the solubility of the base component (A) in an alkali developing solution is either unchanged or only slightly changed. As a result, a difference in the dissolution rate in an alkali developing solution (dissolution contrast) occurs between the exposed portions $2a$ and the unexposed portions $2b$.

It is noted that the bake treatment in the step (3) is not necessary a treatment to control the beginning of neutralization reaction.

[Step (4)]

In the present embodiment, after the step (3), by conducting alkali developing, the unexposed portions $2b$ of the resist film 2 are dissolved and removed, and the exposed portions $2a$ are retained, thereby forming a negative resist pattern.

Specific examples of the alkali developing solution include inorganic alkalis, such as sodium hydroxide, potassium hydroxide, sodium carbonate, sodium silicate, sodium metasilicate and aqueous ammonia; primary amines, such as ethylamine and n-propyl amine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide and tetraethylammonium hydroxide; and cyclic amines, such as pyrrole and piperidine.

Among these examples, as the alkali developing solution, an aqueous alkali solution containing at least one member selected from the group consisting of primary amines, secondary amines, tertiary amines and quaternary ammonium salts is preferable, and an aqueous solution of tetramethylammonium hydroxide (TMAH) is particularly desirable.

Further, the aforementioned aqueous alkali solution having alcohols, surfactants added thereto in an appropriate amount may be used.

In general, the alkali concentration within the alkali developing solution (i.e., concentration of inorganic alkalis, quaternary ammonium salts or amine compounds, based on the total weight of the alkali developing solution) is from 0.01 to 20% by weight.

The alkali developing treatment can be conducted by a conventional method.

After the alkali developing, a rinse treatment using pure water or the like can be conducted.

Further, after the alkali developing, post bake treatment may be conducted. Post bake (which is performed in order to remove water content after the alkali developing and rinsing) is generally conducted at about 100° C. preferably for 30 to 90 seconds.

In the aforementioned first embodiment, a resist composition containing an acidic compound (component (G)) as an acid supply component (Z) is used, and a resist composition containing an acid generator component (B) (thermal acid generator or photo acid generator) as an acid supply component (Z) instead of the component (G) or together with the component (G) may be used. In addition, an acid proliferating agent component (H) may be used together with at least one of the component (G) or the component (B), since the concentration of acid when conducting a bake treatment such as PEB is enhanced.

As the component (B), one or both a component which generates acid by heating (thermal acid generator) and a component which generates acid upon exposure (photo acid generator) can be used.

In the case where the thermal-acid generator component is used as the component (B), an acid is generated from the thermal-acid generator component in the entire resist film 2 by the bake treatment (PEB) in the step (3). At the unexposed portions 2b in the resist film 2, the solubility of the base component (A) in an alkali developing solution can be increased by the action of acid generated from the thermal acid generator by bake treatment (PEB). On the other hand, at exposed portions 2a in the resist film 2a, a neutralization reaction between the acid generated from the thermal acid generator by baking (PEB) and the base generated from the component (A) upon exposure in the aforementioned step (2) proceeds, and the solubility of the base component (A) in an alkali developing solution is either unchanged or only slightly changed. As a result, a difference in the dissolution rate in an alkali developing solution (dissolution contrast) occurs between the exposed portions 2a and the unexposed portions 2b.

When a resist composition containing a thermal acid generator is used, it is preferable that the aforementioned prebake is not performed. By not conducting a prebake treatment, an acid derived from the thermal acid generator does not act on the base component (A) after applying the resist composition on a substrate and before conducting exposure. As a result, the contrast between exposed portions 2a and unexposed portions 2b in the resist film 2 is increased, and hence, a negative pattern having a high resolution is easily formed.

In addition, when the type of photomask, base component (A) and the like are appropriately selected, a photo acid generator can be used as an acid generator component (B). For example, an embodiment in which a resist composition containing a photo acid generator having a relatively long diffusion length and a component (A) which generates base having a relatively short diffusion length is used, and a photomask having a transparency (halftone-phase shift mask) is used as a photomask can be mentioned. The diffusion length of the acid can be adjusted by controlling the skeleton or polarity of an anion moiety of an photo-acid generator, whereas the diffusion length of base can be adjusted by controlling the molar weight or skeleton of the base generated from the component (A) after a photo decomposition.

In the embodiment, at exposed portions 2a, a base is generated from the component (A) and an acid is generated from a photo acid generator upon exposure in the step (2). At the unexposed portions 2b, the protecting group within the base component (A) is dissociated (deprotection reaction is proceeded) by the action of acid which is generated at the exposed portions 2a and diffused to the unexposed portions 2b by baking in the step (3), thereby increasing the solubility of the base component (A) in an alkali developing solution. On the other hand, at exposed portions 2a, a neutralization reaction between the base generated from the component (A) and the acid generated in the step (2) proceeds, and the solubility of the base component (A) in an alkali developing solution is either unchanged or only slightly changed. As a result, a difference in the dissolution rate in an alkali developing solution (dissolution contrast) occurs between the exposed portions 2a and the unexposed portions 2b.

Second Embodiment

Figure 2:
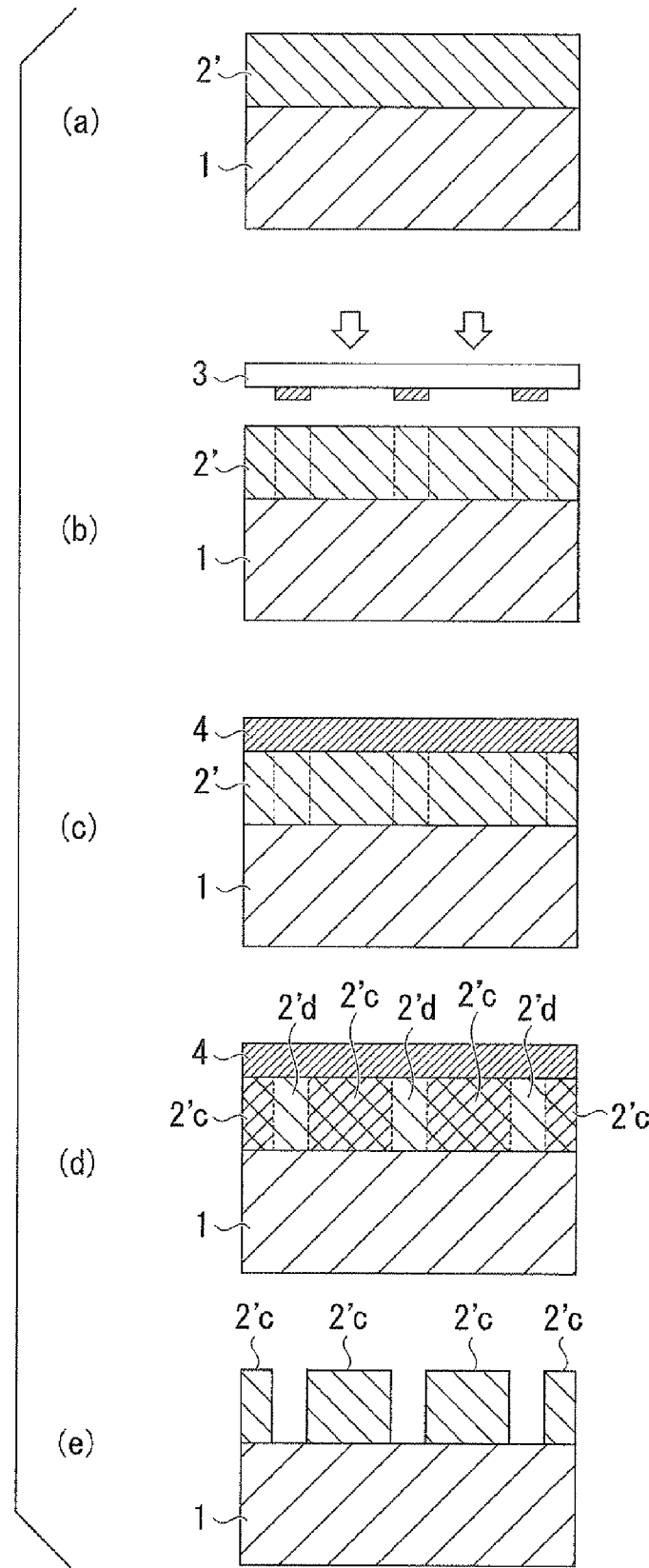
FIG. 2 is a schematic diagram showing an example of another embodiment of the method of forming a resist pattern according to the present invention.

FIG. 2 shows an example of another embodiment of the method of forming a resist pattern according to the present invention.

In this embodiment, a resist composition containing a base component (A) which generates base upon exposure and exhibits increased solubility in an alkali developing solution by the action of acid (component (A)), and an organic film-forming composition containing the acidic compound component (G) are used.

Firstly, as shown in FIG. 2(a), the resist composition is applied to a substrate 1 to form a resist film 2' (step (1); FIG. 2(a)).

Next, as shown in FIG. 2(b), the resist film 2' is subjected to exposure through a photomask 3 having a predetermined pattern formed thereon. As a result, in the exposed region (exposed portions) of the resist film 2', a base is generated from the component (A) upon exposure (step (2); FIG. 2(b)).

After exposure, the organic film-forming composition is applied to the resist film 2' (step (5); FIG. 2(c)).

Subsequently, a bake treatment (PEB) is conducted. As a result, an organic film 4 is formed, and the acidic component contained in the organic film 4 is diffused to the resist film 2', thereby providing the acid to the resist film 2'. As a result, in the exposed portions 2' c of the resist film 2', a base generated from the component (A) upon exposure is neutralized by an acid provided from the organic film 4. Thus, the solubility of the base component (A) in an alkali developing is either unchanged or only slightly changed. On the other hand, at the unexposed portions 2' d, the solubility of the base component (A) in an alkali developing solution can be increased by the action of acid provided from the organic film 4. As a result, a difference in the dissolution rate in an alkali developing solution (dissolution contrast) occurs between the exposed portions 2'c and the unexposed portions 2'd (step (3); FIG. 2(d)).

Thereafter, developing is conducted using an alkali developing solution. By conducting development, the exposed portions 2c' of the resist film 2' remain, and the unexposed portions 2'd of the resist film 2' are dissolved and removed. As a result, as shown in FIG. 2(e), a resist pattern including a plurality of resist patterns arranged at intervals is formed on the substrate 1 (step (4); FIG. 2(e)).

[Step (1) and Step (2)]

The step (1) and the step (2) in this embodiment can be performed in the same manner as in the step (1) and the step (2) in the aforementioned first embodiment, respectively. Provided that, the resist composition used in this embodiment may not contain the acid supply component (Z).

[Step (5)]

In this embodiment, after the step (2), an organic film-forming composition containing an acidic compound component (G) is applied to the resist film 2' by a conventional method, e.g., a method using a spinner or the like. In this manner, an organic film-forming composition is applied to the resist film 2' and the resist film 2' is allowed to come into contact with the component (G) in a step prior to the step (3) described below, thereby enabling to provide the acid to the resist film 2' by the baking in the step (3).

The coating conditions of the organic film-forming composition is adjusted to depending on the desired film thickness of the organic film 4.

The thickness of the organic film 4 can be appropriately selected depending on the types of the component (G) blended to the organic film-forming composition or the conditions of process such as immersion exposure. The thickness is preferably 10 to 300 nm, more preferably 20 to 200 nm, and still more preferably 30 to 150 nm. When the thickness of the organic film 4 is within the above-mentioned range, a satisfactory amount of acid can be provided to the resist film 2', and a resist pattern can be reliably formed with a high resolution.

The specific examples of the organic film-forming composition will be described later.

[Step (3)]

In the present embodiment, after the step (5), baking (post exposure bake (PEB)) is conducted.

The step (3) in this embodiment can be performed in the same manner as in the step (3) in the aforementioned first embodiment.

By virtue of PEB an organic film 4 is formed on the resist film 2', and the component (G) contained in the organic film 4 is diffused to the resist film 2', thereby providing the acid to the resist film 2'. At the unexposed portions 2'd in the resist film 2', the solubility of the base component (A) in an alkali developing solution can be increased by the action of acid provided from the organic film 4. On the other hand, at exposed portions 2'c, a neutralization reaction between the base generated from the component (A) upon exposure and the acid provided from the organic film 4 proceeds, so that the amount of acid to act on the base component (A) decreases. As a result, the solubility of the base component (A) in an alkali developing is either unchanged or only slightly changed. As a result, a difference in the dissolution rate in an alkali developing solution (dissolution contrast) occurs between the exposed portions 2'c and the unexposed portions 2'd.

In the case where the step (5) is conducted prior to the step (2) when an organic film-forming composition containing a photo acid generator component as an acid supply component (Z) in addition to the component (G), an acid is generated from the photo acid generator component upon exposure in the step (2). The acid is supplied to the resist film 2' in the step (3) as well as the component (G). At exposed portions, the acid is neutralized with a base generated from the component (A) or diffused to unexposed portions 2d' from exposed portions 2c' by PEB and then acts on the base component (A) thereby increasing the solubility of the base component (A) in an alkali developing solution.

When the resist composition contains a thermal acid generator component as an component (Z) in addition to the component (G), an acid is generated from the thermal acid generator component by PEB in this step. The acid is supplied to the resist film 2' in the step (3) as well as the component (G). At exposed portions, the acid is neutralized with a base generated from the component (A) or diffused to unexposed portions 2d' from exposed portions 2c' by PEB and then acts on the base component (A) thereby increasing the solubility of the base component (A) in an alkali developing solution.

By obtaining a dissolution contrast, when conducting an alkali developing in the step (4) described later, a negative resist pattern having high resolution can be formed.

It is noted that the bake treatment in the step (3) is not necessary a treatment to control the beginning of neutralization reaction.

[Step (4)]

In the present embodiment, after the step (3), by conducting alkali developing, the unexposed portions 2'd of the resist film 2' are dissolved and removed, and the exposed portions 2'c are retained, thereby forming a negative resist pattern.

As the alkali developing solution, the same as those described above can be used.

The alkali developing can be conducted by a conventional method, for example, using a tetramethylammonium hydroxide (TMAH) solution having a concentration of 0.1 to 10% by weight.

After the alkali developing, a rinse treatment using pure water or the like can be conducted.

Further, after the alkali developing, post bake treatment may be conducted. Post bake (which is performed in order to remove water content after the alkali developing and rinsing) is generally conducted at about 100° C. preferably for 30 to 90 seconds.

With respect to the organic film 4 formed on the resist film 2', it is preferable to select the material for forming the organic film 4 (e.g., an alkali-soluble resin), so as to dissolve and remove the organic film 4 in the alkali developing treatment in the step (4). Alternatively, the resist film 4 can be removed by a conventional method between the step (3) and the step (4).

In the aforementioned second embodiment, an organic film-forming composition containing the component (G) is used, and an organic film-forming composition containing an acid generator component (B) (thermal acid generator or photo acid generator) instead of the component (G) or together with the component (G) may be used. As the thermal acid generator and the photo-acid generator, any one or both of these may be used. Provided that, in the case where the photo-acid generator component is used as an component (B), the step (5) is conducted between the step (1) and the step (2). As a result, an acid is generated from the photo-acid generator component upon exposure in the step (2), and the acid is provided to the resist film 2' by the baking in the step (3).

In the method of forming a resist pattern according to the present invention, it is preferable that a resist composition is used, which contains a photo base generator component (C) as well as the component (A). When the resist composition further contains the component (C), the film retention properties at the exposed portions of resist film become excellent and the resolution of resist pattern to be formed become excellent.

The method of forming a resist pattern according to the present invention may be an embodiment other than the aforementioned first embodiment and second embodiment. For example, an embodiment containing applying an acidic active rinse to the resist film instead of applying the aforementioned organic film-forming composition can be mentioned. As the acidic active rinse, the aforementioned aqueous solution containing the component (G2) can be used.

In the method of forming a resist pattern according to the present invention, after forming a negative resist pattern in the manner as described above, etching of the substrate 1 may be conducted using the negative resist pattern as a mask. By conducting such etching to transfer the resist pattern to the substrate 1, a semiconductor device or the like can be produced.

The etching can be conducted by a conventional method. For example, when the substrate 1 has an organic film formed thereon, the etching of the organic film is preferably conducted by dry etching. Among dry etching, especially in terms of production efficiency, oxygen-plasma etching or etching using a $CF_4$ gas or a $CHF_3$ gas is preferable, and oxygen-plasma etching is particularly desirable.

Etching of the substrate is preferably performed using a halogen gas, more preferably using a fluorinated carbon-based gas, and most preferably using a $CF_4$ gas or a $CHF_3$ gas.
(Organic Film-Forming Composition)

In the method of forming a resist pattern according to the present invention, as described in the second embodiment, an organic film-forming composition containing an acid supply component (acidic compound component and acid generator component) can be used in order to supply acid to the resist film.

The organic film-forming composition may contain other components such as a resin and an organic solvent, in addition to an acid supply component.

As the acid supply component in the organic film-forming composition, the same as the component (Z) described above in relation to the resist composition can be mentioned.

As the acid supply component, one type may be used, or two or more types of compounds may be used in combination.

When the organic film-forming composition contains an acid supply component, a resin and an organic solvent, the amount of the acid supply component relative to 100 parts by weight of the resin is preferably 0.1 to 60 parts by weight. When the acid supply component is an acidic compound component, the amount of the acid supply component relative to 100 parts by weight of the resin is preferably 0.1 to 50 parts by weight, and 1 to 20 parts by weight is still more preferable. When the acid supply component is an acid generator component, the amount of the acid supply component relative to 100 parts by weight of the resin is preferably 1 to 60 parts by weight, and 1 to 50 parts by weight is still more preferable. When the amount of the acid supply component is at least as large as the lower limit of the above-mentioned range, a sufficient amount of acid is supplied to the resist film, the solubility of the resist film at unexposed portions in the developing solution is reliably increased, and resolution is further improved. On the other hand, when the amount of the acid supply component is no more than the upper limit of the above-mentioned range, the sensitivity becomes excellent. Further, when these components are dissolved in the organic solvent, a uniform solution can be obtained and the storage stability becomes satisfactory.

[Resin]

The resin is not particularly limited, and a conventional resin can be used.

It is preferable to use an alkali-soluble resin because in step (4), the formed organic film can be removed during the formation of a resist pattern by alkali developing.

As the alkali-soluble resin, any resin having an alkali-soluble group may be used, and examples thereof include conventional resins such as novolak resins, hydroxystyrene resins, acrylic resins and polycycloolefin resins.

Specific examples of the alkali-soluble group include a phenolic hydroxy group, a carboxy group, a fluorinated alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and a group containing any of these groups.

As an example of an alkali-soluble resin, a polymer (A") having a structural unit derived from a polycycloolefin (hereafter, this structural unit is referred to as "structural unit (a'1)") can be preferably used.

As the structural unit (a'1), structural units containing a base skeleton represented by general formula (a'1-0) shown below are preferred.

[Chemical Formula 97]

(a'1-0)

In the formula, a" represents 0 or 1.

In general formula (a'1-0), a" represents 0 or 1. In terms of industrial availability, a" is preferably 0.

In the present description, a "structural unit having a basic skeleton represented by general formula (a'1-0)" may be either a structural unit represented by general formula (a'1-0) per se (i.e., a structural unit derived from bicyclo[2.2.1]-2-heptene(norbornene) or a structural unit derived from tetracyclo[4.4.0.1$^{2,5}$.1$^{7,10}$]-3-dodecene), or a structural unit having a substituent on the ring skeleton. In other words, a "structural unit having a basic structure represented by general formula (a'1-0)" includes structural units in which part or all of the hydrogen atoms bonded to the carbon atoms that constitute the cyclic structure (namely, bicyclo[2.2.1]-2-heptane or tetracyclo[4.4.0.1$^{2,5}$.1$^{7,10}$]-3-dodecane) are substituted with an atom or a substituent other than a hydrogen atom.

As the structural unit (a'1), a structural unit represented by general formula (a'1-1) shown below can be exemplified.

[Chemical Formula 98]

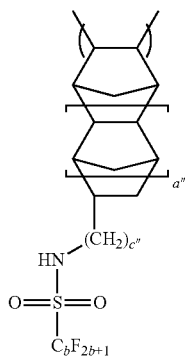

(a'1-1)

In the formula (a'1-1), each of a" is the same as defined above for a" in the formula (a'1-0).

c" represents an integer of 1 to 5, and is preferably an integer of 1 to 3, and most preferably an integer of 1.

b represents an integer of 1 to 5, and is preferably an integer of 1 to 3, and most preferably an integer of 1.

As the structural unit (a'1), one type of structural unit may be used alone, or two or more types of structural units may be used in combination.

The amount of the structural unit (a'1) within the polymer (A"), relative to the combined total of all the structural units that constitute the polymer (A"), is preferably within a range from 1 to 50 mol %, more preferably from 1 to 45 mol %, and still more preferably from 5 to 35 mol %. When the amount of the structural unit (a'1) is within the above-mentioned range, the predetermined alkali solubility can be easily obtained.

A monomer for deriving a structural unit (a'1) can be synthesized, for example, by a method disclosed in U.S. Pat. No. 6,420,503.

In addition, the polymer (A") may contain a structural unit derived from a polycycloolefin having a fluorinated alkyl group as a substituent (hereafter, referred to as "structural unit (a'2)"), in addition to the structural unit (a'1). Specifically, the polymer (A') may contain a structural unit represented by the general formula (a'2-1) shown below.

[Chemical Formula 99]

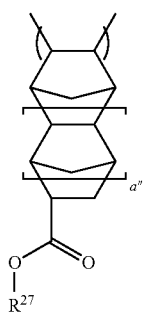

(a'2-1)

In the formula, $R^{27}$ represents a fluorinated alkyl group; and a" represents an integer of 0 or 1.

In general formula (a'2-1), a" represents 0 or 1. In terms of industrial availability, a" is preferably 0.

In the formula (a'2-1), $R^{27}$ represents a fluorinated alkyl group, and the fluorinated alkyl group is a group in which part or all of the hydrogen atoms of a linear, branched or cyclic alkyl group have been substituted with fluorine atoms.

The linear or branched alkyl group is preferably an alkyl group of 1 to 10 carbon atoms, more preferably an alkyl group of 1 to 8 carbon atoms, and still more preferably an alkyl group of 1 to 5 carbon atoms. Examples of alkyl groups include a methyl group, an ethyl group, a propyl group, an isopropyl group, an n-butyl group, an isobutyl group, a pentyl group, an isopentyl group and a neopentyl group. Among these, a propyl group is particularly desirable.

The cyclic alkyl group preferably has 4 to 12 carbon atoms, more preferably 4 to 10 carbon atoms, and most preferably 6 to 10 carbon atoms.

Among these, as the fluorinated alkyl group for $R^{27}$, a group in which one hydrogen atom within a linear or branched alkyl group has been substituted with a perfluoroalkyl group (a group in which an alkylene group has bonded to a perfluoroalkyl group) is preferably used, and —$(CH_2)_{f''}$—$CF_3$ and —$(CH_2)_{f''}$—$C_2F_5$[f"=1~3] are more preferable, and —$CH_2$—$CF_3$, —$CH_2$—$C_2F_5$ are particularly preferable.

As the fluorinated alkyl group, in particular, a fluorinated alkyl group having a fluorination ratio (the percentage of the number of fluorine atoms based on the total number of hydrogen atoms and fluorine atoms within the fluorinated alkyl group) of 30 to 90% is preferable, and a fluorinated alkyl group having a fluorination ratio of 50 to 80% is more preferable. When the fluorination ratio is at least 30%, the effect of improving the hydrophobicity of the surface of the organic film under the immersion exposure condition becomes excellent. In addition, when the fluorination ration is 90% or less, development properties are improved In the structural unit represented by the aforementioned formula (a'2-1), the ring structure constituting the main chain may have a substituent on the ring. Examples of the substituent include an alkyl group of 1 to 5 carbon atoms, a fluorine atom and a fluorinated alkyl group.

When the structural unit (a'2) is included in the polymer (A"), the amount of the structural unit (a'2) based on the combined total of all the structural units that constitute the polymer (A") is preferably within the range from 5 to 75 mol %, more preferably from 10 to 70 mol %, and still more preferably 15 to 60 mol %. When the amount of the structural unit (a'2) is within the above-mentioned range, the hydrophobicity of the surface of the organic film is enhanced, and the controllability of the dissolution rate in an alkali developing solution becomes excellent.

The monomer for deriving the structural unit represented by the formula (a'2-1) can be synthesized, for example, by a method disclosed in Japanese Unexamined Patent Application, First Publication No. 2000-235263, that is, "method of reacting a fluorinated alkyl ester of (meth)acrylic acid with cyclopentadiene or dicyclopentadiene by Diels-Alder reaction which is a conventional reaction".

As the polymer (A"), one type may be used alone, or two or more types may be used in combination.

In the present invention, as the polymer (A"), a polymeric compound that includes a combination of structural units such as that shown below is particularly desirable.

[Chemical Formula 100]

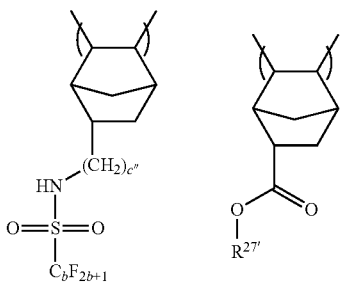

(A" 1-1)

In the formula, b and c" are the same as defined above; and $R^{27'}$ represents an fluorinated alkyl group of 1 to 5 carbon atoms.

c" is preferably an integer of 1 to 3, and most preferably 1.
b is preferably an integer of 1 to 3, and most preferably 1
$R^{27'}$ is preferably —$CH_2$—$CF_3$ or —$CH_2$—$C_2F_5$.

The weight average molecular weight (Mw) (the polystyrene equivalent value determined by gel permeation chromatography) of the polymer (A") is not particularly limited, but is preferably 1,000 to 50,000, more preferably 1,500 to 30,000, and most preferably 2,000 to 20,000. When the polymer (A") has a weight average molecular weight within the above-mentioned range, the polymer (A") exhibits a satisfactory solubility in an organic solvent when used as a resin component for forming an organic film. Further, the alkali development properties and the film formability becomes excellent.

Further, the dispersity (Mw/Mn) of the polymer (A") is not particularly limited, but is preferably 1.0 to 5.0, more preferably 1.0 to 3.0, and most preferably 1.0 to 2.5.

The polymer (A") can be obtained, for example, by a conventional radical polymerization or the like of the monomers corresponding with each of the structural units, using a radical polymerization initiator such as azobisisobutyronitrile (AIBN).

In addition, when the polymer (A") contains the cyclic-main chain structural unit, the polymer (A') can be synthesized, for example, by a method disclosed in Japanese Unexamined Patent Application, First Publication No. 2006-291177.

[Organic Solvent]

The organic solvent blended into the organic film-forming composition may be any organic solvent which can dissolve the respective components to give a uniform solution. For example, one or more kinds of any organic solvent can be appropriately selected from those which have been conventionally known as solvents for a chemically amplified resist. Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

Alternatively, as the organic solvent blended in the organic film-forming composition, an alcohol organic solvent, a fluorine organic solvent or an ether organic solvent having no hydroxyl group can be used. These organic solvents hardly dissolves the resist film which is formed using the aforementioned resist composition, and therefore is particularly used as an organic solvent for the organic film-forming composition.

The below-described organic solvents can be used individually, or at least two solvents may be mixed together. In terms of coatability and solubility of materials such as the resin component and the like, an alcohol organic solvent is preferable.

The term "alcohol organic solvent" refers to a compound in which at least one hydrogen atom within an aliphatic hydrocarbon has been substituted with a hydroxyl group, and is a liquid at normal temperature (room temperature) and normal pressure (atmospheric pressure). The structure of the main chain constituting the aforementioned aliphatic hydrocarbon may be a chain-like structure or a cyclic structure, or may include a cyclic structure within the chain-like structure, or may include an ether bond within the chain-like structure.

A "fluorine organic solvent" is a compound containing a fluorine atom and is in the form of a liquid at normal temperature (room temperature) and normal pressure (atmospheric pressure).

An "ether organic solvent having no hydroxyl group" refers to a compound that contains an ether bond (C—O—C) within the molecule but has no hydroxyl group, and is in the form of a liquid at normal temperature (room temperature) and normal pressure (atmospheric pressure). The ether organic solvent having no hydroxyl group is preferably a compound having neither a hydroxyl group nor a carbonyl group.

As the alcohol organic solvent, a monohydric alcohol, a dihydric alcohol or a dihydric alcohol derivative is preferable.

Although it depends on the number of carbon atoms, as the monohydric alcohol, a primary or secondary alcohol is preferable, and a primary monohydric alcohol is particularly desirable.

The term "monohydric alcohol" refers to a compound in which a hydrocarbon compound composed of only carbon and hydrogen has one hydrogen atom substituted with a hydroxy group, and does not include polyhydric alcohol derivatives having two or more hydroxy groups. The hydrocarbon compound may have a chain-like structure or a ring structure.

The term "dihydric alcohol" refers to a compound in which the aforementioned hydrocarbon compound has two hydrogen atoms substituted with hydroxy groups, and does not include polyhydric alcohol derivatives having three or more hydroxy groups.

Examples of the dihydric alcohol derivative include compounds in which a dihydric alcohol has one hydroxy group substituted with a substituent (e.g., alkoxy group, alkoxyalkyloxy group or the like).

The boiling point of the alcohol organic solvent is preferably 80 to 160° C., and more preferably 90 to 150° C. In terms of coatability, stability of the composition during storage and the heat temperature, the boiling point is most preferably 100 to 135° C.

Specific examples of the alcohol organic solvent having a chain-like structure include propylene glycol (PG), 1-butoxy-2-propanol (PG), n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy)ethanol, n-pentylalcohol, s-pentylalcohol, t-pentylalcohol, isopentylalcohol, isobutanol (also referred to as isobutylalcohol or 2-methyl-1-propanol), isopropylalcohol, 2-ethylbutanol, neopentylalcohol, n-butanol, s-butanol, t-butanol, 1-propanol, 2-methyl-1-butanol, 2-methyl-2-butanol and 4-methyl-2-pentanol.

Further, specific examples of those having a ring structure include cyclopentane methanol, 1-cyclopentylethanol, cyclohexanol, cyclohexane methanol (CM), cyclohexane ethanol, 1,2,3,6-tetrahydrobenzyl alcohol, exo-norborneol, 2-methylcyclohexanol, cycloheptanol, 3,5-dimethylcyclohexanol, and benzyl alcohol.

Among alcohol organic solvents, a monohydric alcohol or a dihydric alcohol derivative having a chain-like structure is preferable, 1-butoxy-2-propanol (BP), isobutanol (2-methyl-1-propanol), 4-methyl-2-pentanol or n-butanol is more preferable, and isobutanol (2-methyl-1-propanol) or 1-butoxy-2-propanol (BP) is particularly desirable.

As an example of a fluorine organic solvent, perfluoro-2-butyltetrahydrofuran can be given.

Preferable examples of the ether organic solvent having no hydroxyl group include compounds represented by general formula (s-1) shown below.

$$R^{40}\!-\!O\!-\!R^{41} \qquad (s\text{-}1)$$

(in the formula, each of $R^{40}$ and $R^{41}$ independently represents a monovalent hydrocarbon group, provided that $R^{40}$ and $R^{41}$ may be mutually bonded to form a ring; and —O— represents an ether bond.

In the aforementioned formula, as the hydrocarbon group for $R^{40}$ and $R^{41}$, for example, an alkyl group, an aryl group or the like can be mentioned, and an alkyl group is preferable. It is more preferable that both of $R^{40}$ and $R^{41}$ represent an alkyl group, and it is particularly desirable that $R^{40}$ and $R^{41}$ represent the same alkyl group.

The alkyl group for $R^{40}$ and $R^{41}$ is not particularly limited and includes, for example, a linear, branched or cyclic alkyl group having 1 to 20 carbon atoms. Part or all of the hydrogen atoms of the alkyl group may or may not be substituted with halogen atoms or the like.

The alkyl group preferably has 1 to 15 carbon atoms, and more preferably 1 to 10 carbon atoms, because the coatability onto the resist film becomes satisfactory. Specific examples include an ethyl group, a propyl group, an isopropyl group, an n-butyl group, an isobutyl group, an n-pentyl group, an isopentyl group, a cyclopentyl group and a hexyl group, and an n-butyl group and an isopentyl group are particularly desirable.

The halogen atom, with which hydrogen atoms of the alkyl group may be substituted, is preferably a fluorine atom.

The aryl group for $R^{40}$ and $R^{41}$ is not particularly limited. For example, an aryl group having 6 to 12 carbon atoms may be used in which part or all of the hydrogen atoms of the aryl group may or may not be substituted with alkyl groups, alkoxy groups, halogen atoms, or the like.

The aryl group is preferably an aryl group having 6 to 10 carbon atoms because it can be synthesized at a low cost. Specific examples thereof include a phenyl group, a benzyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and more preferably a methoxy group or an ethoxy group.

The halogen atom, with which hydrogen atoms of the aryl group may be substituted, is preferably a fluorine atom.

Alternatively, in the aforementioned formula, $R^{40}$ and $R^{41}$ may be mutually bonded to form a ring.

In this case, $R^{40}$ and $R^{41}$ each independently represents a linear or branched alkylene group (preferably an alkylene group of 1 to 10 carbon atoms) and $R^{40}$ and $R^{41}$ are bonded to form a ring. Further, a carbon atom of the alkylene group may be substituted with an oxygen atom.

Specific examples of such ether-based organic solvents include 1,8-cineole, tetrahydrofuran and dioxane.

The boiling point (at normal pressure) of the ether organic solvent having no hydroxyl group is preferably within a range from 30 to 300° C., more preferably from 100 to 200° C., and still more preferably from 140 to 180° C. When the boiling point of the ether organic solvent is at least as large as the lower limit of the above-mentioned temperature range, the organic solvent hardly evaporates during the spin coating process when applying a resist composition, thereby suppressing coating irregularities and improving the resulting coating properties. On the other hand, when the boiling point of the ether organic solvent is no more than the upper limit of the above-mentioned temperature range, the organic solvent is satisfactorily removed from the organic film by a bake treatment, thereby improving formability of the organic film. Further, when the boiling point of the ether organic solvent is within the above-mentioned temperature range, the stability of the composition upon storage are further improved. The above-mentioned temperature range for the boiling point of the ether organic solvent is also preferable from the viewpoints of the heating temperature.

Specific examples of the ether organic solvent having no hydroxyl group include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethylbenzyl ether (boiling point: 189° C.), diphenyl ether (boiling point: 259° C.), dibenzyl ether (boiling point: 297° C.), phenetole (boiling point: 170° C.), butylphenyl ether, tetrahydrofuran (boiling point: 66° C.), ethylpropyl ether (boiling point: 63° C.), diisopropyl ether (boiling point: 69° C.), dihexyl ether (boiling point: 226° C.), and dipropyl ether (boiling point: 91° C.).

In the present invention, the ether organic solvent having no hydroxyl group is preferably a cyclic or chain-like, ether-based organic solvent, and it is particularly desirable that the ether organic solvent having no hydroxyl group be at least one member selected from the group consisting of 1,8-cineole, dibutyl ether and diisopentyl ether.

The amount of the organic solvent blended in the organic film-forming composition is not particularly limited, and is appropriately adjusted to a concentration which enables coating of a coating solution to a resist film. For example, in the case where the organic film-forming composition containing an acid or acid generator component, a resin and an organic solvent is used, the amount of the organic solvent is preferably an amount sufficient to adjust the concentration of resin within the range from 0.2 to 10% by weight, and more preferably an amount sufficient to adjust the concentration of resin within the range from 1 to 5% by weight.

To the organic film-forming composition, if desired, surfactants, sensitizers, crosslinking agents, antihalation agents, stabilizers preservatives, coloring agents, plasticizers, antifoaming agents and the like can be appropriately added.

As the surfactants, nonionic surfactants, anionic surfactants, cationic surfactants, amphoteric surfactants, silicone surfactants, polyalkylene oxide-based surfactants, fluorinated surfactant and the like can be mentioned In the case where surfactants is used, the amount thereof is preferably within a range from 0.01 to 0.5 parts by weight, and more preferably within a range from 0.02 to 0.1 parts by weight, relative to 100 parts by weight of the resin.

According to the method of forming a resist pattern of the present invention, by use of the developing process combined with an alkali developing solution and a chemically amplified resist composition which had been used as a positive resist composition, a negative resist pattern having high resolution and excellent shape can be formed.

In addition, according to the method of forming a resist pattern of the present invention, the resolution of the resist pattern (such as an isolated trench pattern, an extremely small, dense contact hole pattern, or the like), in which a region where the optical strength becomes weak is likely to be generated in the film thickness direction, becomes excellent.

Further, by the method of forming a resist pattern according to the present invention, it is possible to enhance packing densities of the resist pattern, and to form a contact hole pattern having an excellent shape in which the individual holes are adjacent each other, for example, a contact hole pattern having a distance between holes within 30 to 50 nm.

In addition, the method of forming a resist pattern of the present invention can be conducted using a conventional exposure apparatus and a conventional equipment.

Moreover, by using a double exposure method in the method of forming a resist pattern according to the present invention, the number of steps can be reduced as compared to a double patterning in which each of a lithography step and a patterning step are performed at least twice.

EXAMPLES

As follows is a description of examples of the present invention, although the scope of the present invention is by no way limited by these examples.

In the following examples, a compound represented by a chemical formula (1) is designated as "compound (1)", and the same applies for compounds represented by other chemical formulas.

In the NMR analysis, the internal standard for $^1$H-NMR and $^{13}$C-NMR was tetramethylsilane.

Production of Resist Composition (1)

Examples 1 to 6, Comparative Examples 1 and 2

The components shown in Table 1 were mixed together and dissolved to obtain resist compositions.

TABLE 1

| Resist composition | Component (A) | Component (A') | Component (C) | Component (Z) | Component (D) | Component (F) | Component (S) |
|---|---|---|---|---|---|---|---|
| Comparative Example 1 | — | (A')-1 [100] | (C)-1 [20.0] | (G)-1 [4.0] | — | (F)-1 [3.0] | (S)-1 [3700] |
| Comparative Example 2 | — | (A')-2 [100] | (C)-1 [10.0] | (G)-2 [10.0] | (D)-1 [5.0] | (F)-1 [3.0] | (S)-1 [3700] |
| Example 1 | (A)-1 [100] | — | — | (G)-2 [10.0] | (D)-1 [5.0] | (F)-1 [3.0] | (S)-1 [3700] |
| Example 2 | (A)-1 [30] | (A')-2 [70] | — | (G)-2 [10.0] | (D)-1 [5.0] | (F)-1 [3.0] | (S)-1 [3700] |
| Example 3 | (A)-1 [30] | (A')-3 [70] | — | (G)-2 [10.0] | (D)-1 [5.0] | (F)-1 [3.0] | (S)-1 [3700] |
| Example 4 | (A)-1 [30] | (A')-4 [70] | — | (G)-2 [10.0] | (D)-1 [5.0] | (F)-1 [3.0] | (S)-1 [3700] |
| Example 5 | (A)-1 [30] | (A')-5 [70] | — | (G)-2 [10.0] | (D)-1 [5.0] | (F)-1 [3.0] | (S)-1 [3700] |
| Example 6 | (A)-1 [30] | (A')-6 [70] | — | (G)-2 [10.0] | (D)-1 [5.0] | (F)-1 [3.0] | (S)-1 [3700] |

In Table 1, the values in brackets [ ] indicate the amount (in terms of parts by weight) of the component added, and the reference characters indicate the following. In the chemical formula shown below, the subscript numerals shown on the bottom right of the parentheses ( ) indicate the percentage (molar ratio) of the respective structural units.

(A)-1: a copolymer represented by chemical formula (A)-1 shown below (A')-1: a copolymer represented by chemical formula (A')-1 shown below (A')-2: a copolymer represented by chemical formula (A')-2 shown below (A')-3: a copolymer represented by chemical formula (A')-3 shown below (A')-4: a copolymer represented by chemical formula (A')-4 shown below (A')-5: a copolymer represented by chemical formula (A')-5 shown below (A')-6: a copolymer represented by chemical formula (A')-6 shown below Further, with respect to the obtained copolymers, the compositional ratio (the molar ratio of the respective structural units indicated in the structural formula shown below) as determined by carbon 13 nuclear magnetic resonance spectroscopy (600 MHz, $^{13}$C-NMR), and the weight average molecular weight (Mw) and the molecular weight distribution (Mw/Mn) determined by the polystyrene equivalent value as measured by GPC are shown in Table 2.

[Chemical Formula 101]

(A)-1

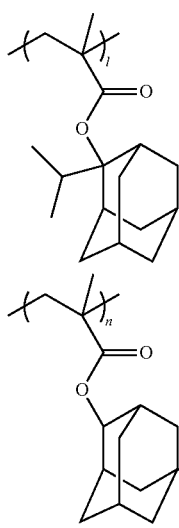
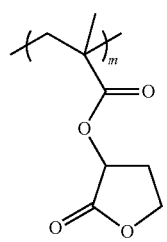
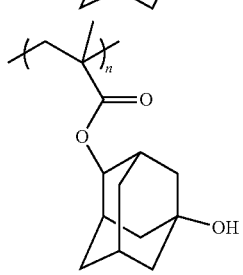

[Chemical Formula 102]

(A')-1

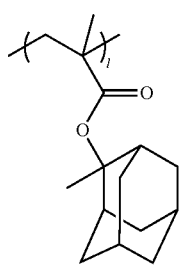
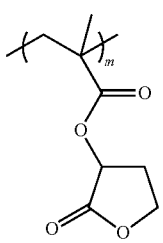
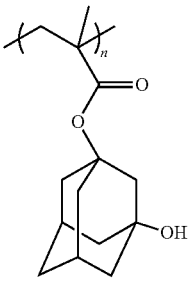

(A')-4

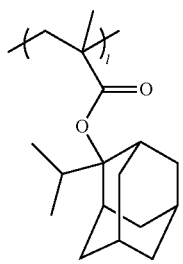
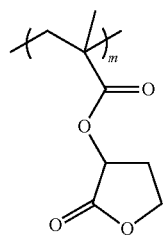

(A')-2

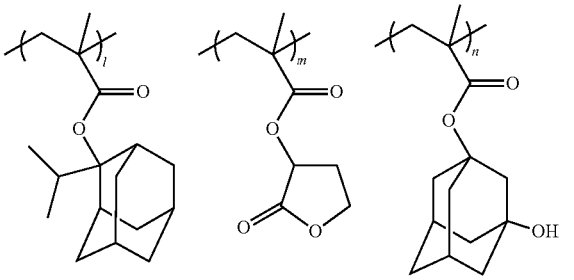

(A')-5

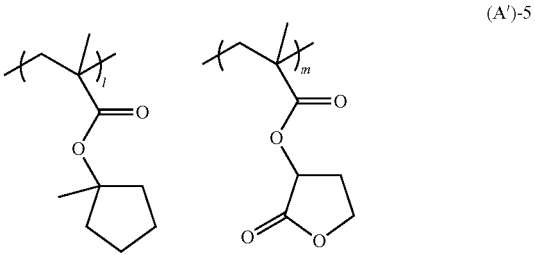

(A')-3

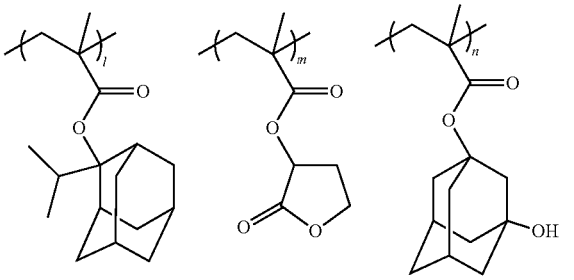

(A')-6

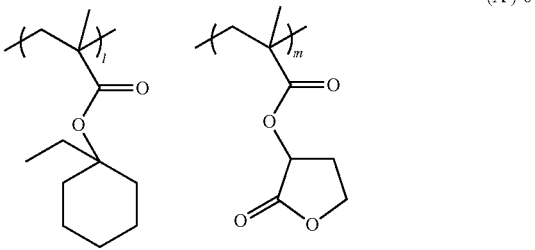

TABLE 2

| Copolymer | Compositional ratio (molar ratio) | Mw | Mw/Mn |
|---|---|---|---|
| (A)-1 | l/m/n/o = 33.7/28.9/17.8/19.6 | 7400 | 1.78 |
| (A')-1 | l/m/n = 35.1/46.3/18.6 | 6800 | 1.51 |
| (A')-2 | l/m/n = 42.0/38.2/19.8 | 8000 | 1.76 |
| (A')-3 | l/m/n = 40.3/48.6/11.1 | 7200 | 1.89 |
| (A')-4 | l/m = 49.7/50.3 | 7000 | 1.74 |
| (A')-5 | l/m = 48.2/51.8 | 7100 | 1.58 |
| (A')-6 | l/m = 48.6/51.4 | 7100 | 1.55 |

(C)-1: a compound represented by chemical formula (C)-1 shown below (G)-1: a compound represented by chemical formula (G)-1 shown below (G)-2: a compound represented by chemical formula (G)-2 shown below (D)-1: heptafluorobutylamine ($CF_3CF_2CF_2CH_2NH_2$, boiling point=69° C., pKa=5.6)

(F)-1: a polymer represented by chemical formula (F)-1 shown below (homopolymer) Mw: 24,000, Mw/Mn: 1.38. In the chemical formula, the subscript numerals shown on the bottom right of the parentheses ( ) indicate the percentage (mol %) of the respective structural units.

(S)-1: a mixed solvent of propylene glycol monomethyl ether acetate/propylene glycol monomethyl ether=6/4 (weight ratio)

[Chemical Formula 103]

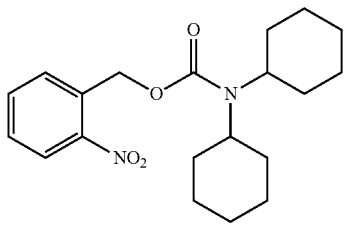
(C)-1

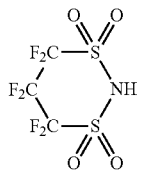
(G)-1

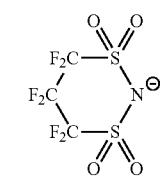
(G)-2

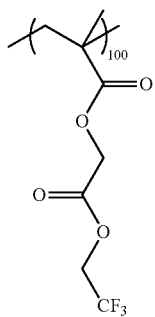
(F)-1

Formation of Resist Pattern (1)

—Step (1)

An organic antireflection film composition (product name: ARC95, manufactured by Brewer Science Ltd.) was applied to a 12-inch silicon wafer using a spinner, and the composition was then baked and dried on a hotplate at 205° C. for 60 seconds, thereby forming an organic antireflection film having a thickness of 90 nm.

Next, each of the resist compositions obtained in Examples 1 to 6 and Comparative Example 2 was applied to the organic antireflection film by spin-coating, and resist films having a film thickness of 100 nm were formed, respectively. The resist films were not subjected to prebake (PEB). Then, the resist films left to settle at 23° C. for 60 seconds on a cooling plate.

With respect to the resist composition obtained in Comparative Example 1, the resist composition was applied to the organic antireflection film using a spinner, and was then pre-baked (PAB) on a hotplate at 80° C. for 60 seconds and dried, thereby forming a resist film having a film thickness of 100 nm.

—Step (2)

Subsequently, the resist film was selectively irradiated with an ArF excimer laser (193 nm) through a mask pattern (6% halftone) targeting a contact hole pattern (CH pattern) with a hole diameter of 50 nm and a pitch of 100 nm, using an ArF exposure apparatus NSR-5609B (manufactured by Nikon Corporation; NA (numerical aperture)=1.07; Crosspole (0.78/0.97) w/POLANO).

—Step (3)

Further, a post exposure bake (PEB) was conducted for 60 seconds at a temperature indicated in Table 3.

—Step (4)

Next, alkali development for 20 seconds at 23° C. in a 2.38% by weight aqueous solution of tetramethylammonium hydroxide (TMAH) (trade name: NMD-3; manufactured by Tokyo Ohka Kogyo Co., Ltd.) was conducted.

[Evaluation of Resolution]

A resist pattern was formed in the same manner as in <Formation of resist pattern (1)>, and the resolution of the CH pattern having a hole diameter of 50 nm and a pitch of 100 nm was evaluated.

Example in which a CH pattern was resolved is indicated as "A", and Example in which a CH pattern was not resolved is indicated as "B". The results are indicated under "resolution" in Table 3.

[Evaluation of Sensitivity]

The optimum exposure dose Eop (mJ/cm$^2$) with which a CH pattern having a hole diameter of 50 nm and a pitch of 100 nm was formed was determined. The results are shown in Table 3.

[Evaluation of Exposure Latitude (EL Margin)]

With respect to the above optimum exposure dose Eop, the exposure dose with which a CH pattern having a dimension of the target dimension (hole diameter: 50 nm)±5% (i.e., 47.5 nm to 52.5 nm) was determined, and the EL margin (unit: %) was determined by the following formula. The results are shown in Table 3.

$$EL\ margin(\%)=(|E1-E2|/Eop)\times 100$$

E1: Exposure dose (mJ/cm$^2$) with which an CH pattern having a hole diameter of 47.5 nm was formed E2: Exposure dose (mJ/cm$^2$) with which a CH pattern having a hole diameter of 52.5 nm was formed The larger the value of the "EL margin", the smaller the change in the pattern size by the variation of the exposure dose.

[Evaluation of Resist Pattern Shape]

The cross-sectional shape of the CH pattern having a hole diameter of 50 nm and a pitch of 100 nm which had been formed in the above <Formation of resist pattern (1)> was observed using a scanning electron microscope (product name: SU-8000, manufactured by Hitachi High-Technologies Corporation), and the cross-sectional shape was evaluated according to the evaluation criteria described below. The results are shown in Table 3.

(Evaluation Criteria)

A: high perpendicularity, high circularity and excellent shape

B: slightly inferior to A in perpendicularity and circularity

TABLE 3

|  | PAB (° C.) | PEB (° C.) | Resolution | Eop (mJ/cm$^2$) | EL margin (%) | Resist pattern shape |
|---|---|---|---|---|---|---|
| Comparative Example 1 | 80 | 110 | B | — | — | — |
| Comparative Example 2 | — | 90 | B | — | — | — |
| Example 1 | — | 90 | A | 15.1 | 2.44 | A |
| Example 2 | — | 90 | A | 14.2 | 3.73 | B |
| Example 3 | — | 90 | A | 17.1 | 3.59 | B |
| Example 4 | — | 90 | A | 19.3 | 3.50 | A |
| Example 5 | — | 90 | A | 18.3 | 2.75 | A |
| Example 6 | — | 90 | A | 17.2 | 3.33 | A |

In Table 3, the reference character "-" indicates that the evaluations of sensitivity (Eop), EL margin and resist pattern shape could not be conducted, since a hole could not be resolved.

From the results shown in Table 3, it was confirmed that the resist compositions of Examples 1 to 6 were superior to the resist compositions of Comparative Examples 1 and 2 in that they exhibited excellent resolution.

As a result, it was confirmed that the resist compositions of Examples 1 to 6 exhibited excellent the lithography properties and excellent shape of a resist pattern.

Formation of Resist Pattern (2)

—Step (1)

An organic antireflection film composition (product name: ARC95, manufactured by Brewer Science Ltd.) was applied to a 12-inch silicon wafer using a spinner, and the composition was then baked and dried on a hotplate at 205° C. for 60 seconds, thereby forming an organic antireflection film having a thickness of 98 nm.

Next, each of the resist compositions obtained in Examples 1 and Comparative Example 2 was applied to the organic antireflection film by spin-coating, and resist films having a film thickness of 100 nm were formed, respectively. The resist films were not subjected to prebake (PEB). Then, the resist films left to settle at 23° C. for 60 seconds on a cooling plate.

With respect to the resist composition obtained in Comparative Example 1, the resist composition was applied to the organic antireflection film using a spinner, and was then prebaked (PAB) on a hotplate at 80° C. for 60 seconds and dried, thereby forming a resist film having a film thickness of 100 nm.

—Step (2)

Subsequently, the resist films were selectively irradiated with an ArF excimer laser (193 nm) through a photomask (6% halftone) targeting a contact hole pattern (CH pattern) with a hole diameter of 42 nm and a pitch of 84 nm, using an ArF exposure apparatus NSR-S610C (manufactured by Nikon Corporation; NA (numerical aperture)=1.30; Crosspole (0.78/0.97) w/POLANO).

—Step (3)

Further, a post exposure bake (PEB) was conducted for 60 seconds at a temperature indicated in Table 4.

—Step (4)

Next, alkali development for 20 seconds at 23° C. in a 2.38% by weight aqueous solution of tetramethylammonium hydroxide (TMAH) (trade name: NMD-3; manufactured by Tokyo Ohka Kogyo Co., Ltd.) was conducted.

[Evaluation of Resolution]

A resist pattern was formed in the same manner as in <Formation of resist pattern (2)>, and the resolution of the CH pattern having a hole diameter of 42 nm and a pitch of 84 nm was evaluated.

Example in which a CH pattern was resolved is indicated as "A", and Example in which a CH pattern was not resolved is indicated as "B". The results are indicated under "resolution" in Table 4.

[Evaluation of Sensitivity]

The optimum exposure dose Eop (mJ/cm$^2$) with which an CH pattern having a hole diameter of 42 nm and a pitch of 84 nm was formed, was determined. The results are shown in Table 4.

TABLE 4

|  | PAB (° C.) | PEB (° C.) | Resolution | Eop (mJ/cm$^2$) |
|---|---|---|---|---|
| Comparative Example 1 | 80 | 110 | B | — |
| Comparative Example 2 | — | 90 | B | 19.5 |
| Example 1 | — | 90 | A | 30.0 |

In Table 4, the reference character "-" indicates that the evaluation of sensitivity (Eop) could not be conducted, since a hole could not be resolved.

From the results shown in Table 4, it was confirmed that the resist compositions of Example 1 was superior to the resist compositions of Comparative Examples 1 and 2 in that they exhibited excellent resolution.

Production of Resist Composition (2)

Examples 7 and 8

The components shown in Table 5 were mixed together and dissolved to obtain resist compositions.

TABLE 5

| Resist composition | Component (A) | Component (A') | Component (Z) | Component (D) | Component (F) | Component (S) |
|---|---|---|---|---|---|---|
| Example 7 | (A)-2 [50] | (A')-4 [50] | (G)-3 [10.0] | (D)-1 [4.0] | (F)-2 [2.0] | (S)-2 [3700] |
| Example 8 | (A)-3 [50] | (A')-4 [50] | (G)-3 [10.0] | (D)-1 [4.0] | (F)-2 [2.0] | (S)-2 [3700] |

In Table 5, the values in brackets [ ] indicate the amount (in terms of parts by weight) of the component added, and the reference characters indicate the following. In the chemical formula shown below, the subscript numerals shown on the bottom right of the parentheses ( ) indicate the percentage (molar ratio) of the respective structural units. Further, with respect to the obtained copolymers, the compositional ratio (the molar ratio of the respective structural units indicated in the structural formula shown below) as determined by carbon 13 nuclear magnetic resonance spectroscopy (600 MHz, $^{13}$C-NMR), and the weight average molecular weight (Mw) and the molecular weight distribution (Mw/Mn) determined by the polystyrene equivalent value as measured by GPC are shown below.

(A)-2: a copolymer represented by chemical formula (A)-2 shown below; Weight average molecular weight (Mw): 7,000, dispersity (Mw/Mn): 1.73, compositional ratio (molar ratio) l/m/n=45/45/10

(A)-3: a copolymer represented by chemical formula (A)-3 shown below; Weight average molecular weight (Mw): 7,600, dispersity (Mw/Mn): 1.72, compositional ratio (molar ratio) l/m/n=45/45/10

(A')-4: a copolymer represented by the chemical formula (A')-4

[Chemical Formula 104]

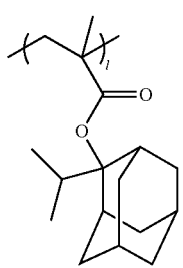
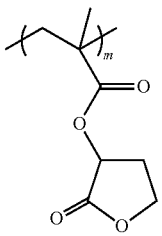
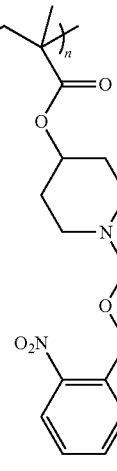

(A)-2

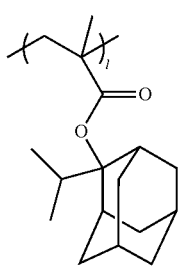
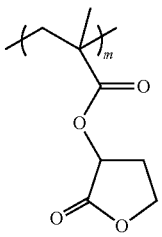
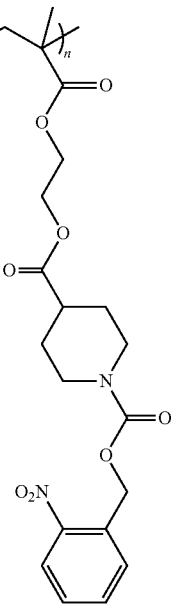

(A)-3

(G)-3: a compound represented by chemical formula (G)-3 shown below (D)-1: heptafluorobutylamine ($CF_3CF_2CF_2CH_2NH_2$, boiling point=69° C., pKa=5.6)

(F)-2: a polymer represented by chemical formula (F)-2 shown below; Mw: 24,000, Mw/Mn: 1.38; In the chemical formula, the subscript numerals shown on the bottom right of the parentheses ( ) indicate the percentage (molar ratio) of the respective structural units.

(S)-2: a mixed solvent of propylene glycol monomethyl ether acetate/propylene glycol monomethyl ether=8/2 (weight ratio)

[Chemical Formula 105]

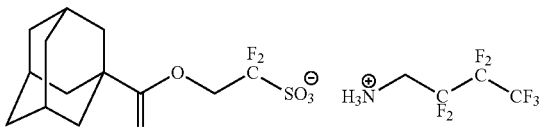

(G)-3

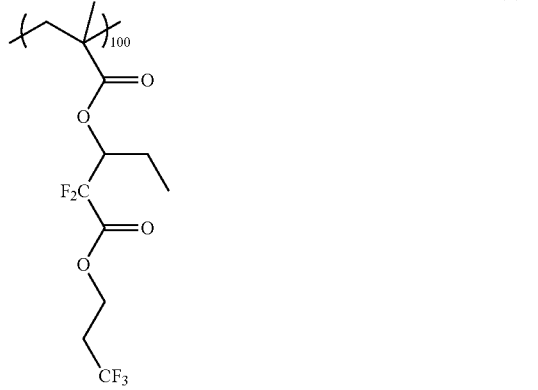

(F)-2

Formation of Resist Pattern (3)

—Step (1)

An organic anti-reflection film composition (product name: ARC95, manufactured by Brewer Science Ltd.) was applied to an 12-inch silicon wafer using a spinner, and the composition was then baked at 205° C. for 60 seconds, thereby forming an organic anti-reflection film having a film thickness of 90 nm.

The aforementioned resist composition was then applied to the organic anti-reflection film using a spinner and left to settle at 23° C. for 60 seconds on a cooling plate, thereby forming a resist film having a film thickness of 100 nm.

—Step (2)

Subsequently, the resist film was selectively irradiated with an ArF excimer laser (193 nm) through a photomask (6% halftone), using an ArF exposure apparatus for immersion lithography (product name: NSR-5609B, manufactured by Nikon Corporation; NA (numerical aperture)=1.07, Crosspole (in/out=0.78/0.97), immersion medium: water).

—Step (3)

Further, PEB was conducted at 90° C. for 60 seconds.

—Step (4)

Thereafter, an alkali development was conducted for 20 seconds at 23° C. in a 2.38% by weight aqueous solution of tetramethylammonium hydroxide (TMAH) (product name:

NMD-3; manufactured by Tokyo Ohka Kogyo Co., Ltd.). Then, the resist was rinsed for 30 seconds with pure water, followed by drying by shaking.

As a result, in each of the examples, a contact hole pattern in which holes having a hole diameter of 60 nm and a pitch of 120 nm were equally spaced was formed (hereafter, this contact hole pattern is referred to as "CH pattern").

[Evaluation of in-Plane Uniformity (CDU) of Pattern Size]

With respect to each of the contact hole patterns having the aforementioned target sizes, the hole diameter (nm) of 100 holes within the CH pattern were measured by observing from above of the pattern using a measuring scanning electron microscope (SEM) (product name: S-9380, manufactured by Hitachi High-Technologies Corporation, accelerating voltage: 500V). From the results, the value of 3 times the standard deviation σ (i.e., 3σ was calculated. The results are indicated under "CDU" in Table 6.

The smaller this 3σ value, the higher the level of the uniformity (CD uniformity) of size of the plurality of holes formed in the resist film.

TABLE 6

| | CDU (nm) |
|---|---|
| Example 7 | 12.7 |
| Example 8 | 9.82 |

From the results shown in Table 6, it was confirmed that the resist composition of Examples 7 of 8 according to the present invention had high CD uniformity and excellent lithography properties.

In particular, it was confirmed that the resist composition of Example 8 in which a copolymer having long distance from the polymerable group to the amine part was used, had high CD uniformity.

From the results, the following can be presumed. In Example 8 according to the present invention, the diffusion length of base generated at exposed portions of the resist film can be shortened. On the other hand, due to a long distance from the polymerizable group to the amine part in the copolymer, the glass transition temperature of the copolymer could be reduced, and as a result, base could be satisfactory diffused at exposure portions, as compared to Example 7. Therefore, in Example 8, base reacted with acid reliably at exposed portions of the resist film, as compared to Example 7, and hence, the film retention properties at exposed portions of the resist film against an alkali developing solution are enhanced, thereby improving the level of the uniformity (CD uniformity) of size of the holes.

Synthesis Example of Compound (Monomer)

25.6 of the compound (51-0) and 250 g of dichloromethane were added to a three-necked flask, cooled to 10° C. or lower. Then 2.0 g of 4-dimethylaminopyridine was added thereto, followed by stirring. Next, 11.9 g of hydroxyethyl methacrylate was dissolved in 105 g of dichloromethane to obtain a mixture solution, and the obtained mixture solution was added to the aforementioned three-necked flask in a dropwise manner while maintaining at 10° C. or lower. 18.6 g of 1-(3-dimethylaminopropyl)-3-ethylcarbodiimide hydrochloride was added thereto, stirred for 10 minutes, then stirred for 30 hours at 23° C. After the reaction was completed, the organic phase of the reaction mixture was washed with 350 g of pure water three times, and subjected to distillation under reduced pressure to remove the solvent, thereby obtaining 27 g of the compound (51) as a viscosity liquid.

The obtained compound (51) was analyzed by NMR, and the structure thereof was identified by the following results.

$^1$H-NMR (400 MHz, dmso-d6): δ(ppm)=8.08 (d, 1H, ArH), 7.79 (m, 1H, ArH), 7.64 (m, 2H, ArH), 6.03 (s, 1H, HC=C), 5.69 (s, 1H, HC=C), 5.37 (s, 2H, OCOCH$_2$Ar), 4.32 (m, 4H, COOCH$_2$CH$_2$OCO), 3.90 (m, 2H, piperidine), 2.85-3.10 (m, 2H, piperidine), 2.58-2.64 (m, 1H, piperidine), 1.82-1.94 (m, 5H, piperidine+C=CCH$_3$), 1.47-1.49 (m, 2H, piperidine)

[Chemical Formula 106]

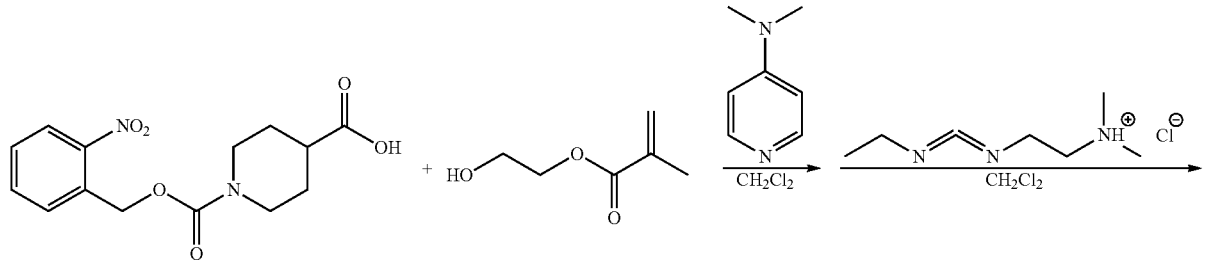

(51-0)

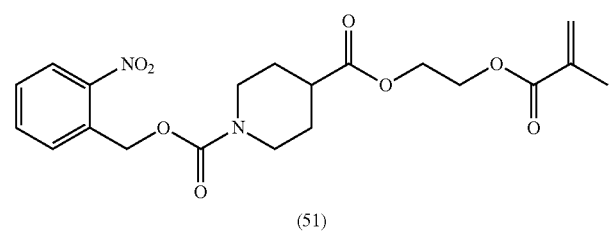

(51)

Synthesis Example of Copolymer

In a separable flask equipped with a thermometer, a reflux tube and a nitrogen feeding pipe, 21.43 g (81.66 mmol) of the compound (11) was dissolved in 29.03 g of propylene glycol monomethyl ether acetate, and heated to 80° C. Then 13.00 g (76.40 mmol) of the compound (21), 7.22 g (17.17 mmol) of the compound (51) and 26.28 mmol of dimethyl 2,2'-azobis (isobutyrate) (V-601) as a polymerization initiator were dissolved in 53.51 g of propylene glycol monomethyl ether acetate to obtain a mixed solution, and the obtained mixed solution was added to the aforementioned separable flask in a dropwise manner over 4 hours under a nitrogen atmosphere.

After the dropwise was completed, the resulting reaction solution was heated while stirring for 1 hour, and then cooled to room temperature. The obtained reaction polymer solution was dropwise added to an excess amount of n-heptane to deposit a polymer. Thereafter, the precipitated white powder was separated by filtration, followed by washing with methanol, and then drying, thereby obtaining 27.3 g of the copolymer (A)-3 as an objective compound.

With respect to the copolymer (A)-3, the weight average molecular weight and the dispersity were determined by the polystyrene equivalent value as measured by gel permeation chromatography (GPC). As a result, it was found that the weight average molecular weight was 7,600, and the dispersity was 1.72. Further, as a result of an analysis by $^{13}$C-NMR, it was found that the composition of the copolymer (ratio (molar ratio) of the respective structural units within the structural formula) was l/m/n=45/45/10.

[Chemical Formula 107]

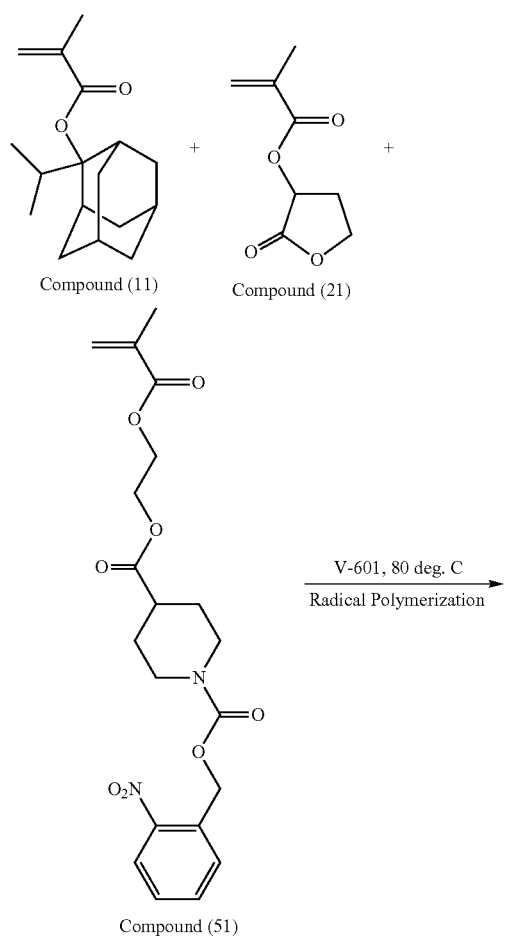

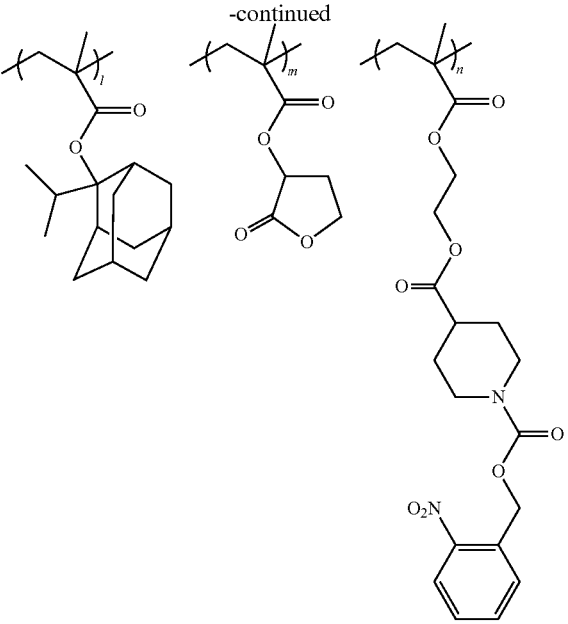

Copolymer (A)-3

DESCRIPTION OF REFERENCE NUMERALS AND CHARACTER

1: substrate, 2: resist film, 2a: exposed portion, 2b: unexposed portion, 3: photomask, 4: organic film While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern comprising:
a step (1) in which a resist composition comprising a base component (A) that generates base upon exposure and exhibits increased solubility in an alkali developing solution by the action of acid and at least one component selected from the group consisting of a component (G1) which includes an ionic compound consisting of a nitrogen-containing cation moiety and a counter anion and a component (G2) which does not fall under the definition of the component (G1), exhibits acidity by itself, acts as a proton donor and comprises at least one compound selected from the group consisting of sulfonylimide, bis(alkylsulfonyl)imide, tris(alkylsulfonyl)methide and compounds having a fluorine atom within these compounds is applied to a substrate to form a resist film;
a step (2) in which the resist film is subjected to exposure;
a step (3) in which baking is conducted after the step (2), such that, at an exposed portion of the resist film, the base generated from the base component (A) upon the exposure and an acid provided to the resist film in advance are neutralized, and at an unexposed portion of the resist film, the solubility of the base component (A) in an alkali developing solution is increased by the action of acid provided to the resist film in advance; and a step (4) in which the resist film is subjected to an alkali development, thereby forming a negative-tone resist pattern in which the unexposed portion of the resist film has been dissolved and removed, wherein the base component (A) comprises a polymeric compound containing structural unit (a51) represented by general formula (a5-1) shown below:

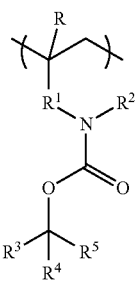

(a5-1)

wherein R represents a hydrogen atom, an alkyl group of 1 to 5 carbon atoms or a halogenated alkyl group of 1 to 5 carbon atoms; $R^1$ represents a single bond or a divalent linking group; $R^2$ represents a hydrogen atom, a linear, branched or cyclic alkyl group of 1 to 10 carbon atoms or an aryl group of 6 to 10 carbon atoms, $R^1$ and $R^2$ may be bonded to form a ring with the nitrogen atom having $R^1$ and $R^2$ bonded thereto, and an alkyl group or an aryl group for $R^2$ may have a substituent; $R^3$, $R^4$ and $R^5$ each independently represents a hydrogen atom, a linear, branched or cyclic alkyl group of 1 to 10 carbon atoms or an aryl group of 6 to 14 carbon atoms, $R^3$ and $R^4$, $R^4$ and $R^5$ or $R^3$ and $R^5$ may be bonded to form a ring with the carbon atom having these groups bonded thereto, and an alkyl group or an aryl group for $R^3$, $R^4$ and $R^5$ may have a substituent, provided that $R^3$, $R^4$ and $R^5$ do not all represent a hydrogen atom or an alkyl group at the same time.

2. The method of forming a resist pattern according to claim 1, wherein the polymeric compound comprises a structural unit (a1) having an acid decomposable group that exhibits increased polarity by the action of acid.

3. The method of forming a resist pattern according to claim 1, wherein the resist composition further comprises an acid generator component.

4. The method of forming a resist pattern according to claim 1, wherein the component (G1) is an ionic compound consisting of a cation moiety represented by any one of general formulas (G1c-11) to (G1c-13) shown below and a counter anion:

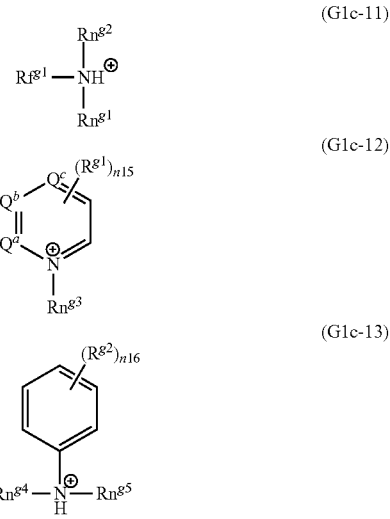

wherein $Rf^{g1}$ represents a fluorinated alkyl group of 1 to 12 carbon atoms; each of $Rn^{g1}$ and $R^{g2}$ independently represents a hydrogen atom or an alkyl group of 1 to 5 carbon atoms, and $Rn^{g1}$ and $R^{g2}$ may be mutually bonded to form a ring; each of $Q^a$ to $Q^c$ independently represents a carbon atom or a nitrogen atom; $Rn^{g3}$ represents a hydrogen atom or a methyl group; $Rn^{g4}$ and $Rn^{g5}$ each independently represents an alkyl group of 1 to 5 carbon atoms or an aromatic hydrocarbon group; each of $R^{g1}$ and $R^{g2}$ independently represents a hydrocarbon group; each of n15 and n16 represents an integer of 0 to 4; n15 and n16 are an integer of 2 or more, a plurality of $R^{g1}$ and $R^{g2}$ with which the hydrogen atoms on the adjacent carbon atom have been substituted may be mutually bonded to form a ring.

* * * * *